(12) United States Patent
Zimmermann et al.

(10) Patent No.: US 9,865,755 B2
(45) Date of Patent: Jan. 9, 2018

(54) METHOD FOR PRODUCING A THIN FILM CELL ARRANGEMENT

(71) Applicant: FRAUNHOFER-GESELLSCHAFT ZUR FODERUNG DER ANGEWANDTEN FORSCHUNG E.V., Munich (DE)

(72) Inventors: Birger Zimmermann, Freiburg (DE); Hans-Frieder Schleiermacher, Freiburg (DE); Sebastian Schiefer, Freiburg (DE)

(73) Assignee: FRAUNHOFER-GESELLSCHAFT ZUR FODERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 14/742,168

(22) Filed: Jun. 17, 2015

(65) Prior Publication Data
US 2016/0005898 A1 Jan. 7, 2016

Related U.S. Application Data

(63) Continuation of application No. PCT/EP2013/077228, filed on Dec. 18, 2013.

(30) Foreign Application Priority Data

Dec. 18, 2012 (DE) ........................ 10 2012 024 754

(51) Int. Cl.
*H01L 21/00* (2006.01)
*H01L 31/0465* (2014.01)
(Continued)

(52) U.S. Cl.
CPC ........ *H01L 31/0465* (2014.12); *H01L 31/028* (2013.01); *H01L 31/0296* (2013.01);
(Continued)

(58) Field of Classification Search
CPC ............. H01L 31/0465; H01L 31/0304; H01L 51/4253; H01L 31/1884; H01L 31/032;
(Continued)

(56) References Cited

U.S. PATENT DOCUMENTS 4,617,421 A * 10/1986 Nath ................. H01L 31/03921
136/244
4,877,460 A * 10/1989 Flodl ................... H01L 31/0504
136/244
(Continued)

FOREIGN PATENT DOCUMENTS

DE         10020784 A1   11/2001
DE    102007060108 A1    6/2009
(Continued)

OTHER PUBLICATIONS

Lungenschmied, Christoph. "Flexible, long-lived, large-area, organic solar cells", Solar Energy Materials and Solar Cells, vol. 91, Nov. 22, 2006, pp. 379-384.
(Continued)

*Primary Examiner* — Vu A Vu
(74) *Attorney, Agent, or Firm* — Gesmer Updegrove, LLP

(57) ABSTRACT

The present invention relates to a method for the production of a thin-film solar cell array in which a plurality of individual thin-film solar cells are applied on a substrate. The individual thin-film solar cells are thereby deposited one above the other in regions so that an overlapping region is produced from respectively one pair of two individual thin-film solar cells; in this region, a series connection of the two thin-film solar cells forming the pair is present. In addition, the thin-film solar cell array has a transition region in which the thin-film solar cell applied on the first solar cell is converted into a layer situated below.

19 Claims, 32 Drawing Sheets

(51) Int. Cl.
| | |
|---|---|
| *H01L 31/0475* | (2014.01) |
| *H01L 31/0224* | (2006.01) |
| *H01L 31/028* | (2006.01) |
| *H01L 31/0296* | (2006.01) |
| *H01L 31/0304* | (2006.01) |
| *H01L 31/032* | (2006.01) |
| *H01L 31/18* | (2006.01) |
| *H01L 51/42* | (2006.01) |
| *H01L 51/44* | (2006.01) |
| *H01L 51/00* | (2006.01) |
| *H01L 31/0256* | (2006.01) |

(52) U.S. Cl.
CPC .... *H01L 31/022441* (2013.01); *H01L 31/032* (2013.01); *H01L 31/0304* (2013.01); *H01L 31/0322* (2013.01); *H01L 31/0326* (2013.01); *H01L 31/0475* (2014.12); *H01L 31/1884* (2013.01); *H01L 31/1896* (2013.01); *H01L 51/4253* (2013.01); *H01L 51/442* (2013.01); *H01L 51/0037* (2013.01); *H01L 2031/0344* (2013.01); *Y02E 10/50* (2013.01)

(58) Field of Classification Search
CPC ........... H01L 31/028; H01L 31/022441; H01L 31/1896; H01L 31/0326; H01L 31/0322; H01L 31/0296; H01L 31/0475; H01L 51/0037
USPC .......................................................... 438/80
See application file for complete search history.

(56) References Cited

U.S. PATENT DOCUMENTS

| | | | |
|---|---|---|---|
| 8,076,568 B2* | 12/2011 | Luch | ................. H01L 31/02008 136/244 |
| 2006/0260673 A1 | 11/2006 | Takeyama | |
| 2007/0295381 A1* | 12/2007 | Fujii | ............... H01L 31/022433 136/244 |
| 2008/0314433 A1 | 12/2008 | Luch | |
| 2011/0155219 A1 | 6/2011 | Ma | |

FOREIGN PATENT DOCUMENTS

| | | |
|---|---|---|
| DE | 102008049056 A1 | 4/2010 |
| DE | 102008050332 A1 | 4/2010 |
| DE | 102009023403 | 12/2010 |
| EP | 2437310 A1 | 4/2012 |
| JP | H02244772 A | 4/1992 |
| JP | 2011-222920 | 11/2011 |

OTHER PUBLICATIONS

International Search Report issued in PCT/EP2013/077228 dated Mar. 20, 2014.
International Preliminary Report on Patentability issued in PCT/EP2013/077228.
Lungenschmied et al. "Flexible, long-lived, large-area, organice solar cells", Solar Energy Materials and Solar Cells, Elsevier Science Publishers, Amsterdam, NL. vol. 91, No. 5, Jan. 26, 2007, pp. 379-384.

* cited by examiner

Figure 1 - State of the art

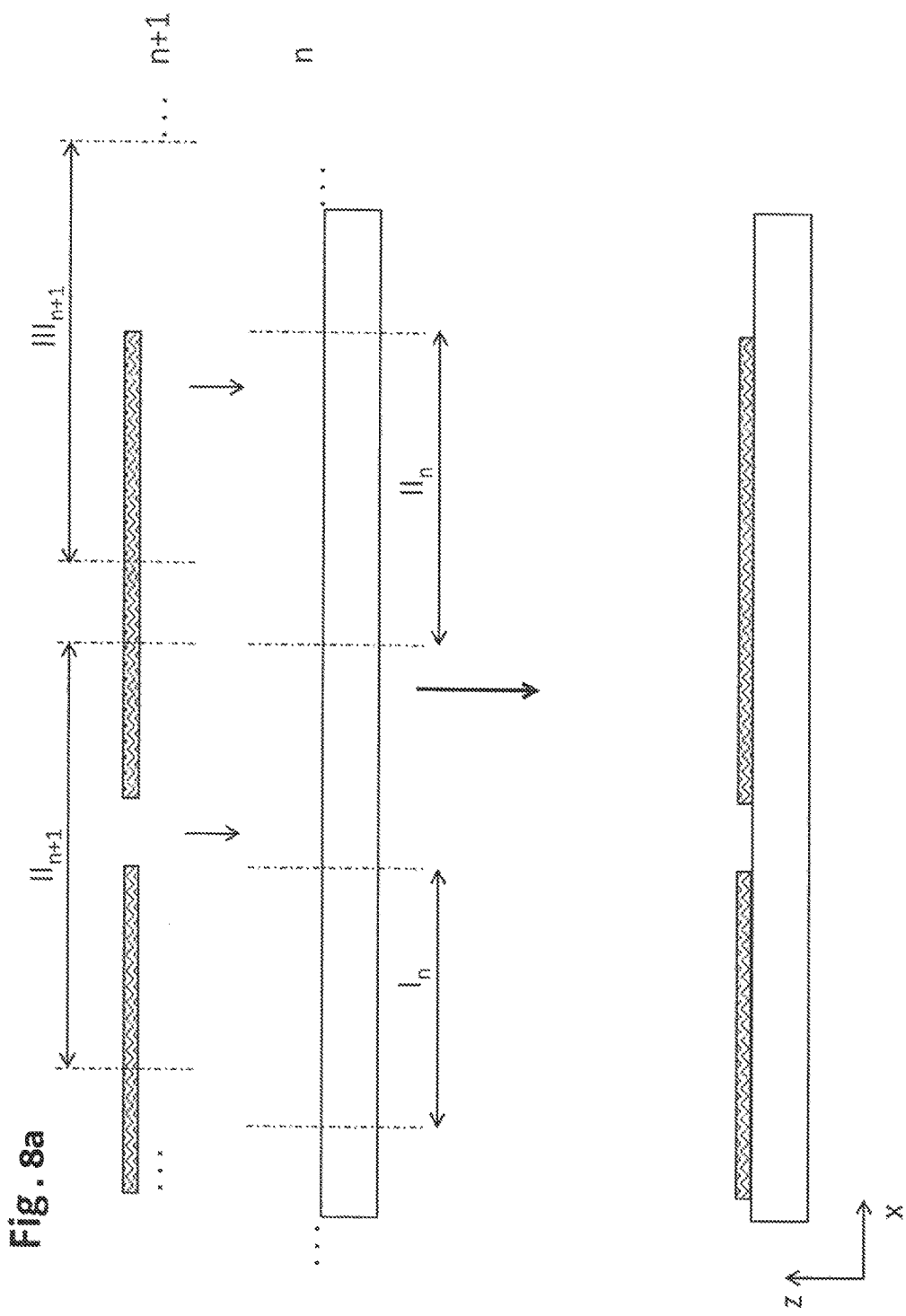

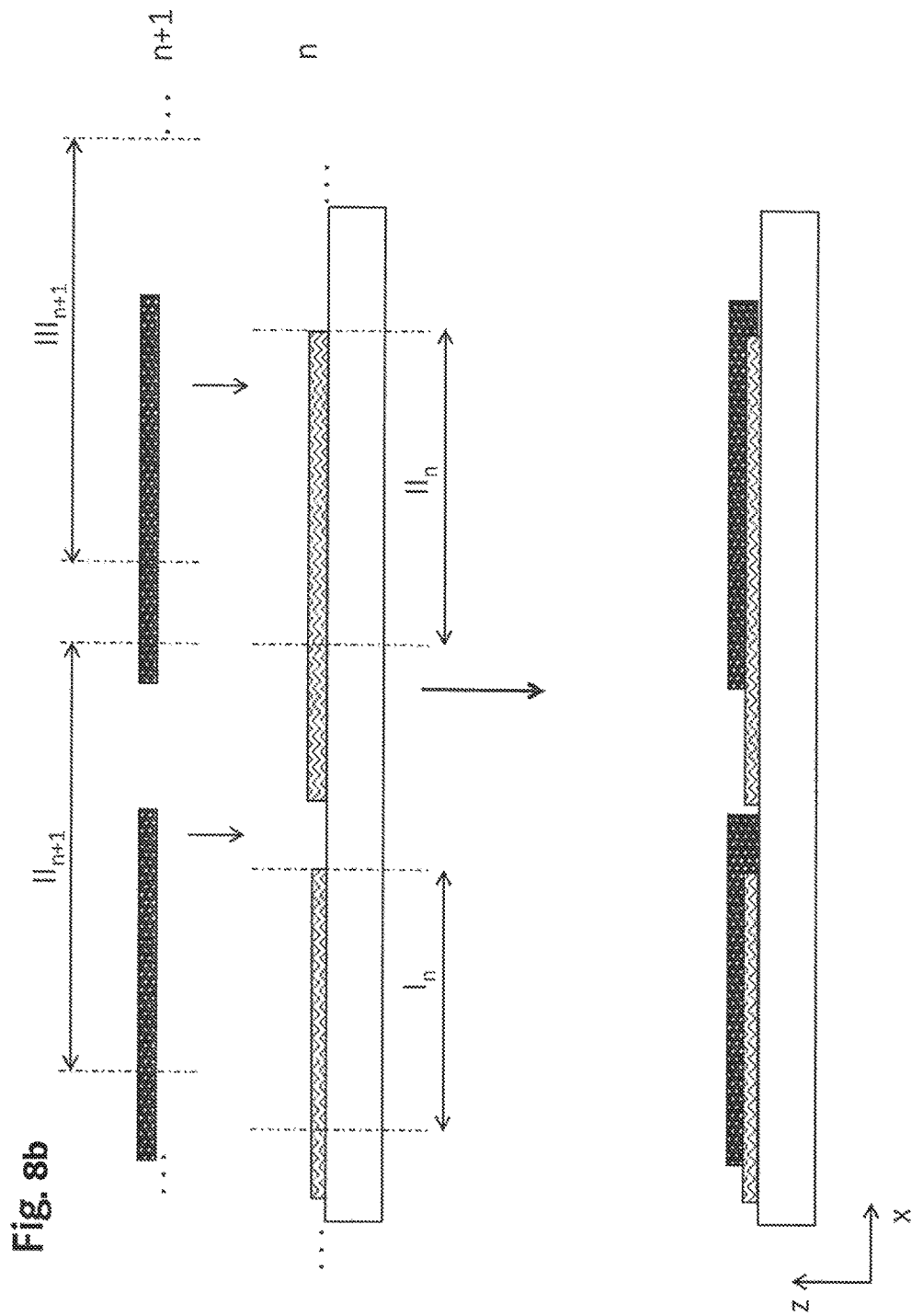

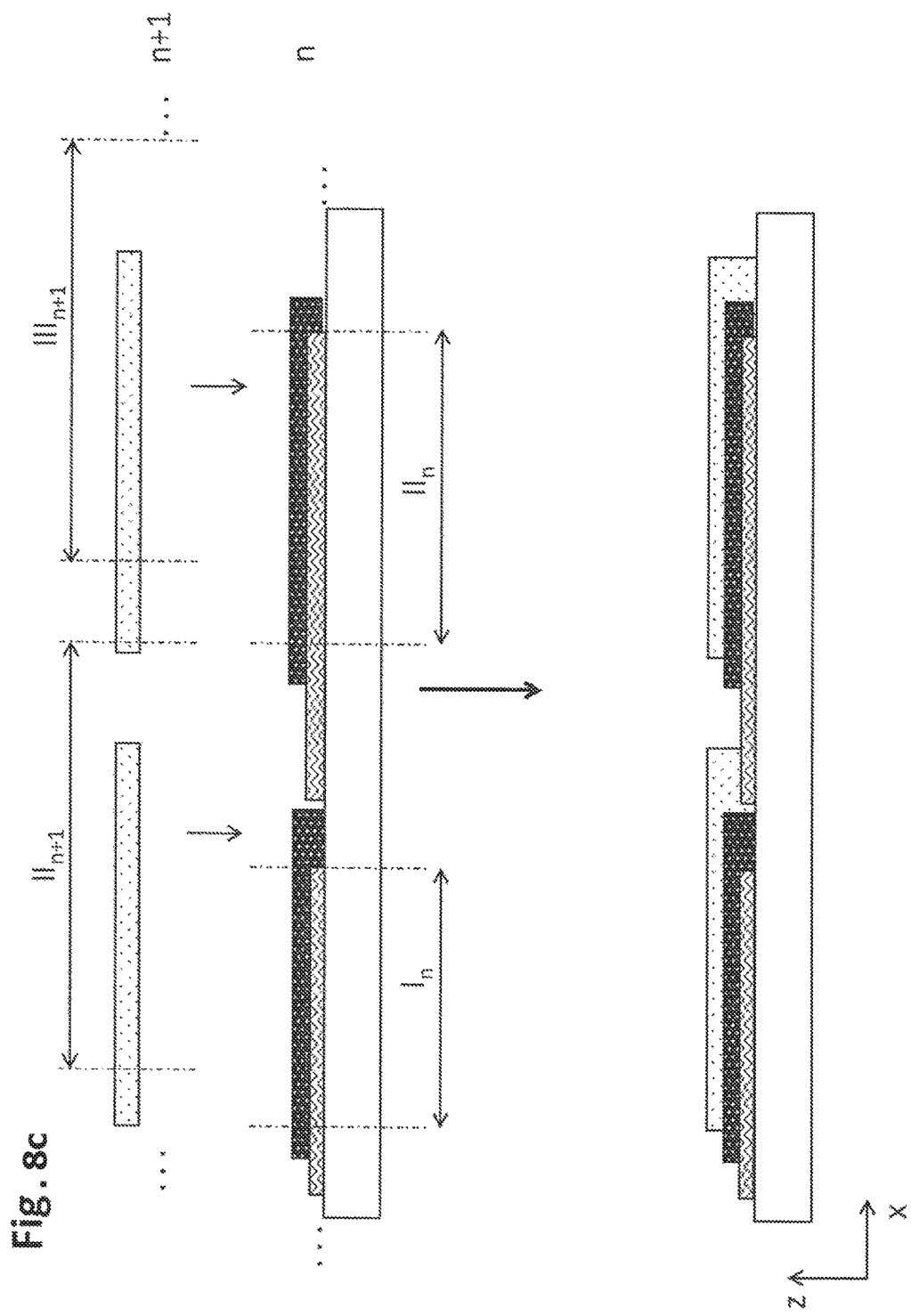

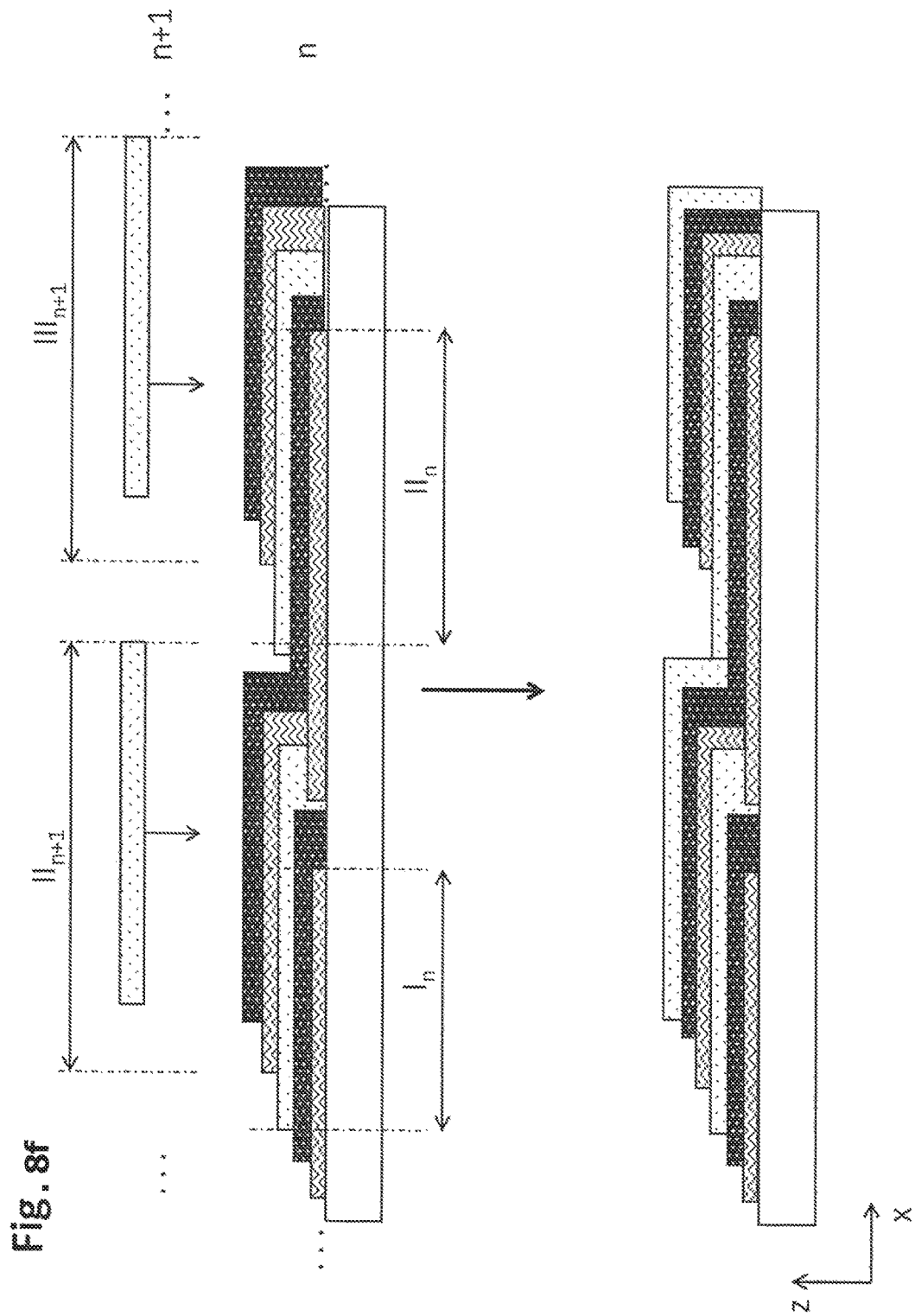

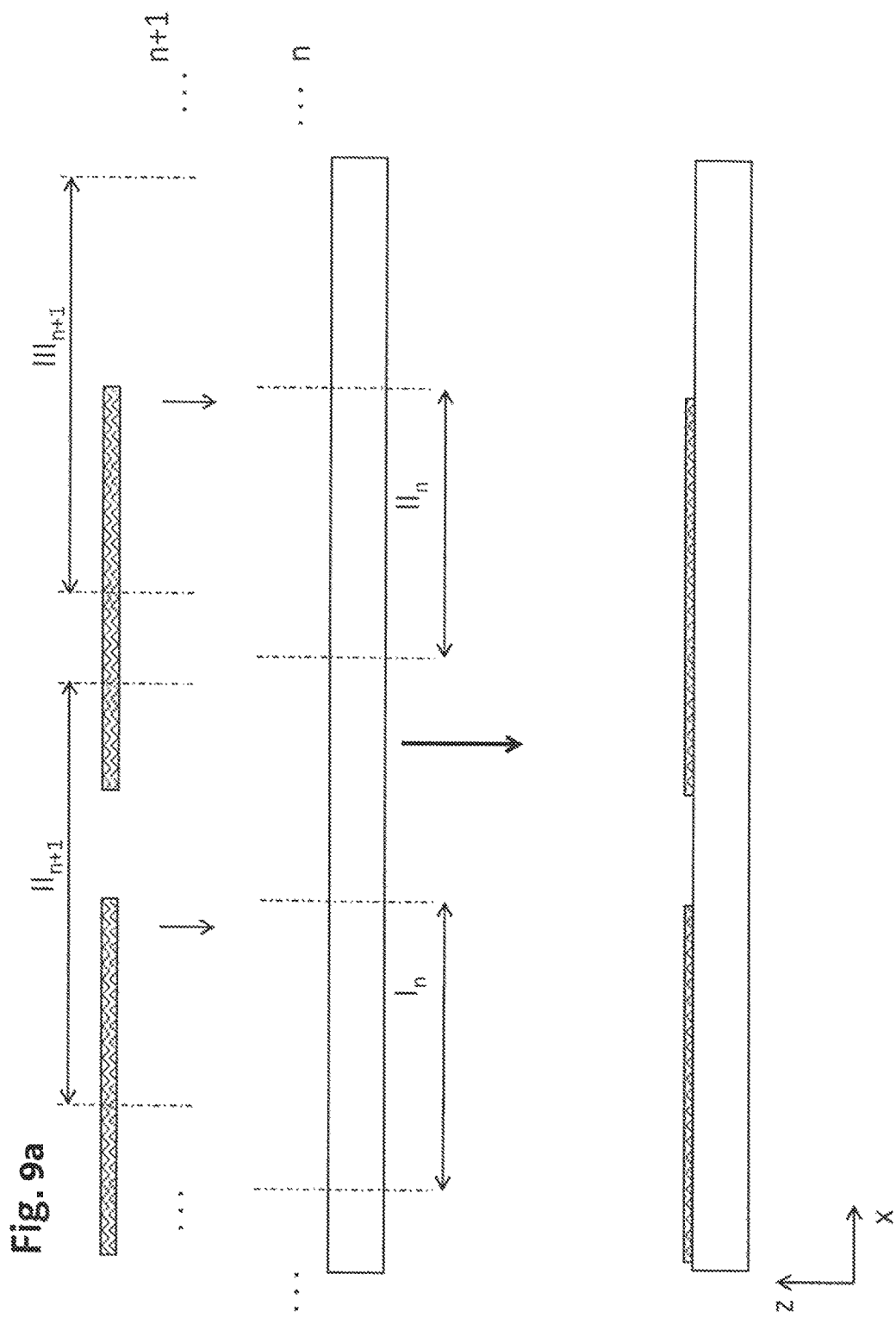

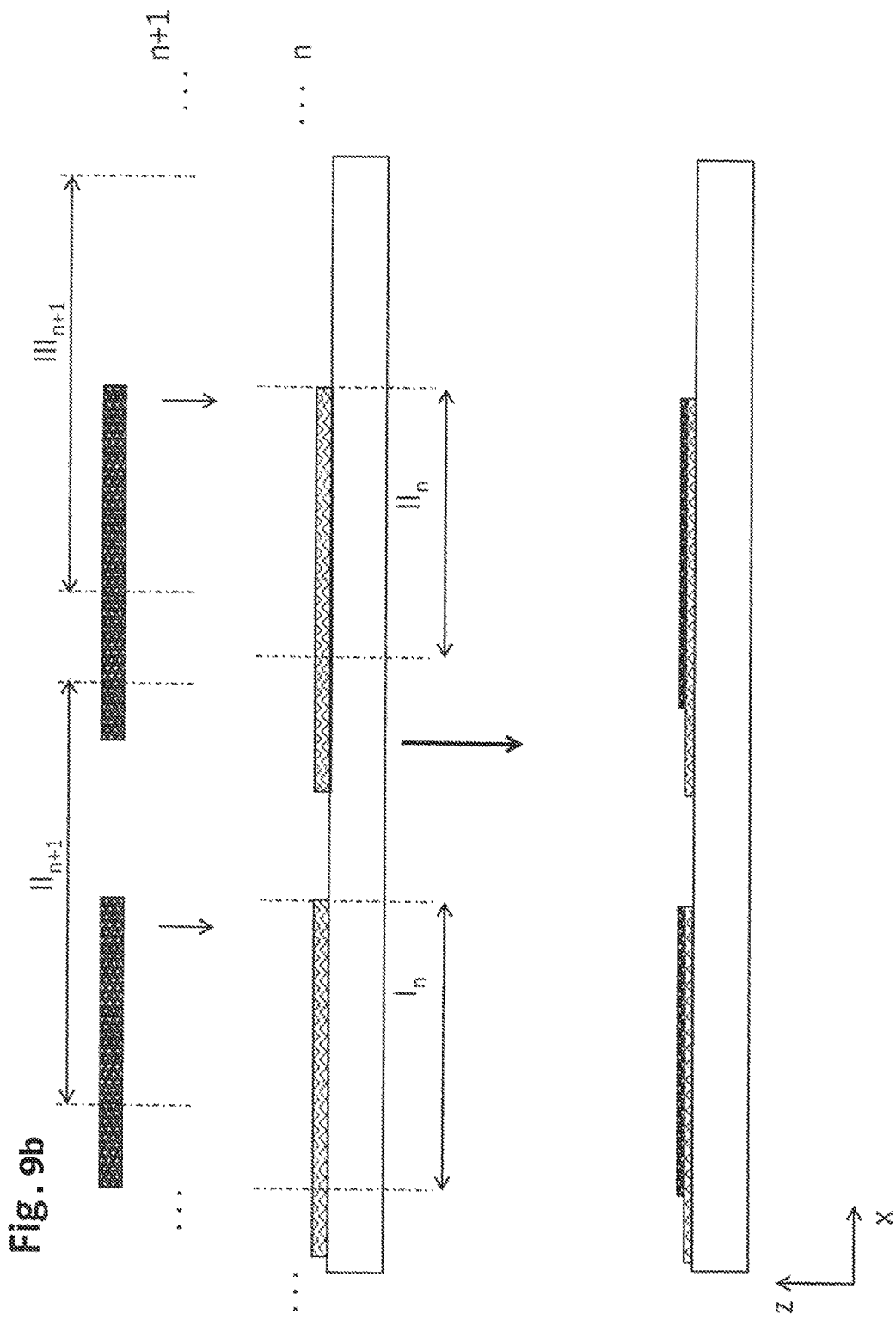

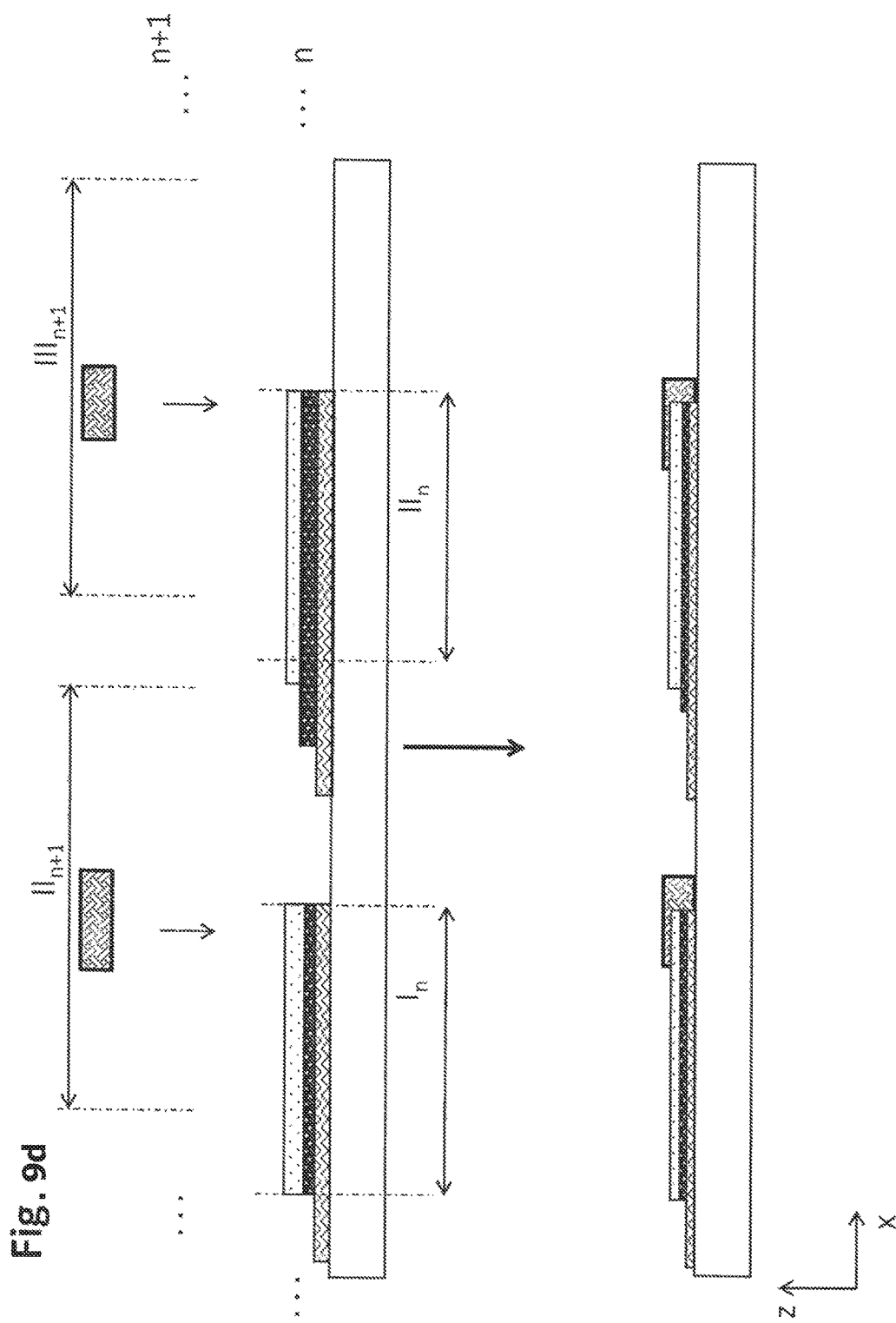

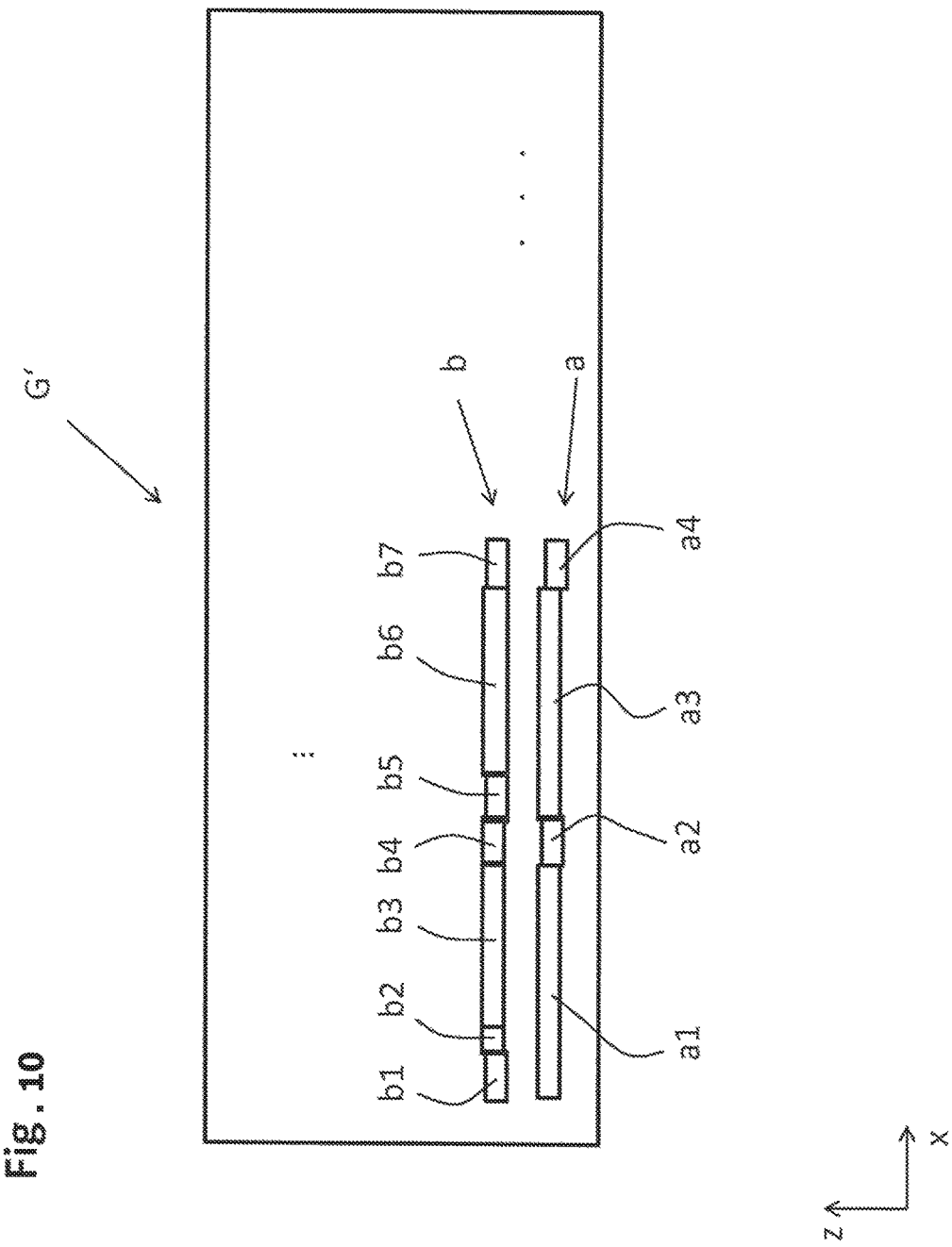

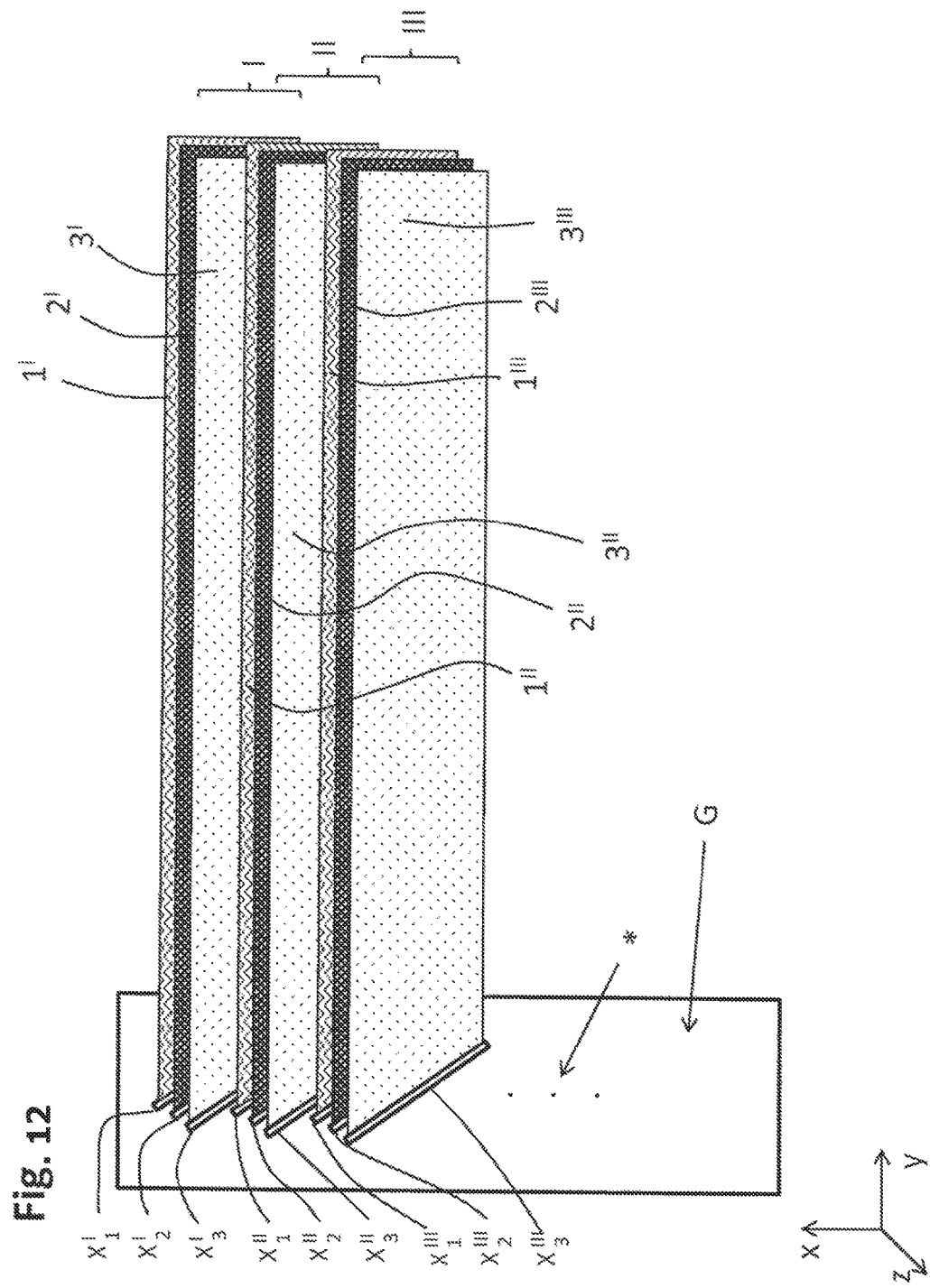

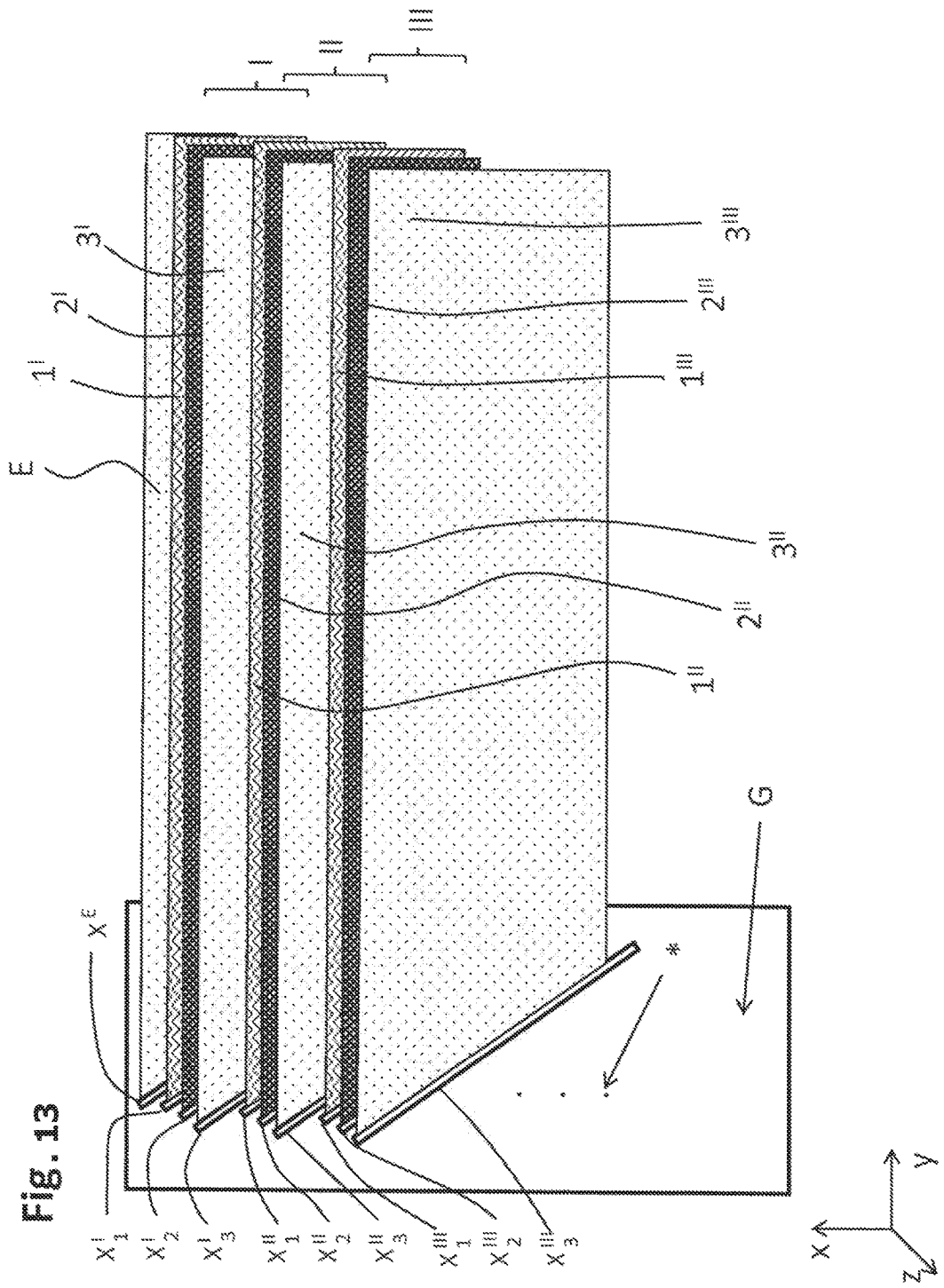

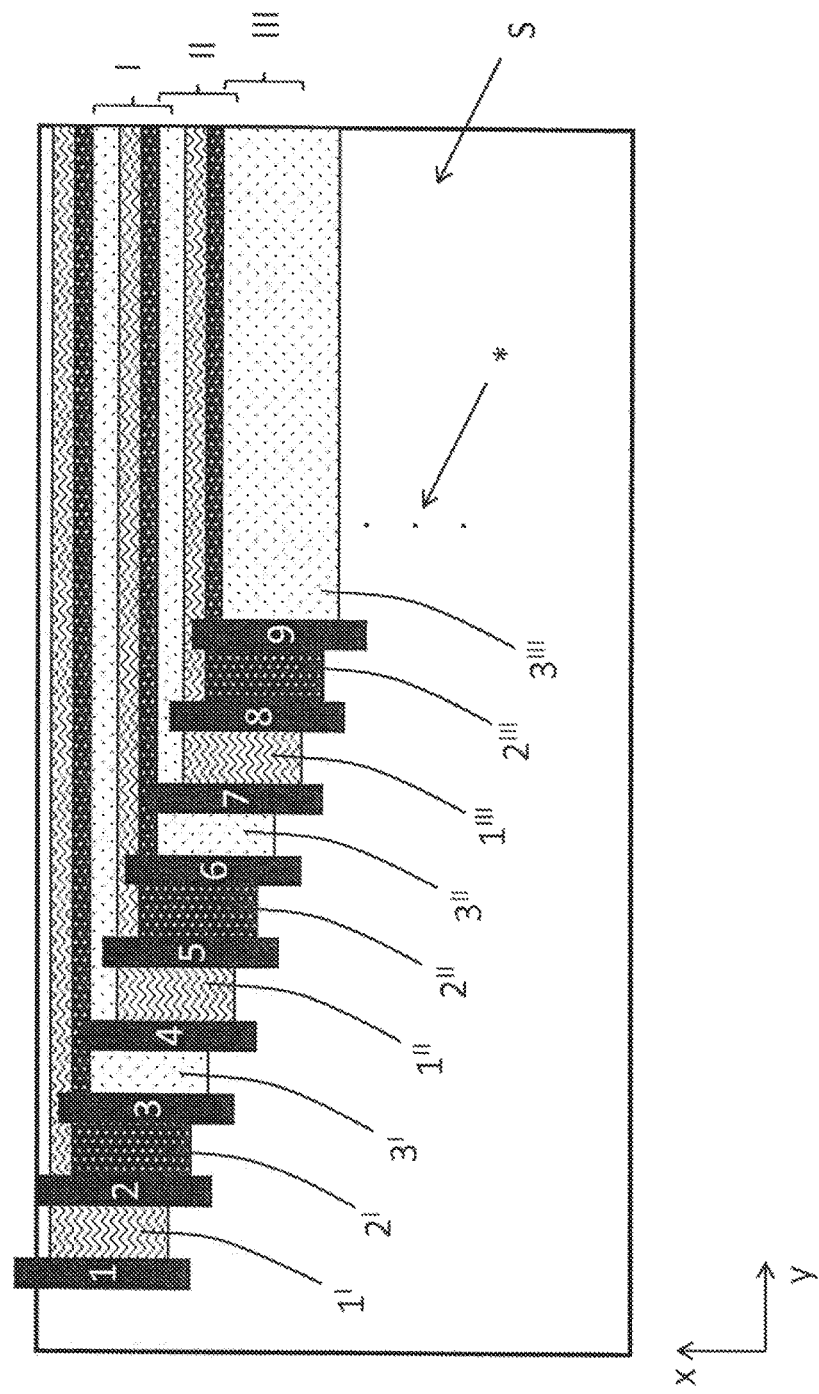

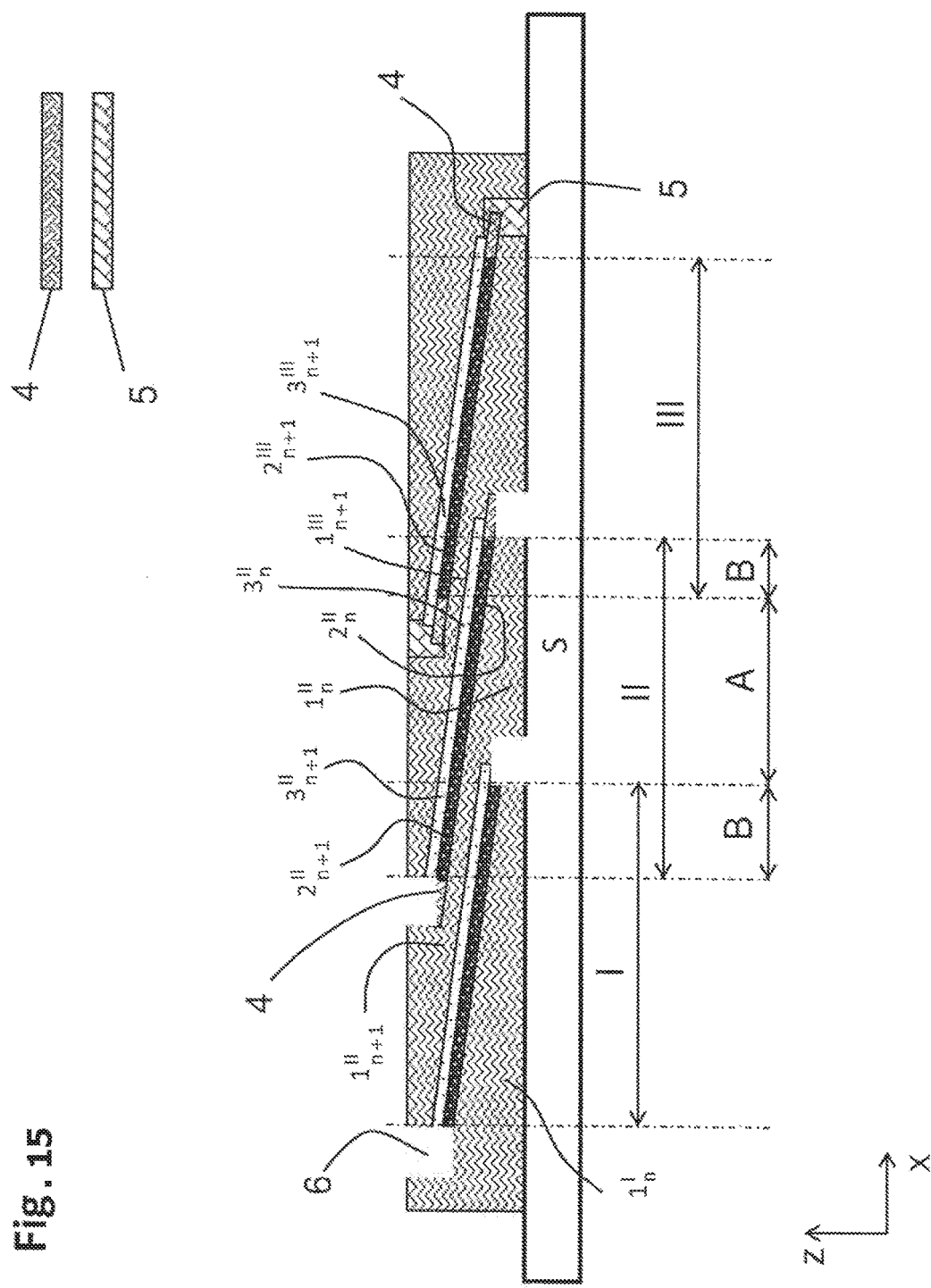

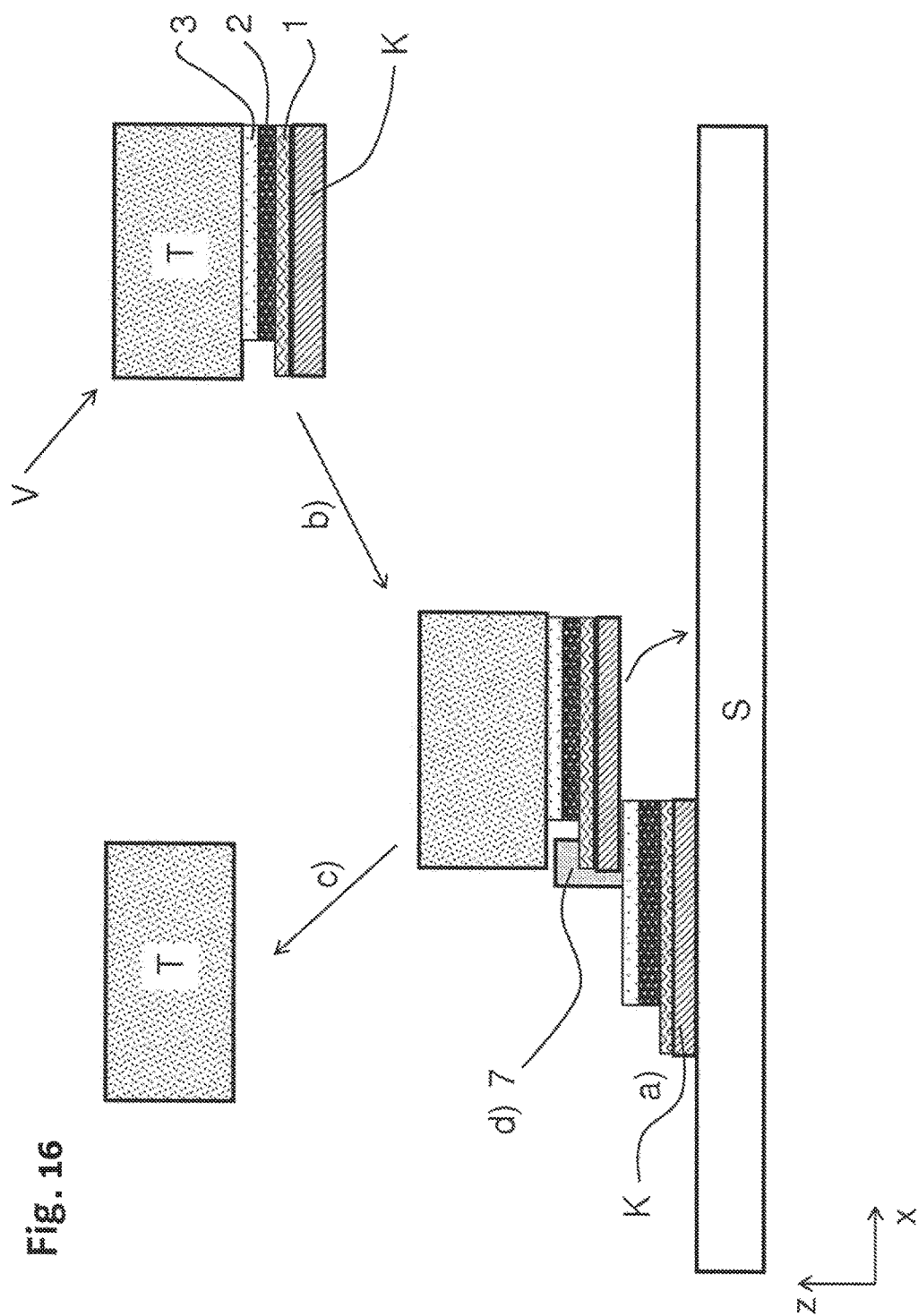

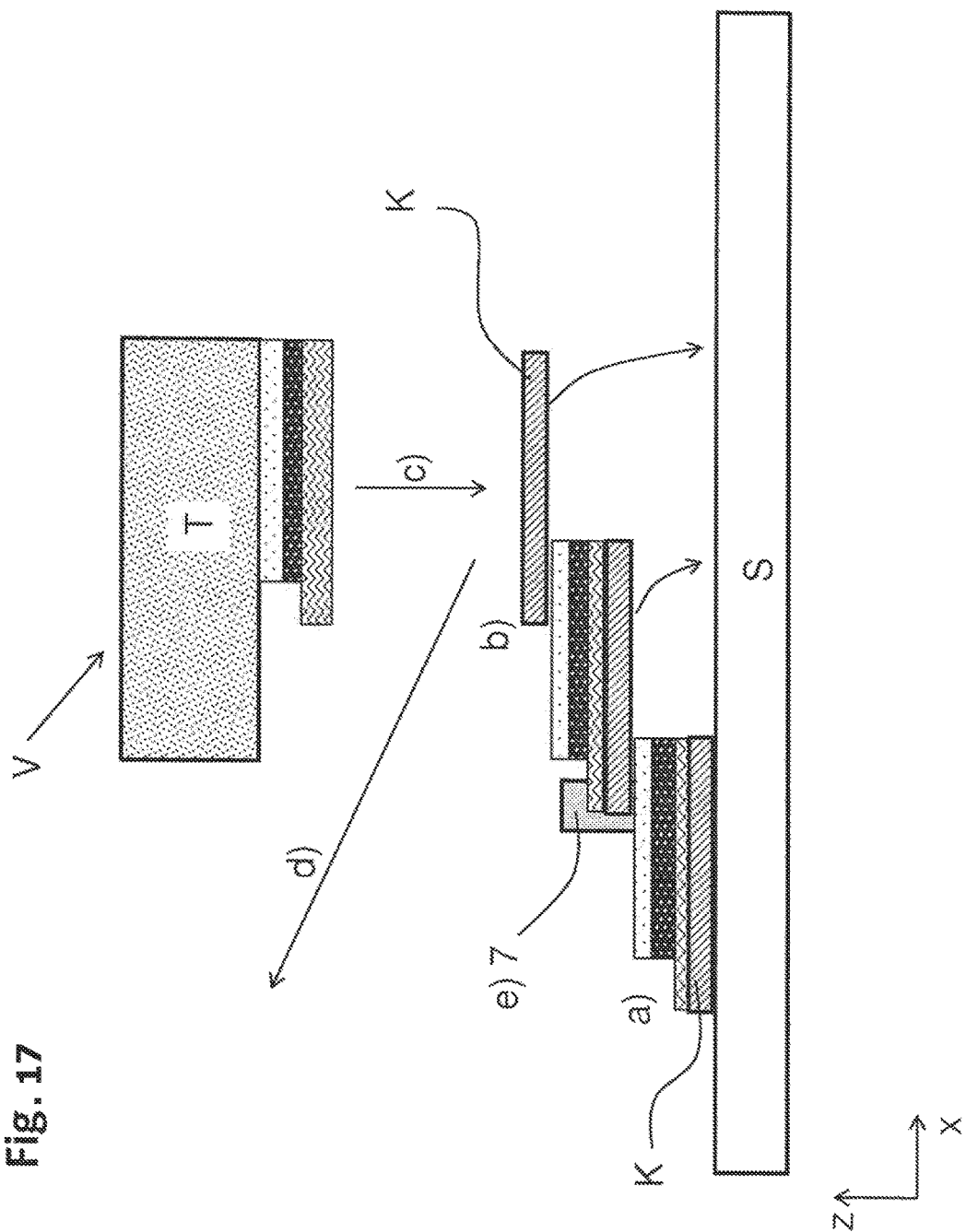

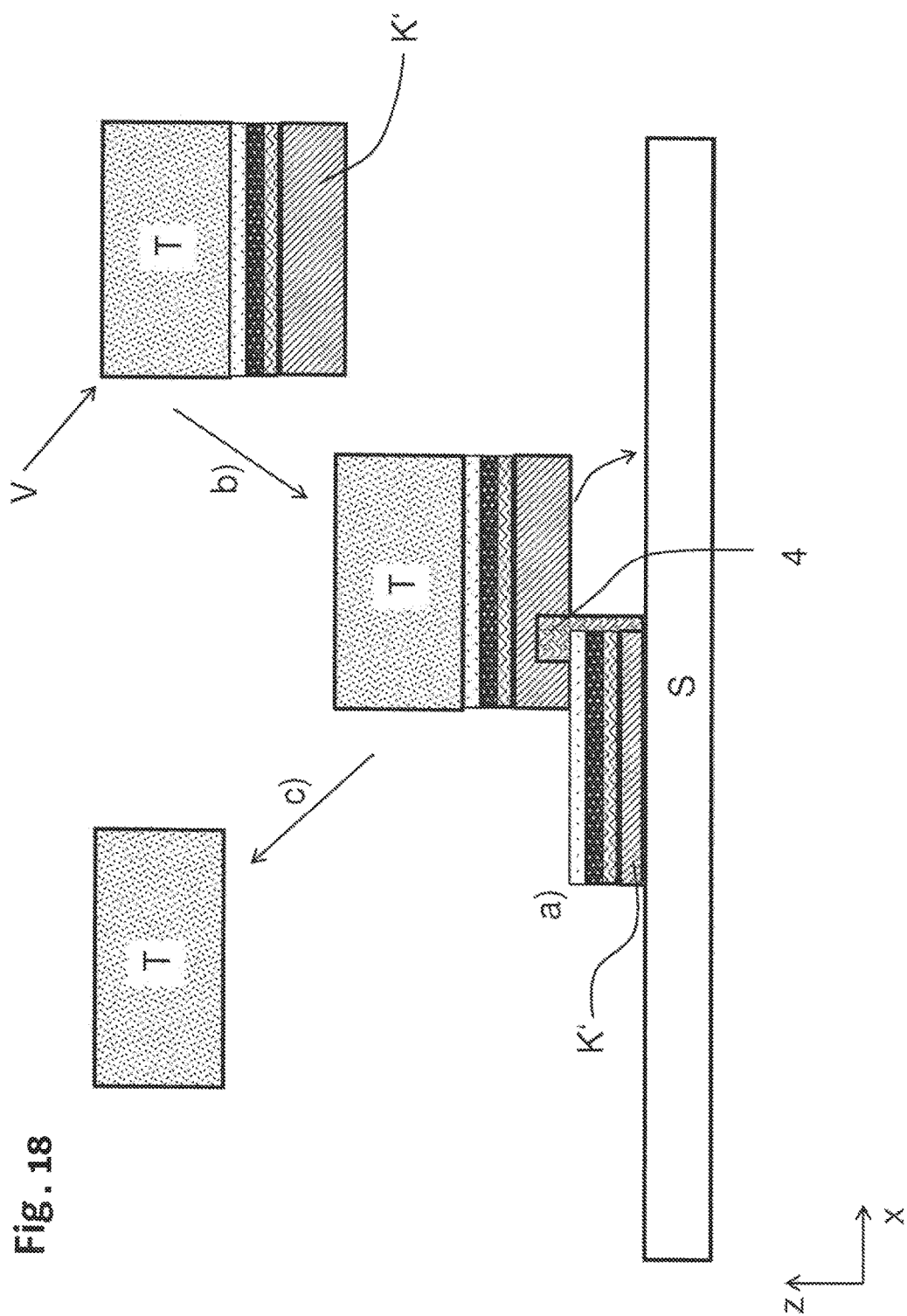

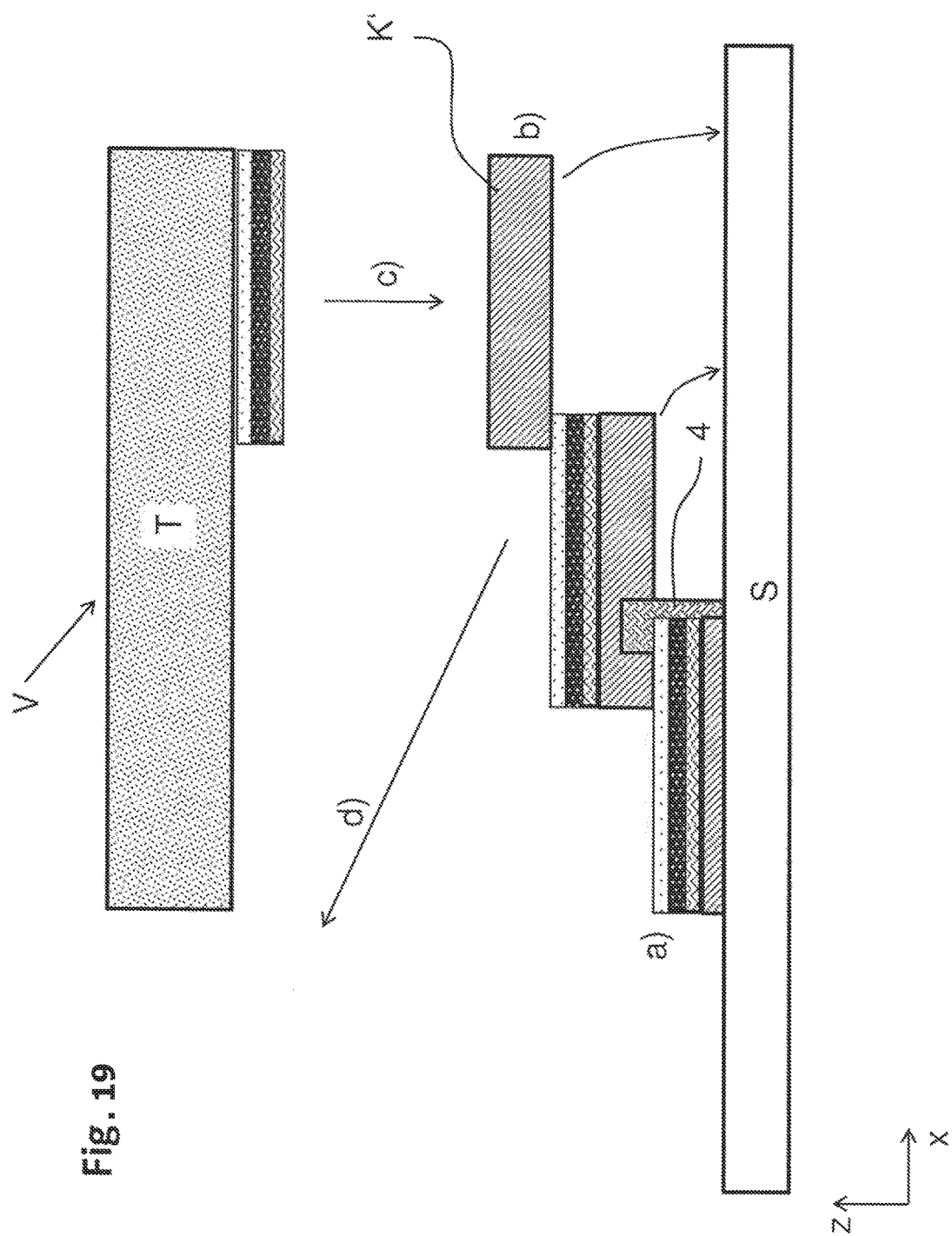

METHOD FOR PRODUCING A THIN FILM CELL ARRANGEMENT

CROSS-REFERENCE TO RELATED APPLICATIONS

This application is a continuation of PCT Application No. PCT/EP2013/077228 filed Dec. 18, 2013, which claims the benefit of German Application No. 10 2012 024 754.0 filed Dec. 18, 2012, their contents and substance of which are herein incorporated by reference.

BACKGROUND OF THE INVENTION

The present invention relates to a method for the production of a thin-film solar cell array in which a plurality of individual thin-film solar cells are applied on a substrate. The individual thin-film solar cells are thereby deposited one above the other in regions so that an overlapping region is produced from respectively one pair of two individual thin-film solar cells; in this region, a series connection of the two thin-film solar cells forming the pair is present. In addition, the thin-film solar cell array has a transition region in which the thin-film solar cell applied on the first solar cell is converted into a layer situated below.

In scaling up solar cells, organic light-emitting diodes and batteries, the problem exists that the current increases proportionally to the surface area. Since the ohmic power loss increases quadratically with the current, clear limits for the size of individual cells result herefrom. This problem is generally solved by
 1. the use of very conductive strip conductors (usually silver) and also
 2. the series connection of cell elements to form a module.

In the latter case, the current remains constant when increasing the module surface area and the voltage increases proportionally to the size of the module. However, a significant loss of active surface area and hence of efficiency is associated herewith.

For small-surface applications, the problem often exists of achieving sufficiently high voltage on a small surface area. In the case of a conventional connection, this necessarily leads to a very high relative surface area loss and hence efficiency loss. This problem can be solved by stacking a plurality of partially transparent solar cells/oLEDs/batteries in order to achieve a higher voltage and lower current densities, as a result of which fewer cell strips are required. However, the problem arises that all the sub-cells must deliver/consume the same current. However this can only be ensured, e.g. for solar cells, by adapting the layer thicknesses for a specific spectrum.

In the case of thin-film solar cells, generally a monolithic series connection is produced in order to avoid ohmic power losses in the transparent electrode by the individual layers of the solar cell being structured periodically in individual strips, specific layers having a defined overlap in order to connect the plus pole of one strip to the minus pole of the adjacent strip electrically without a short circuit being produced between the poles of one strip. A similar process can also be undertaken for large-surface oLEDs or batteries. These connection regions do not provide any current/light and hence represent a surface area- and hence power-/efficiency loss. Since the respective layers must be structured at least partially before coating with the further layers, this connection places high demands on the repetition precision or register accuracy. At least three, more likely five times the minimum structural size or tolerance is required for the connection. The more layers the stack comprises, the more critical this problem becomes.

A further possibility is the production of individual cell elements, one of the contacts being guided on the rear-side and these cell elements being fixed to each other, shingle-like, with a small overlap (DE 10 2008 049056, DE 100 20 784). As a result, the surface area loss is significantly reduced. Of disadvantage hereby are the high requirements on the positional precision, relatively complex handling of the generally small individual elements and also the resulting greatly uneven topography from which a more complex encapsulation results and also mechanical weakened points are produced.

A normal array of thin-film solar cells which is known from the state of the art is described in FIG. 1. With respect to the meaning of the reference numbers and the terminology which is used, reference is made to the definitions for FIG. 1 $f\!f\!.$ which are given further on. A plurality of thin-film solar cells (I and II) which are applied adjacently in x-direction is illustrated. The respective thin-film solar cells thereby have respectively a rear-side electrode (1), a photoactive layer (2) applied over the electrode (1) in z-direction and also a second electrode and/or a conversion layer (3) applied hereon. All of the components of such thin-film solar cells, illustrated schematically in FIG. 1, i.e. electrode (1), photoactive layer (2) and also conversion layer (3), can thereby be configured in one layer, however they can also consist of a plurality of layers (e.g. a conductive layer and a charge carrier-selective layer, likewise a plurality of layers is possible. For example, likewise the photoactive layer (2) can have an inner structure (e.g. two or more layers one above the other or an interpenetrating network made of two or more materials). For example, it is likewise possible that the electrodes can comprise a conversion layer. The partial solar cells can respectively also be multiple solar cells (multijunction solar cells). Such a multitude of possibilities for the individual components of the thin-film solar cells are available both for the thin-film solar cell known from the state of the art according to FIG. 1 and also all of the subsequently illustrated embodiments of the thin-film solar cells produced with the method according to the invention.

The production of current in the case of the thin-film solar cell array illustrated in FIG. 1 is restricted to the surface areas in which all of the three layers (rear-side electrode, photoactive layer and also second electrode and/or conversion layer) are disposed situated one above the other. The respective individual layers of the individual solar cells are thereby configured in steps (in FIG. 1, in the case of the respective solar cells I and II, illustrated respectively on the left) in order to avoid electrical short circuits of the solar cells. In one region (L), a series connection of the individual solar cell modules I and II is effected, in which the upper electrode and/or conversion layer (3$^I$) of the first solar cell (I) is contacted with the rear-side electrode (1$^{II}$) of the second thin-film solar cell (II). Such a series connection is termed in the state of the art "monolithic series connection". It is detectable that no solar cell is configured in region (L) since, in this region, the three layers (1, 2 and 3) forming one respective solar cell are not disposed situated one above the other. The surface area of such a thin-film solar cell array configured in region (L) cannot hence be used for current production.

SUMMARY OF THE INVENTION

Starting herefrom, it is hence the object of the present invention to indicate a method for producing an improved thin-film solar cell array with which a higher current yield is achievable and with which the mechanical problems known from the state of the art can be solved. The crux of the invention is a method for producing a shingle-like structure by direct deposition/structuring of the functional layers in a suitable spatial and temporal sequence, which structure has to date only been available by premanufacture, cutting and mechanical positioning one above the other. It is necessary for this purpose to produce separate regions of the respective functional layers. This can be effected directly by structured deposition or indirectly by a full-surface deposition with subsequent selective or partially selective removal, e.g. by laser structuring or mechanical removal.

This object is achieved by the features of patent claim 1. The respective dependent patent claims thereby represent advantageous developments.

The invention hence relates to a method for the production of a thin-film solar cell array, comprising a plurality of thin-film solar cells (I, II, III, . . . ) applied on a substrate (S), which comprise respectively at least one first rear-side electrode ($1^I$, $1^{II}$, $1^{III}$, . . . ), which is orientated towards the substrate (S), and a second electrode and/or a conversion layer ($3^I$, $3^{II}$, $3^{III}$, . . . ), and also a photoactive layer ($2^I$, $2^{II}$, $2^{III}$, . . . ) disposed between the rear-side electrode ($1^I$, $1^{II}$, $1^{III}$, . . . ) and the second electrode and/or the conversion layer ($3^I$, $3^{II}$, $3^{III}$, . . . ), the thin-film solar cell array a) having at least one overlapping region (B) in which respectively one first (I, II, . . . ) and one second thin-film solar cell (II, III, . . . ) are disposed in two layers (n, n+1, . . . ) and in pairs (I-II, II-III, . . . ) situated one above the other, one region of the respectively first thin-film solar cell (I, II, . . . ) in a first layer (n, . . . ) and one region of the respectively second thin-film solar cell (II, III, . . . ), which is disposed on the side of the respectively first thin-film solar cell (I, II, . . . ) orientated away from the substrate (S), in a layer (n+1, . . . ) situated above the respectively first thin-film solar cell (I, II, . . . ), being connected to each other and connected electrically in series, and b) having at least one transition region (A) in which respectively only the respectively second thin-film solar cell (II, III, . . . ) of the pair of respectively first and respectively second thin-film solar cell (I-II, II-III, . . . ) is configured, configured in the layer (n+1, . . . ) situated above the first layer, the rear-side electrode ($1^{II}_{n+1}$, $1^{III}_{n+1}$, . . . ) the photoactive layer ($2^{II}_{n+1}$, $2^{III}_{n+1}$, . . . ) and the second electrode and/or the conversion layer ($3^{II}_{n+1}$, $3^{III}_{n+1}$, . . . ) of the respectively second thin-film solar cell (II, III, . . . ) being converted, configured in the first layer (n, . . . ), into respectively one rear-side electrode ($1^{II}_n$, $1^{III}_n$, . . . ), a photoactive layer ($2^{II}_n$, $2^{III}_n$, . . . ) and a second electrode and/or a conversion layer ($3^{II}_n$, $3^{III}_n$, . . . ).

The thin-film solar cell array produced according to the invention according to the present invention hence comprises a plurality of thin-film solar cells which have respectively a rear-side electrode, a photoactive layer and also a second electrode and/or conversion layer. These essential components of the thin-film solar cells are subsequently also termed "layers" or "active layers".

The term substrate denotes a carrier on which the stack of solar cells, consisting of at least $1^{st}$ electrode, photoactive layer and $2^{nd}$ electrode, is applied. This includes the configurations of substrate and superstrate known from thin-film photovoltaics. In the case where the active layers of the thin-film solar cell array are applied on a superstrate, the above-mentioned rear-side electrode (1) hence represents the front- or fore-side electrode, whilst the second electrode (3) should be termed rather rear-side electrode in this case. Since however nothing has changed in the basic constructive principles of a structure, based on a superstrate, of a thin-film solar cell array, the terminology for a substrate-based thin-film solar cell array is used subsequently, however it may be stressed explicitly that these constructive principles can be applied and transferred likewise to superstrate-based thin-film solar cells. The superstrate-based thin-film solar cells are hence likewise included by the concept according to the invention.

According to the present invention, it is now provided that the individual thin-film solar cells which form the thin-film solar cell array, are disposed offset relative to each other, respectively two thin-film solar cells being disposed or deposited in pairs in an overlapping region situated one above the other. In this overlapping region, a series connection of these two thin-film solar cells of one respective pair is effected.

In addition, it is provided according to the invention that at least one transition region is present in the thin-film solar cell array. In this transition region, conversion of that solar cell which is disposed or laminated in a pair of two solar cells over the respective other solar cell into a layer situated below is effected. In this transition region, only the second solar cell of the pair of first and second solar cell is hence configured. The term "laminate" or "laminated on" etc. is thereby used synonymously, in the sense of the present invention, with "deposit" or "deposited".

The solar cell now configured hence in the layer situated below can be connected in series to a further solar cell according to the previously described principles so that an iterative arrangement of a plurality of solar cells connected in series can be obtained.

It is thereby particularly preferred that the region of the monolithic connection (region L, see FIG. 1) of the monolithically connected solar cells, as are known from the state of the art, can be used entirely for energy production since, in this region (this corresponds according to the invention to the transition region A), an active solar cell is now likewise present since an active stack of respective layers of a thin-film solar cell module is also present here. Surface area losses, due to non-active regions within a thin-film solar cell array, can hence be entirely avoided.

The proposed method allows the production of particularly narrow partial solar cells and makes in particular the use of very small connection spacings possible despite significant structural dimensions and tolerances. Thus the strip width of the active layers can be of the same order of magnitude as the minimum possible structural dimension or register accuracy. As a result of the lower surface area loss and smaller spacings, the efficiency can if necessary be increased significantly. This method also allows the use of transparent electrodes with particularly low conductivity. As a result, an increase in transparency and hence in efficiency can be achieved, or particularly economical materials can be used. Furthermore, by overlapping a plurality of solar cells on very small surface areas, very high voltages can be achieved.

Furthermore, the production rate can be increased with the same or similar investment since, instead of a subsequent cutting and laminating device, further deposition sources are used.

In the case of the method according to the invention, there are produced on a substrate (S), simultaneously or successively, a plurality of thin-film solar cells (I, II, III, . . . ) by means of respective simultaneous or successive deposition of at least one first rear-side electrode ($1^I$, $1^{II}$, $1^{III}$, ...) orientated towards the substrate (S), at least one photoactive layer ($2^I$, $2^{II}$, $2^{III}$, ...) disposed above and also at least one second electrode and/or a conversion layer ($3^I$, $3^{II}$, $3^{III}$, ...) disposed above on the substrate (S), at least two thin-film solar cells (I, II, III, ...) being produced in at least one overlapping region (B) in pairs (I-II, in at least two layers (n, n+1, ...) situated one above the other, by the respectively second thin-film solar cell (II, III, ...) of each pair (I-II, II-III) of first (I, II, ...) and second thin-film solar cell (II, III, ...) being deposited in regions in a layer (n+1, n+2, ...) situated above the respectively first thin-film solar cell, and the respectively first (I, II, ...) and second thin-film solar cell (II, III, ...) in this region (B) being connected electrically in series, and the respectively second thin-film solar cell (II, III, ...) of each pair of first (I, II, ...) and second thin-film solar cell (II, III, ...) being deposited offset relative to the respectively first thin-film solar cell (I, II, ...) of each pair of first (I, II, ...) and second thin-film solar cell (II, III, ...) so that a transition region (A) is configured, in which the rear-side electrode ($1^{II}$, $1^{III}$, ...), the photoactive layer ($2^{II}$, $2^{III}$, ...) disposed above and also the second electrode and/or the conversion layer ($3^{II}$, $3^{III}$, ...) disposed above, of the respectively second thin-film solar cell of each pair of first (I, II, ...) and second thin-film solar cell (II, III, ...) is converted from the layer (n+1, n+2, ...) situated above the respectively first thin-film solar cell onto a layer (n, n+1) situated below.

The method according to the invention enables the production of a previously described thin-film solar cell array in which, respectively in pairs, two thin-film solar cells are connected to each other in series in an overlapping region and are applied situated one above the other, the respectively second thin-film solar cell of a pair of first and second thin-film solar cell being converted, in a transition region, from a layer situated above the first solar cell into a layer situated below. According to the method according to the invention, the solar cells can be deposited in two layers but also more than two layers by respective repetition of production of the respective thin-film solar cells. In addition, it is also possible to connect in series a plurality of thin-film solar cells (in x-direction) in pairs so that a large number of thin-film solar cells which are disposed adjacently and connected in series results.

It is preferred if a plurality of pairs (I-II, II-III ...) of first (I, II, ...) and second thin-film solar cell (II, III, ...) is disposed iteratively, a plurality of overlapping regions ($B^{I-II}$, $B^{II-III}$, ...) being present with thin-film solar cells (I-II, II-III, ...), connected in pairs, and also a plurality of transition regions ($A^I$, $A^{II}$, ...) of the respectively second thin-film solar cell (II, III, ...) of the plurality of pairs (I-II, II-III, ...) of first (I, II, ...) and second thin-film solar cell (II, III, ...).

This preferred embodiment provides that a plurality of thin-film solar cells is disposed respectively offset relative to each other, and is connected respectively to each other in series in pairs. For example, a first solar cell (I) with a second solar car (II) can be connected to each other in series via an overlapping region (B), the first solar cell (I) and the second solar cell (II) thereby forming a pair. Furthermore, the second solar cell (II) with a third solar cell (III) can likewise be connected to each other in series in an overlapping region (B), the second solar cell (II) with the third solar cell (III) thereby likewise forming a pair. The respective pair of thin-film solar cells (I-II, II-III) thereby has respectively a transition region which is configured in the respective second solar cell of the respective pair, i.e. in the case of the pair of solar cells (I-II) in the solar cell (II) and also in the case of the pair of solar cells (II-III) in the solar cell (III). In this transition region, the second solar cell of the respective pair is converted into a layer situated below.

The respective solar cells are thereby configured in at least two layers.

It can be provided for example that the plurality of thin-film solar cells is disposed in two layers (n, n+1), respectively the second thin-film solar cell (II, III, ...) of a pair of respectively first and respectively second thin-film solar cell (I-II, II-III, ...) having a transition region ($A^I$, $A^{II}$, ...) in which, configured in the second layer (n+1), the rear-side electrode ($1^{II}_{n+1}$, $1^{III}_{n+1}$, ...), the photoactive layer ($2^{II}_{n+1}$, $2^{III}_{n+1}$ ...) and the second electrode and/or the conversion layer ($3^{II}_{n+1}$, $3^{III}_{n+1}$, ...) of the respectively second thin-film solar cell (II, III, ...) are converted, configured in the first layer (n, ...), into respectively a rear-side electrode ($1^{II}_n$, $1^{III}_n$, ...), a photoactive layer ($2^{II}_n$, $2^{III}_n$, ...) and a second electrode and/or a conversion layer ($3^{II}_n$, $3^{III}_n$, ...).

This embodiment provides that at least two solar cells are disposed in pairs, offset adjacently in the previously described manner, and all of the solar cells are configured in precisely two layers. The first solar cell of the pair of two solar cells is thereby configured in a first plane (n), the second solar cell of the pair of two solar cells in a plane (n+1); the overlapping region (B) of both solar cells is situated in this region. In the transition region, conversion of the second solar cell into the layer of the first solar cell of the pair (n) is effected. The region of the second solar cell configured in this layer (n) can hence be used in order further to connect in series a third solar cell (III) by overlapping and configuring a further overlapping region (B). An iterative array of any number of solar cells is possible.

A further embodiment provides that the plurality of thin-film solar cells is disposed in three layers (n, n+1, n+2), respectively the second thin-film solar cell (II, III, ...) of a pair of respectively first and respectively second thin-film solar cell (I-II, II-III, ...) having two transition regions disposed in steps, configured in the third layer (n+2), the rear-side electrode, the photoactive layer and the second electrode and/or the conversion layer of the respectively second thin-film solar cell (II, III, ...), in the first transition region, being converted, configured in the second layer (n+1), into respectively a rear-side electrode, a photoactive layer and a second electrode and/or a conversion layer, and, in the second transition region, into one configured in the first layer (n).

According to this preferred embodiment, the respective thin-film solar cells are configured in three layers. A gradual conversion of the solar cell which is configured in the uppermost layer (n+2) thereby takes place by means of two transition regions to the lowermost layer (n). In the regions configured between the respective transition regions (A), a series connection (overlapping regions B) is effected at least in regions with solar cells disposed below or above this solar cell.

Furthermore, it can be possible that the plurality of thin-film solar cells is disposed in four layers (n, n+1, n+2, n+3), respectively the second thin-film solar cell (II, III, ...) of a pair of respectively first and respectively second thin-film solar cell (I-II, II-III, ...) having three transition regions disposed in steps, configured in the fourth layer (n+3), the rear-side electrode, the photoactive layer and the second electrode and/or the conversion layer of the respectively second thin-film solar cell (II, III, ...), in the first transition region, being converted, configured in the third layer (n+2), into respectively a rear-side electrode, a photoactive layer and a second electrode and/or a conversion layer in the second transition region, into one thereof configured in the second layer (n+1) and, in the third transition region, into one thereof configured in the first layer (n), Such an array is the continuance of the concept described further back in which the thin-film solar cells are disposed in three layers. A step-wise conversion of the thin-film solar cell is effected here, starting from the uppermost layer (n+3) into the layers (n+2, n+1 and n) respectively situated below in corresponding transition regions (A). Between the respective transition regions (A), a series connection of this solar cell respectively in pairs is effected with solar cells configured above and/or below.

Preferably, the width (in x-direction) of each overlapping region (B) of each pair of respectively first and respectively second thin-film solar cell (I-II, II-III, . . . ) is between 0.01 and 0.99 times, preferably between 0.01 and 0.1 times, 0.4 to 0.6 times or 0.9 to 0.99 times the length of the respective second thin-film solar cell (II, III, . . . ).

If a small width ratio, for example between 0.01- and 0.1 times, is chosen for the overlapping region, this overlapping region can be used for series connection of the individual solar cells of one respective pair of thin-film solar cells. Essentially only one solar cell is configured over the remaining width over the whole area in the thin-film solar cell module. Insofar as a greater width ratio is chosen, for example between 0.9- and 0.99 times the length of the respectively second thin-film solar cell of a pair of thin-film solar cells, essentially a plurality of layers of solar cells, disposed one above the other, is disposed over the entire width of the thin-film solar cell array.

Likewise, it is possible to design the overlapping region for series connection of the individual solar cells of a respective pair of thin-film solar cells between a wide ratio which is for example between 0.4 to 0.6 times. This is of advantage in particular if the length of the respective thin-film solar cells is in ranges in which tolerance errors of the length of these thin-film solar cells is useful or the length of such thin-film solar cells is in ranges of the minimum possible structural dimensions.

The connection of the individual regions of the respective thin-film solar cells of a pair of two thin-film solar cells is effected in the overlapping region (B), thereby preferably by direct connection of the second electrode and/or of the conversion layer ($3^I_n$, $3^{II}_n$, . . . ) of the respectively first thin-film solar cell (I, II . . . ) to a rear-side electrode ($1^{II}_{n+1}$, $1^{III}_{n+1}$, . . . ) of the respectively second thin-film solar cell (II, III, . . . ) of the pair of respectively first and respectively second thin-film solar cell (I-II, II-III).

It can likewise be provided that the connection is produced by an electrically conducting bond of the second electrode and/or of the conversion layer ($3^I_n$, $3^{II}_n$, . . . ) of the respectively first thin-film solar cell (I, II, . . . ) to a rear-side electrode ($1^{II}_{n+1}$, $1^{III}_{n+1}$, . . . ) of the respectively second thin-film solar cell (II, III, . . . ) of the pair of respectively first and respectively second thin-film solar cell (I-II, II-III, . . . ) by means of an electrically conductive adhesive layer (K').

A further likewise preferred possibility provides that the connection of the respective solar cells in the overlapping region is produced by an electrically insulating bond of the second electrode and/or of the conversion layer ($3^I_n$, $3^{II}_n$, . . . ) of the respectively first thin-film solar cell (I, II, . . . ) to a rear-side electrode ($1^{II}_{n+1}$, $1^{III}_{n+1}$, . . . ) of the respectively second thin-film solar cell (II, III, . . . ) of the pair of respectively first and respectively second thin-film solar cell (I-II, II-III, . . . ) by means of an electrically insulating adhesive layer (K), the electrical contacting of the second electrode and/or of the conversion layer ($3^I_n$, $3^{II}_n$, . . . ) of the respectively first thin-film solar cell (I, II, . . . ) to the rear-side electrode ($1^{II}_{n+1}$, $1^{III}_{n+1}$, . . . ) of the respectively second thin-film solar cell (II, III, . . . ) being produced by an electrically conducting connection (7).

In the transition region (A), the respectively first thin-film solar cell (I, II, . . . ) of the pair of respectively first and respectively second thin-film solar cell (I-II, II-III, . . . ) can be connected monolithically to the respectively second thin-film solar cell (II, III, . . . ). According to this embodiment, in the transition region (A), a parallel connection of the region, disposed in a layer (n+1), of the second thin-film solar cell of the pair of first and second thin-film solar cell takes place to the region, disposed on the layer (n) situated further down, of the second thin-film solar cell of the pair of first and second thin-film solar cell. This embodiment can be produced for example by the respective layers of this second thin-film solar cell, situated one above the other, being converted from a higher situated layer (n+1) into the lower situated layer (n).

It is likewise preferred that, in the transition region (A), the rear-side electrode ($1^I$, $1^{II}$, . . . ), the photoactive layer ($2^I$, $2^{II}$, . . . ) and the second electrode and/or the conversion layer ($3^I$, $3^{II}$, . . . ) of the respectively first thin-film solar cell (I, II, . . . ) of the pair of respectively first and respectively second thin-film solar cell (I-II, II-III, . . . ) are terminated and insulated electrically from the second thin-film solar cell (II, III, . . . ), the termination being achieved preferably by an electrical insulator (4). According to this embodiment, termination of the respective layers of the first solar cell of the pair of first and second solar cell is present in order to prevent for example an electrical short circuit of the active layers of the first thin-film solar cell and/or possible short circuits of the solar cells between each other (e.g. short circuit between the rear-side electrodes $1^I_n$ and $1^{II}_{n+1}$).

A further advantageous embodiment provides that, in the transition region (A), the rear-side electrode ($1^{II}$, $1^{III}$, . . . ), the photoactive layer ($2^{II}$, $2^{III}$, . . . ) and the second electrode and/or the conversion layer ($3^{II}$, $3^{III}$, . . . ) of the respectively second thin-film solar cell (II, III, . . . ) of the pair of respectively first and respectively second thin-film solar cell (I-II, II-III, . . . ) are converted in an S-shape or linearly into the first layer (n, . . . ) at least in regions perpendicularly to the substrate (S).

The connection of the individual thin-film solar cells of the thin-film solar cell array is thereby effected preferably such that the individual solar cells, in the lowermost layer (n) which is connected to the substrate (S), and the respective rear-side electrodes of the individual thin-film solar cells are connected over the entire surface to the substrate. In addition, it is likewise possible that, also in the transition region (A), the respective layers of the respective second thin-film solar cell of one pair of first and second thin-film solar cell are connected.

The mentioned connection can thereby be produced by direct deposition (e.g. lamination) of the rear-side electrode ($1^I$, $1^I_n$, $1^{II}_n$, $1^{III}_n$, . . . ) on the substrate (S) by an electrically conductive adhesive layer (K') or an electrically insulating adhesive layer (K).

In particular, the thin-film solar cells of the thin-film solar cell array are respectively inorganic or organic thin-film solar cells.

Furthermore, it is preferred if the layer thicknesses, respectively independently of each other, of the rear-side electrode ($1^I$, $1^{II}$, $1^{III}$, . . . ) are between 1 nm and 5 μm, preferably between 5 nm and 1 µm, particularly preferred between 10 nm and 200 nm, of the second electrode and/or of the conversion layer ($3^I, 3^{II}, 3^{III}, \ldots$) between 1 nm and 5 µm, preferably between 5 nm and 1 µm, particularly preferred between 10 nm and 200 nm, and/or of the photoactive layer ($2^I, 2^{II}, 2^{III}, \ldots$) between 1 nm and 5 µm, preferably between 5 nm and 1 µm, particularly preferred between 10 nm and 200 nm.

In addition it is advantageous if, independently of each other, the rear-side electrode ($1^I, 1^{II}, 1^{III}, \ldots$) and/or the second electrode and/or the conversion layer ($3^I, 3^{II}, 3^{III}, \ldots$) is formed from metals (e.g. Al, Ag, Cu), metal nanostructures, metal oxides (e.g. ZnO, $TiO_2$, $MoO_3$, $V_2O_5$), doped semiconductors with a high band gap (indium-tin oxide, Al:ZnO), conductive polymers, such as polyaniline or poly(ethylenedioxythiophene):polystyrene sulphonic acid) or combinations hereof, and/or the photoactive layer ($2^I, 2^{II}, 2^{III}, \ldots$) from inorganic semiconductors, such as for example Si, a-Si:H, CuZnSnS, CuZnSnSe, GaAs, CuInS, CuInSe, CuInGeS, CuInGeSe, Ge, CdTe, metal oxides, such as $TiO_2$, ZnO, or organic semiconductors, such as for example poly(3-hexylthiophene), metal phthalocyanines, dicyanovinyl (DCV)-substituted quaterthiophenes, fullerene derivatives or hybrid semiconductors, such as perovskites, for example $CH_3NH_3PbI_3$ and nanoparticles of the various materials and also combinations hereof or comprises such materials.

The production of the structure according to the invention can be effected by various deposition methods, both from the vapour phase by means of physical and chemical vapour phase deposition and from the liquid phase by means of film-casting, spray-coating, knife-coating, and also printing methods, such as rotogravure, offset printing, screen printing or inkjet printing. For example, the deposition of the at least one rear-side electrode ($1^I, 1^{II}, 1^{III}, \ldots$), of the photoactive layer ($2^I, 2^{II}, 2^{III}, \ldots$) and also of the second electrode and/or conversion layer ($3^I, 3^{II}, 3^{III}, \ldots$) can be effected by deposition of liquid precursor materials which, in a subsequent step are hardened and/or dried to form the respective rear-side electrode ($1^I, 1^{II}, 1^{III}, \ldots$), the photoactive layer ($2^I, 2^{II}, 2^{III}, \ldots$) and also the second electrode and/or conversion layer ($3^I, 3^{II}, 3^{III}, \ldots$).

Such precursor materials are thereby preferably liquid materials so that deposition for example by means of film casting, spray-coating and/or printing methods, such as rotogravure, offset printing, screen printing or inkjet printing, can be effected.

Preferred precursor materials or coating materials/media for the production of the individual layers are thereby, for the a) rear-side electrode and/or conversion layer ($1^I, 1^{II}, 1^{III}, \ldots$) and/or the second electrode and/or conversion layer ($3^I, 3^{II}, 3^{III}, \ldots$), solutions, emulsions or suspensions of poly(ethylenedioxythiophene):poly(styrene sulphonic acid) in water and solvents, such as isopropanol, ethanol and others, ZnO nanoparticles in chloroform or acetone from zinc acetate dihydrate, ZnO nanoparticles in chloroform from diethylzinc, zinc acetylacetonate hydrate in ethanol, titanium isopropoxide in alcohol (methanol, isopropanol, ethanol), $TiO_x$-NPs from titanium (IV) isopropoxide in isopropanol, $MoO_3$NPs from ammonium molybdate in aqueous solution, molybdenum-(V)-isopropoxide in butanol, molybdenum tricarbonyltrispropionitrile in acetonitrile, bis(2,4-pentanedionato)molybdenum dioxide in isopropanol, $V_2O_5$NPs in isopropanol, vanadium(V) oxiisopropoxide in isopropanol, aluminium-doped zinc oxide from zinc acetate and aluminium hydroxite acetate in ethanol and monoethanolamine, and/or b) the photoactive layer ($2^I, 2^{II}, 2^{III}, \ldots$), solutions, suspensions, emulsions of inorganic semiconductors, such as for example Si, a-Si:H, CuZnSnS, CuZnSnSe, GaAs, CuInS, CuInSe, CuInGeS, CuInGeSe, Ge, CdTe, metal oxides, such as $TiO_2$, ZnO, or organic semiconductors such as for example poly(3-hexylthiophene), metal phthalocyanines, dicyanovinyl (DCV)-substituted quaterthiophenes, fullerene derivatives and nanoparticles of the various materials and also combinations hereof and/or semiconducting polymers and fullerene derivatives and/or inorganic metal- or semiconductor nanoparticles (Au, Ag, Al, $Al_2O_3$, ZnO, $TiO_2$, $MoO_3$, $V_2O_5$, CdS, CdSe, PbS, PbSe, CuInS, CuInSe, CuInGeS, CuInGeSe, CuZnSnS, CuZnSnSe) and/or hybrid semiconductors, such as perovskites, for example $CH_3NH_3PbI_3$ or precursors of organic and inorganic semiconductors in solvents, such as chlorobenzene, dichlorobenzene, xylene, toluene, alcohols, water and mixtures hereof.

A first preferred variant of the method according to the invention provides that, in a first layer (n, ...), at least two partial thin-film solar cells ($I_n, II_n, \ldots$), which comprise respectively at least one first rear-side electrode orientated towards the substrate (S), a second electrode and/or a conversion layer and also a photoactive layer disposed between the rear-side electrode and the second electrode and/or the conversion layer, are premanufactured and also at least one further partial thin-film solar cell ($II_{n+1}, III_{n+1}, \ldots$), which comprises respectively at least one first rear-side electrode, which is orientated towards the substrate (S), and a second electrode and/or a conversion layer and also a photoactive layer disposed between the rear-side electrode and the second electrode and/or the conversion layer, are deposited in a second layer (n+1) offset on the at least two partial thin-film solar cells ($I_n, II_n, \ldots$) disposed in the first layer (n, ...), at least one overlapping region (B) being configured between at least one partial thin-film solar cell ($I_n$) disposed in the first layer and one partial thin-film solar cell ($II_{n+1}$) deposited in a second layer and also at least one transition region (A) by contacting the rear-side electrode, the photoactive layer and also the second electrode and/or the conversion layer of the partial thin-film solar cell ($II_{n+1}$) deposited in the second layer (n+1), with the rear-side electrode, the photoactive layer and also the second electrode and/or the conversion layer of the partial thin-film solar cell ($II_n$) disposed in the first layer (n).

This variant according to the invention provides that firstly the lowermost layer (n) of the substrate is coated with partial thin-film solar cells which are disposed situated adjacently in x-direction, for example by successive deposition on the substrate of the functional layers which form the respective partial thin-film solar cells. In a subsequent step, further partial thin-film solar cells are deposited in a layer (n+1) situated above the first layer (n), the functional layers of these partial thin-film solar cells being offset and deposited with a suitable overlap relative to the functional layers of the partial thin-film solar cells configured in the first layer (n). By means of deposition or lamination, the overlapping region (B) and the transition region (A) are produced, in which respectively two partial thin-film solar cells are connected in parallel to a thin-film solar cell contained in the thin-film solar cell array according to the invention. As a result of the choice according to the invention of the spatial arrangement of the individual functional layers, a series connection of the partial solar cells is produced in the overlapping regions (B) and, in the transition regions (A), a parallel connection or wiring of the partial solar cells from layer n+1 and layer n.

In the case of the previously presented method process, it is particularly advantageous if the respective components of an individual partial thin-film solar cell, i.e. first electrode, photoactive layer, second electrode and/or conversion layer for partial thin-film solar cells present respectively in one layer, are deposited simultaneously. This means that for the plurality of partial thin-film solar cells disposed in one layer n, firstly the first electrode (in the case where the layer n represents the lowermost layer of the thin-film solar cell array) the electrode is then deposited directly on the substrate) is produced, the photoactive layer is deposited hereon and the second electrode thereon. The respective layers are hence deposited successively for one respectively individual partial thin-film solar cell, but simultaneously and at the same time for the large number of partial thin-film solar cells which are disposed in one respective layer.

The individual active layers (i.e. first electrode, photoactive layer, second electrode and conversion layer) are thereby preferably deposited offset relative to each other. For example an overlap is hereby produced between first electrode and photoactive layer. Whilst for example the first electrode is not covered entirely by the photoactive layer, on the one side of the partial thin-film solar cell, the photoactive layer protrudes beyond the first electrode on the other side and comes to lie there on the common lower layer of first electrode and photoactive layer. In the same way, the second electrode or in place thereof and/or in addition the conversion layer can be deposited. In particular the second electrode and/or the conversion layer is thereby deposited such that it is contacted with the first electrode of the adjacent partial thin-film solar cell so that the two partial thin-film solar cells are connected in series.

Likewise, it is possible to deposit and/or to structure the respective components of the individual partial thin-film solar cells overlapping merely on one side, i.e. to choose the first electrode to be longer than the photoactive layer and this in turn longer than the second electrode, so that all of the components of the respective partial thin-film solar cell end at one side with a sharp edge. In this case, it is preferred to undertake termination of the previously mentioned layers, i.e. first electrode, photoactive layer and second electrode, for example an insulating material can be deposited for this purpose over the common edge of these three layers so that short circuits of the layers amongst each other, in particular between the first electrode of the first partial solar cell and the first electrode of the second solar cell of one pair can be avoided. In this case, after deposition of the termination, a further conversion layer which is likewise electrically conducting can be deposited in addition on the composite, this conversion layer is thereby guided such that, on the one hand, the second electrode of a first partial thin-film solar cell applied in a layer n is contacted and is guided towards a first electrode of an adjacent partial thin-film solar cell likewise applied in a layer n. Also as a result, the series connection of the two partial thin-film solar cells in one layer n is ensured. A series connection is likewise possible with the first electrode of the further partial thin-film solar cell of the next layer (n+1).

Over the produced composite of partial thin-film solar cells in a first layer n, now, subsequently by offset application of further first electrodes, photoactive layers, second electrodes and/or conversion layers (and also if necessary further terminations), a further dimension of the thin-film solar cell composite is constructed, then the individual thin-film solar cells and also the transition regions A and overlapping regions B being configured.

It is hereby advantageous that the deposition and/or premanufacture of the thin-film solar cells, partial thin-film solar cells and/or of the first rear-side electrodes orientated towards the substrate (S), of the second electrodes and/or conversion layers and also of the photoactive layer of the thin-film solar cells and/or partial thin-film solar cells is effected from the vapour phase or from the liquid phase, in particular by aerosol printing, vacuum deposition, inkjet printing, film casting and/or adhesion processes.

In this method variant, it is hence preferred if, during premanufacture or deposition of the at least two partial thin-film solar cells ($I_n$, $II_n$, ...) and/or of the at least one further partial thin-film solar cell ($II_{n+1}$, $III_{n+1}$, ...), the at least one first rear-side electrode, which is orientated towards the substrate (S), and the second electrode and/or the conversion layer and also the photoactive layer, disposed between the rear-side electrode and the second electrode and/or the conversion layer, for each partial thin-film solar cell ($I_n$, $II_n$, ... or $III_{n+1}$, ...) are deposited successively and, for the respective partial thin-film solar cells ($I_n$, $II_n$, ... or $II_{n+1}$, $III_{n+1}$, ...), simultaneously.

In addition, it is preferred if, after deposition of the first rear-side electrode, which is orientated towards the substrate (S), of the photoactive layer and also of the second electrode of a respective partial thin-film solar cell ($I_n$, $II_n$, ...) in the first layer (n, ...), the first rear-side electrode, which is orientated towards the substrate (S), and the photoactive layer and/or the second electrode of the respective partial thin-film solar cell ($I_n$, $II_n$, ...) is terminated, in particular by deposition of an electrical insulator (4), and subsequently a conversion layer is deposited for electrical contacting of the second electrode of a first partial thin-film solar cell ($I_n$, ...) with the first electrode of an adjacent second partial thin-film solar cell ($II_n$, ...) and for formation of an overlapping region (A).

A particular variant of this method process provides that the deposition, effected simultaneously or successively, of the at least one first rear-side electrode ($1^I$, $1^{II}$, $1^{III}$, ...), of the photoactive layer ($2^I$, $2^{II}$, $2^{III}$, ...) disposed above and also of the second electrode and/or conversion layer ($3^I$, $3^{II}$, $3^{III}$, ...) disposed above is effected by film casting in which the precursor materials are cast and/or pressed by means of a casting head (G') which has a plurality of casting slots (a, b, ...) onto the substrate (S), the casting slots (a, b, ...) respectively being subdivided into a plurality of compartments (a2, a2, a3, a4, ...; b1, b2, b3, b4, b5, b6, b7, ...), through which respectively the precursor materials of the respective rear-side electrode ($1^I$, $1^{II}$, $1^{III}$, ...), the photoactive layer ($2^I$, $2^{II}$, $2^{III}$, ...) and also the second electrode and/or conversion layer ($3^I$, $3^{II}$, $3^{III}$, ...) of the individual thin-film solar cells (I, II, III, ...) are cast and/or pressed, the compartments (a2, a2, a3, a4, ...; b1, b2, b3, b4, b5, b6, b7, ...) being disposed relative to each other such that the rear-side electrode ($1^I$, $1^{II}$, $1^{III}$, ...), the photoactive layer ($2^I$, $2^{II}$, $2^{III}$, ...) and also the second electrode and/or conversion layer ($3^I$, $3^{II}$, $3^{III}$, ...) of a respective individual thin-film solar cell (I, II, III, ...) being cast situated one above the other at least in regions and, for respectively one pair (I-II, II-III, ...) of first (I, II, ...) and second thin-film solar cell (II, III, ...), the respective rear-side electrode ($1^I$, $1^{II}$, $1^{III}$, ...), the photoactive layer ($2^I$, $2^{II}$, $2^{III}$, ...) and also the second electrode and/or conversion layer ($3^I$, $3^{II}$, $3^{III}$, ...) being cast offset relative to each other so that an overlapping region (B) and a transition region (A) are produced.

This preferred variant is based for example on a film-casting method which likewise uses a casting head which has a plurality of slots for discharging the precursor materials of the respective layers of the respective solar cells. In contrast to the above-mentioned film-casting method, the casting slots of this casting head are however not configured continuously over the entire width of the respective layers of the individual thin-film solar cells but subdivided into individual compartments which are separate from each other. Such a subdivision can be effected for example by means of a baffle plate etc. By means of the individual compartments, different precursor materials for the individual layers, i.e. for example precursor materials for the rear-side electrode, the photoactive layer or the second electrode and/or conversion layer, can be discharged so that a corresponding layer structure of the respectively produced thin-film solar cells can consequently be produced. The geometry of the compartments and of the casting slots of this modified casting head thereby corresponds in fact to the corresponding geometry of the deposited layers of the respective thin-film solar cells. With this method, a complete thin-film solar cell array according to the present invention can be produced in a single step.

By providing the respective compartments of the casting head with correspondingly different precursor solutions, different partial thin-film solar cells can hence be deposited likewise in one layer n, hence the partial thin-film solar cells and hence, in addition, the thin-film solar cell array are produced by iterative application of further layers.

A second preferred variant of the method according to the invention provides that the deposition, effected simultaneously or successively, of the at least one first rear-side electrode ($1^I$, $1^{II}$, $1^{III}$, . . . ), of the photoactive layer ($2^I$, $2^{II}$, $2^{III}$, . . . ) disposed above and also of the second electrode and/or conversion layer ($3^I$, $3^{II}$, $3^{III}$, . . . ) disposed above is effected by film casting, in which the precursor materials are cast and/or pressed onto the substrate (S) by means of a casting head (G) which has a plurality of casting slots ($X^I_1$, $X^I_2$, $X^I_3$, $X^{II}_1$, $X^{II}_2$, $X^{II}_3$, $X^{III}_1$, $X^{III}_2$, $X^{III}_3$, . . . ), the casting slots ($X^I_1$, $X^I_2$, $X^I_3$, $X^{II}_1$, $X^{II}_2$, $X^{II}_3$, $X^{III}_1$, $X^{III}_2$, $X^{III}_3$, . . . ), respectively of one rear-side electrode ($1^I$, $1^{II}$, $1^{III}$, . . . ), of a photoactive layer ($2^I$, $2^{II}$, $2^{III}$, . . . ) and also of a second electrode and/or conversion layer ($3^I$, $3^{II}$, $3^{III}$, . . . ) being assigned to a respective thin-film solar cell (I, II, III, . . . ), being configured continuously over the entire width of the respective rear-side electrode ($1^I$, $1^{II}$, $1^{III}$, . . . ), of the photoactive layer ($2^I$, $2^{II}$, $2^{III}$, . . . ) and also of the second electrode and/or conversion layer ($3^I$, $3^{II}$, $3^{III}$, . . . ) of the respective thin-film solar cell (I, II, III, . . . ) and being disposed such in the casting head (G) that the rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) of a respective individual thin-film solar cell (I, II, III, . . . ) are cast one above the other at least in regions and, for respectively one pair (I-II, II-III, . . . ) of first (I, II, . . . ) and second thin-film solar cell (II, III, . . . ), the respective rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) being cast offset relative to each other so that an overlapping region (B) and a transition region (A) are produced.

With this preferred variant, a film of the respective precursor materials is cast onto a substrate by means of a casting head which has a plurality of casting slots. The casting slots are thereby disposed such that the individual active layers of each thin-film solar cell are deposited on the substrate situated one above the other, as a result of which the respective thin-film solar cell is configured. This can be effected for example by the respective number of casting slots which corresponds to the number of layers for one solar cell being disposed in the casting head situated one above the other, for example a pair of three casting heads for the precursor materials for the rear-side electrode, the photoactive layer and also the second electrode and/or conversion layer of a respective thin-film solar cell. The respective casting slots for a further, second thin-film solar cell are disposed offset relative to the casting slots for the first thin-film solar cell so that these layers overlap partially with the layers of the first thin-film solar cell. Within this overlap, the overlapping region of a respective pair of first and second thin-film solar cell is hence produced. In addition, the casting slots are disposed such that a region is produced in which merely the layers of the second thin-film solar cell of a pair of first and second thin-film solar cell are deposited so that the consequently discharged films for the respective active layers of one thin-film solar cell are deposited protruding over the end of the layers of the respectively first thin-film solar cell of a pair of first and second thin-film solar cell. As a result of this protrusion, the film composite of the active layers of the second thin-film solar cells of the pair is deposited on a plane situated below, as a result of which the transition region (A) is produced. By means of correspondingly iterative arrangement of the respective casting slots for the individual thin-film solar cells, the thin-film solar cell array according to the invention can hence be produced.

A third preferred variant of the method according to the invention provides that the deposition, effected simultaneously or successively, of the at least one first rear-side electrode ($1^I$, $1^{II}$, $1^{III}$, . . . ), of the photoactive layer ($2^I$, $2^{II}$, $2^{III}$, . . . ) disposed above and also of the second electrode and/or conversion layer ($3^I$, $3^{II}$, $3^{III}$, . . . ) disposed above is effected by inkjet- and/or aerosol printing on the substrate (S), the rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) of one respective individual thin-film solar cell (I, II, III, . . . ) being printed situated one above the other at least in regions and, for respectively one pair (I-II, II-III, . . . ) of first (I, II, . . . ) and second thin-film solar cell (II, III, . . . ), the respective rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) being printed offset relative to each so that an overlapping region (B) and a transition region (A) are produced.

According to this preferred embodiment, the individual layers of one respective thin-film solar cell can be deposited by means of inkjet- and/or aerosol printing of the respective precursor materials on the substrate. The active layers of the individual solar cells can thereby be deposited by means of a corresponding inkjet- or aerosol printing tool, for example an application device. It is thereby possible that the application device has merely one printing head so that the individual layers must be produced in succession. Likewise, it is possible that for example all of the layers of one individual solar cell are produced simultaneously by one respective application head so that a respective single solar cell can be deposited on the substrate in one step. In addition, it is possible that, even for the plurality of thin-film solar cells, respectively a number of application heads corresponding to the active layers is present so that, in one step, a plurality of thin-film solar cells according to the thin-film solar cell array according to the invention can be deposited.

A fourth variant according to the invention for the production of a thin-film solar cell array according to the invention provides that, on the substrate (S), a plurality of thin-film solar cells, which comprise respectively at least one first rear-side electrode, which is orientated towards the substrate (S), and a second electrode and/or a conversion layer and also a photoactive layer disposed between the rear-side electrode and the second electrode and/or the conversion layer, are deposited or laminated-on in succession partially overlapping.

In the case of this method according to the invention, respectively premanufactured thin-film solar cells are laminated partially overlapping one above the other, the overlapping region (B) results in the overlapping region, in the non-overlapping region, a thin-film solar cell is deposited or laminated on the layer situated below, the transition region (A) resulting.

In the case of both previously mentioned described variants of the method according to the invention, it is preferred if a method according to one of the two preceding claims is used, characterised in that the deposited or laminated-on partial thin-film solar cells or the thin-film solar cells are mounted on a temporary carrier (T) which is preferably a plastic material film before the deposition or lamination and is removed after the deposition or lamination.

In addition, it can be provided in the case of the two previously described variants that the partial thin-film solar cells or the thin-film solar cells are deposited or laminated-on via an insulating adhesive layer (K) or conductive adhesive layer (K').

The present invention was explained in more detail with reference to the subsequently described Figures without restricting the invention however to the illustrated special variants and parameters.

FIG. sequence 8A-8F: a preferred embodiment of a method according to the invention for the production of a thin-film solar cell array, the openings can be produced by direct structured deposition or large-area deposition with subsequent selective or partially selective removal and also combinations hereof.

Figure 8:
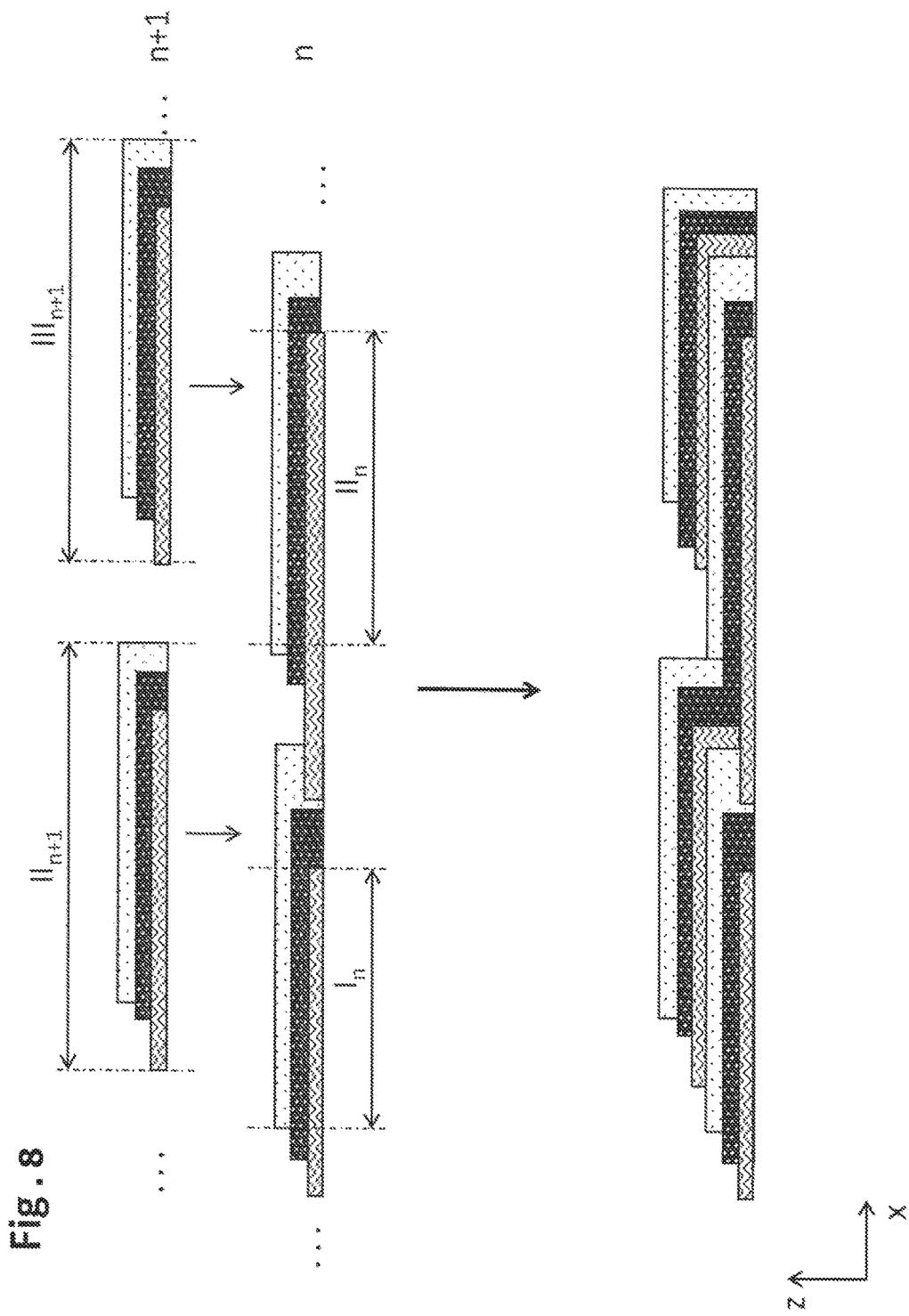
Figure 11:
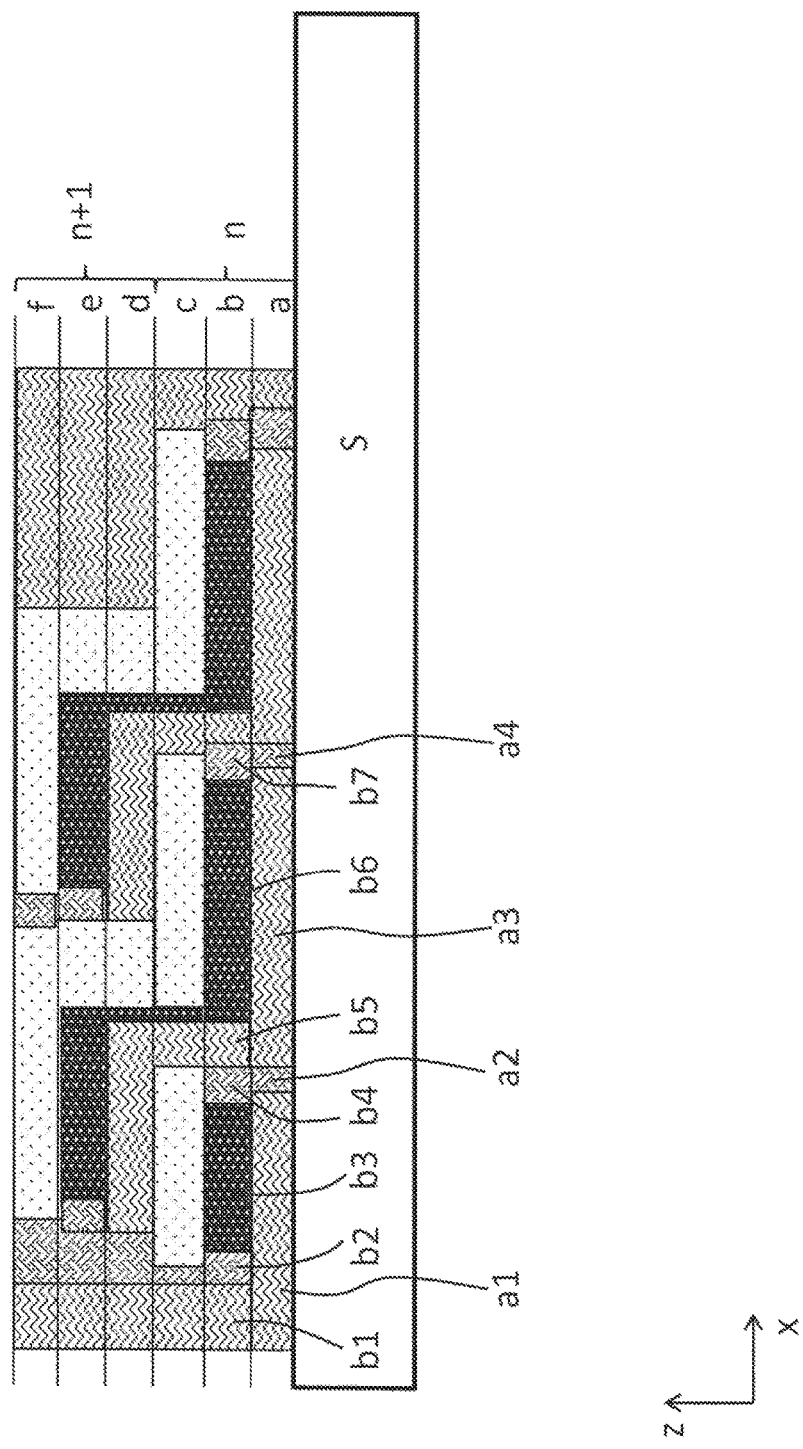

FIG. sequence 9: a variant of the method illustrated in FIG. 8,

FIG. sequence 9A-9G: a variant of the method illustrated in FIG. 8,

FIG. 10: a casting head for the production of a thin-film solar cell array according to the invention, FIG. 11: a thin-film solar cell array which can be produced by means of a method which makes use of a casting head illustrated in FIG. 10, FIG. 12: a first method variant for the production of a thin-film solar cell array according to the invention by means of film casting, FIG. 13: a variant of a method according to the invention illustrated in FIG. 12, FIG. 14: a method according to the invention for the production of the thin-film solar cell array by means of inkjet- or aerosol printing, FIG. 15: a further thin-film solar cell array which can be produced with the method according to the invention, FIG. 16: a further preferred embodiment of the method according to the invention in which lamination of the respective solar cells is effected, FIG. 17: a variant of the method illustrated in FIG. 16, FIG. 18: a further embodiment of a method according to the invention by means of lamination of various solar cells, and also FIG. 19: a variant of the method illustrated in FIG. 18.

DETAILED DESCRIPTION OF THE INVENTION

Figure 1:
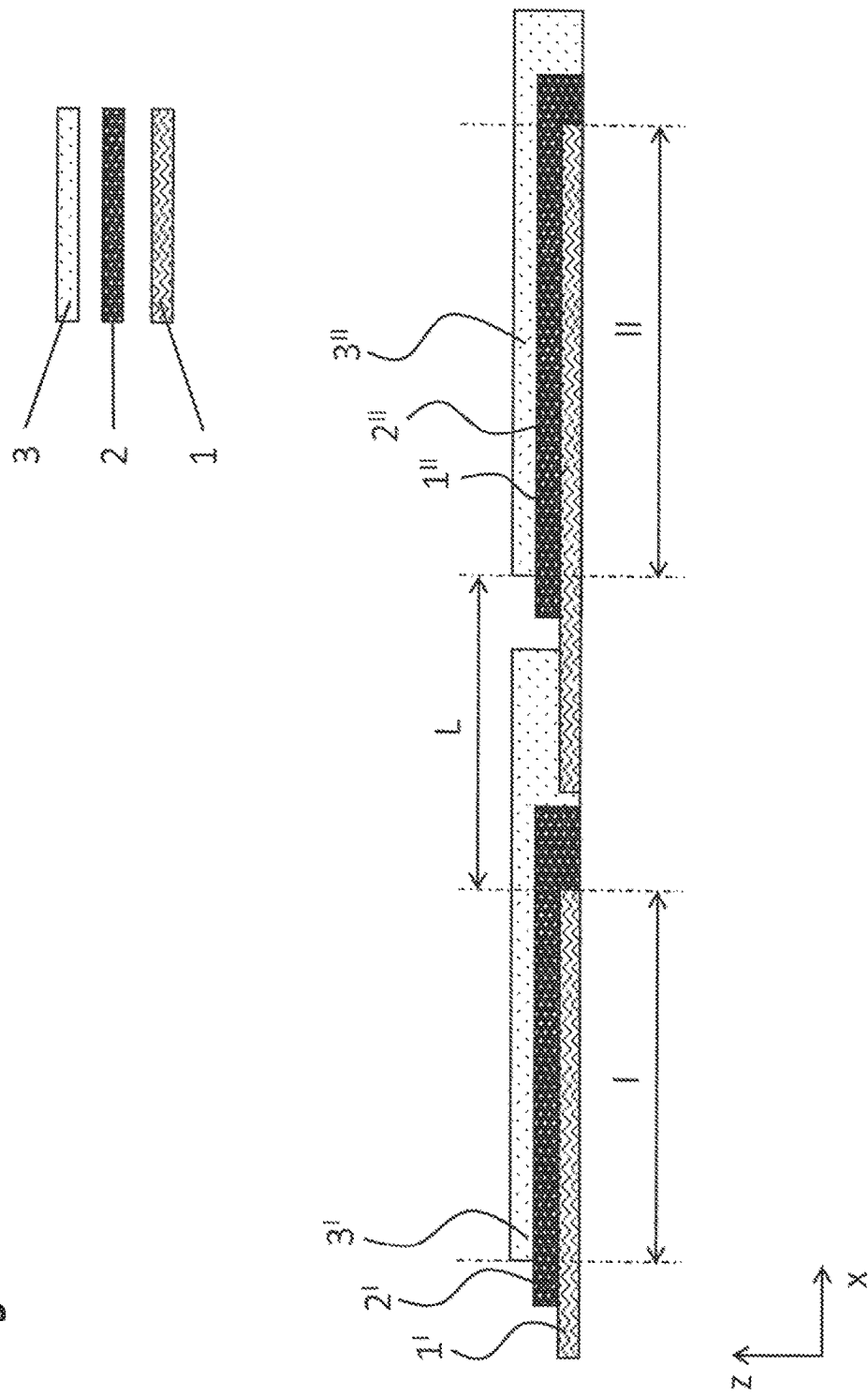
FIG. 1: a normal monolithic series connection of two thin-film solar cells, deposited adjacently, according to the state of the art.

FIG. 1 shows a thin-film solar cell array which was already described at the beginning as is known from the state of the art. In FIG. 1, two individual solar cells (I, II) are thereby deposited adjacently in x-direction on a substrate, not illustrated. The solar cells (I, II) are thereby formed respectively by a rear-side electrode (1), a photoactive layer (2) and also an electrode (3) applied at the top. The colour design of the active layers (1, 2, 3) is also chosen to be the same in the following Figures so that the corresponding layers can also be identified via the colour design of the respective layers without the corresponding reference numbers. The individual active layers (1, 2, 3) are thereby deposited in z-direction one above the other, the connection to the substrate, not illustrated, is effected on the side on which the rear-side electrodes 1 are applied. A corresponding deposition or application on the substrate of the respective solar cells (I, II) is thereby direct but also possible via insulating or conducting adhesive compounds. The respective layers of a respective solar cell are thereby annotated for characterisation with the number of the respective solar cell so that the rear-side electrode (1) of the first solar cell (I) is indicated with 1' etc. In the case of an array of solar cells known from the state of the art, only that region in which all of the active layers of a solar cell (I, II, II) are present simultaneously can be used for current production. The region (L) used for the monolithic connection of the solar cells (I, II) hence does not serve for current production so that this region impairs the efficiency of such a thin-film solar cell array. In y-direction, the length of the respective active layers (1, 2, 3) of the respective thin-film solar cells can be chosen arbitrarily, this embodiment also applies for all of the thin-film solar cell arrays according to the invention which are in particular subsequently illustrated.

Figure 2:
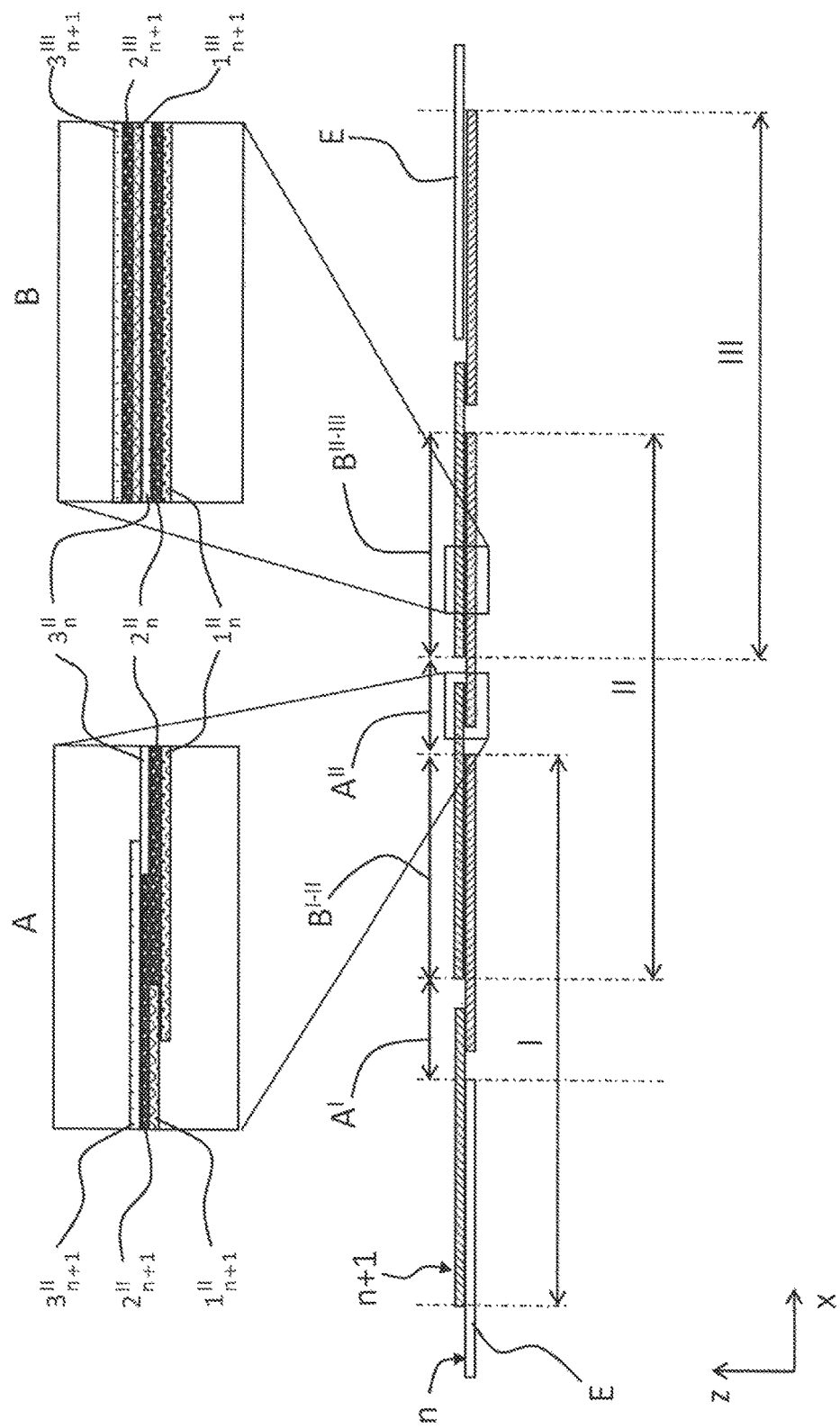
FIG. 2: a first thin-film solar cell array which can be produced with the method according to the invention.

FIG. 2 showed a first embodiment of a thin-film solar cell array produced with the method according to the invention, which array is formed from a plurality of individual thin-film solar cells (I, II, III). Each of the illustrated solar cells (I, II, III) is thereby configured both in a first layer (n) and also in a layer (n+1) situated above. The layer (n) can be deposited directly or by means of an insulating or conductive adhesive layer on a substrate (S), not illustrated. Each of the solar cells (I, II, III) thereby has a rear-side electrode (1), a photoactive layer (2) and also a second electrode and/or conversion layer (3). The respective active layers (1, 2, 3) of the respective thin-film solar cells are thereby assigned in FIG. 2 (and also in all further Figures) to the respective solar cell and to the respective layer. For example, the rear-side electrode (1) of the second solar cell (II), which is present in the second layer (n+1), is designated with $1^{II}_{n+1}$. The rear-side electrode (1) present in the first layer (n) of the second solar cell (II) is, in contrast, designated with $1^{II}_{n}$. Via the chosen nomenclature, an unequivocal assignment of the respective regions of the active layers relative to the individual solar cells and also the layers in which the solar cells are configured can be undertaken. The respective solar cells are thereby connected in pairs electrically in series, in FIG. 2 for example the solar cell (I) with the solar cell (II) forms a series-connected pair of thin-film solar cells, likewise the illustrated solar cell (II) with the solar cell (III) forms a series-connected pair of solar cells. The series connection is thereby effected in an overlapping region (B) which is indicated explicitly in FIG. 2 for the two pairs of solar cells (I-II) and (II-III) which are present with $B^{I-II}$ or $B^{II-III}$. In the enlarged section illustrated in FIG. 2 at the top on the right of this series connection designated overlapping region B, the individual layers of the respective solar cells (II, III) are illustrated. The series connection is effected by electrical contacting in the second electrode and/or conversion layer $3^{II}_{n}$ of the second solar cell (II) with the rear-side electrode $1^{III}_{n+1}$ of the third solar cell (III). The respective individual solar cells (I, II, III) thereby have respectively a transition region (A) which is illustrated explicitly in FIG. 2 for the first solar cell (I) as transition region ($A^{I}$) and also for the second solar cell (II) as transition region ($A^{II}$). In FIG. 2 on the left at the top, an enlarged section of a transition region (A) is illustrated. It is detectable that the individual active layers of the respective solar cell (in the case of the example for the solar cell (II)) are converted from the second layer (n+1) into the first layer (n). A parallel connection of the individual active layers hereby takes place. The arrangement according to the invention of the individual solar cells (I, II, III) hence provides that the solar cells are configured to be overlapping in regions in an overlapping region (B), likewise transition regions (A) are present, in which respectively only one solar cell is guided from a second layer (n+1) into a first layer (n). Over the entire width (in x-direction) of the thin-film solar cell array, at least one continuously configured thin-film solar cell is hence present at every position, hence the entire thin-film solar cell array according to the invention, illustrated in FIG. 2, can be used in its entire width (i.e. in x-direction) for current production. The current produced by the series-connected thin-film solar cell array can be tapped for example by means of two electrodes (E) of the respective rear-side electrode (1) of the first solar cell (I) or of the second electrode or conversion layer (3) of the third solar cell (III).

The respective conversion of the individual active layers (1, 2, 3) from a higher layer (n+1) to a layer (n) situated below is effected, according to the example of FIG. 2, by respective offset arrangement of the individual active layers in the respective layers (n) or (n+1). As is evident from the enlarged section of the overlapping region (A) of FIG. 2, the active layers (1, 2, 3) of the second solar cell (II) in the layer (n+1) situated above are configured in steps, in which for example respectively the photoactive layer (2) which is deposited on the rear-side electrode or the second electrode and/or conversion layer (3), which is deposited in z-direction on the photoactive layer (2), the respective layers situated below protrude in x-direction. As a result of a mirror-inverted arrangement of the same layers in the layer situated below, contacting by layering the respective active layers (1, 2, 3) one above the other is hence possible.

Figure 3:
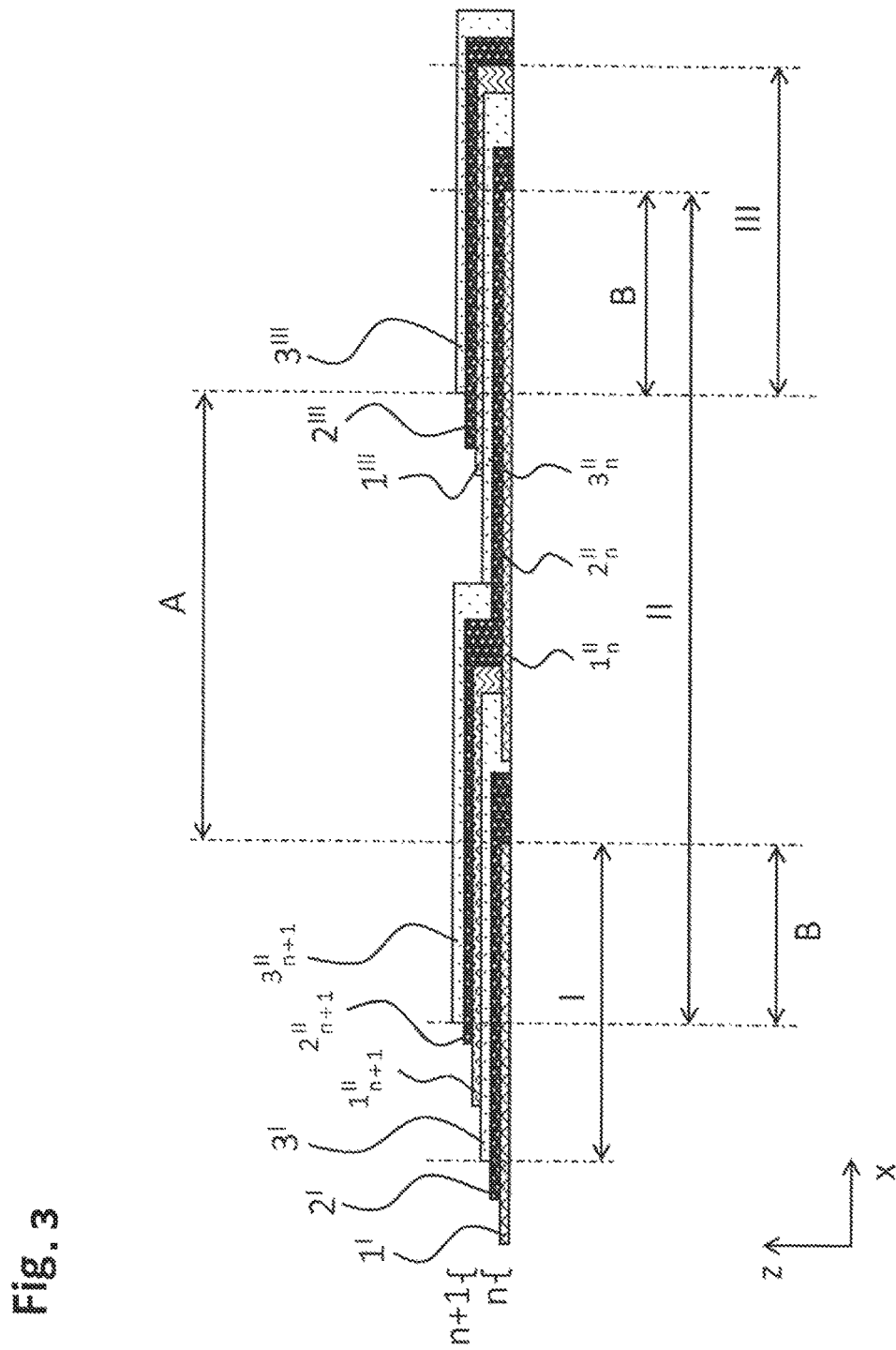
FIG. 3: a second thin-film solar cell array with monolithic connection in the transition region (A) which can be produced with the method according to the invention.

FIG. 3 shows an alternative embodiment of a thin-film solar cell array produced with the method according to the invention. As already in FIG. 2, the respectively illustrated thin-film solar cells (I, II, III) thereby consist of the corresponding active layers (1, 2, 3). In the embodiment illustrated in FIG. 3, the solar cell (II) has a transition region (A) in which the respective layers of this second solar cell (II) are converted from a layer (n+1), situated above, into a lower layer (n). In the overlapping regions (B), respectively two solar cells are configured in pairs, i.e. in the overlapping region illustrated on the left in FIG. 3, a pair of the thin-film solar cell (I) with (II) and also in the right-hand overlapping region of solar cell (II) and solar cell (III). The conversion of the active layers of the thin-film solar cell (II) in the transition region (A) is thereby effected by guiding the respective layers in z-direction. Here also, the respective active layers (1, 2, 3) of the layer (n), situated below, of the second solar cell (II) are configured offset in x-direction so that a correspondingly offset contacting of the active layers (1, 2, 3) of the upper layer (n+1) of the second solar cell (II) with the corresponding active layers (1, 2, 3) disposed in layer (n) is possible. During contacting, the active layers (1, 2, 3) are configured in z-direction in the case of the example of FIG. 3.

Figure 4:
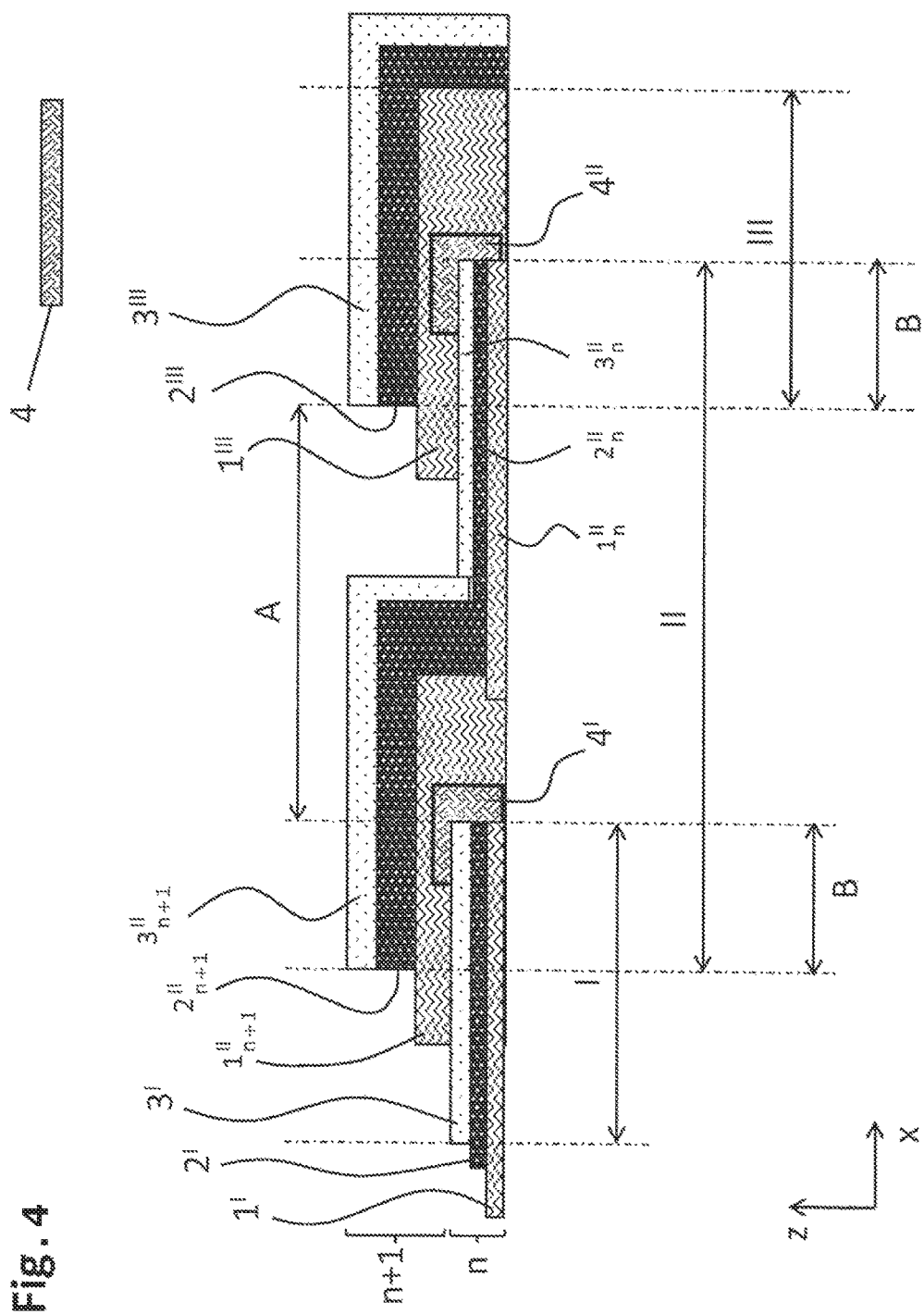
FIG. 4: a third thin-film solar cell array with optimised monolithic connections in the transition region (A) which can be produced with the method according to the invention.

FIG. 4 illustrates a further variant of a thin-film solar cell array according to the invention. This embodiment corresponds essentially to the embodiment illustrated in FIG. 3. In contrast to the embodiment according to FIG. 3, the active layers (1, 2, 3) of the solar cell (I, II) configured in the layer (n) are however disposed not offset relative to each other at the right-hand end (in x-direction) illustrated in FIG. 4 but end and/or are removed at the same position (in x-direction). These ends of the layers (1, 2, 3) can thereby be terminated with an electrically insulating material (4). Consequently, short circuits of the respective solar cells can effectively be prevented. The series connection is hereby effected for example by contacting the rear-side electrode (1) of the second solar cell (II) in the layer (n+1), situated above, with the second electrode and/or conversion layer (3) of the first solar cell (I) which is disposed in the first layer (n).

In all of the previously described embodiments according to FIGS. 2 and 4, the thin-film solar cell array can be extended by iterative arrangement of further solar cells in x-direction.

Figure 5:
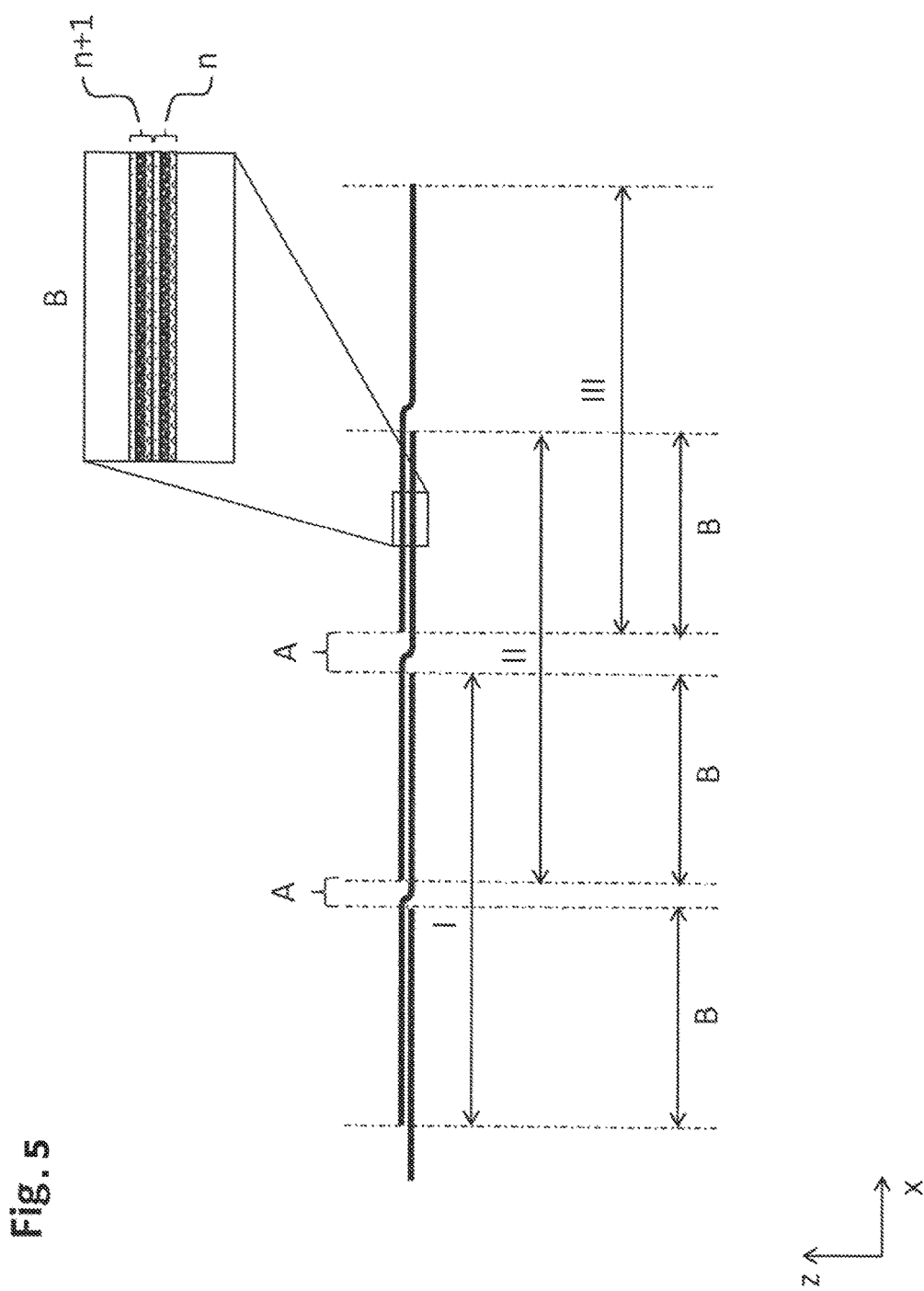
FIG. 5: a macroscopic perspective of a thin-film solar cell array produced according to the invention.

FIG. 5 shows a macroscopic illustration of a thin-film solar cell array produced according to the present invention, in which a plurality of overlapping regions between respectively pairs of solar cells (I, II) or (II, III) is illustrated. The individual solar cells thereby have respectively a transition region in which the active layers, situated above, of the respective solar cell are converted into the layer situated below. In the transition region, an S-shaped guidance of the active layers of the respective solar cell is thereby effected.

Figure 6:
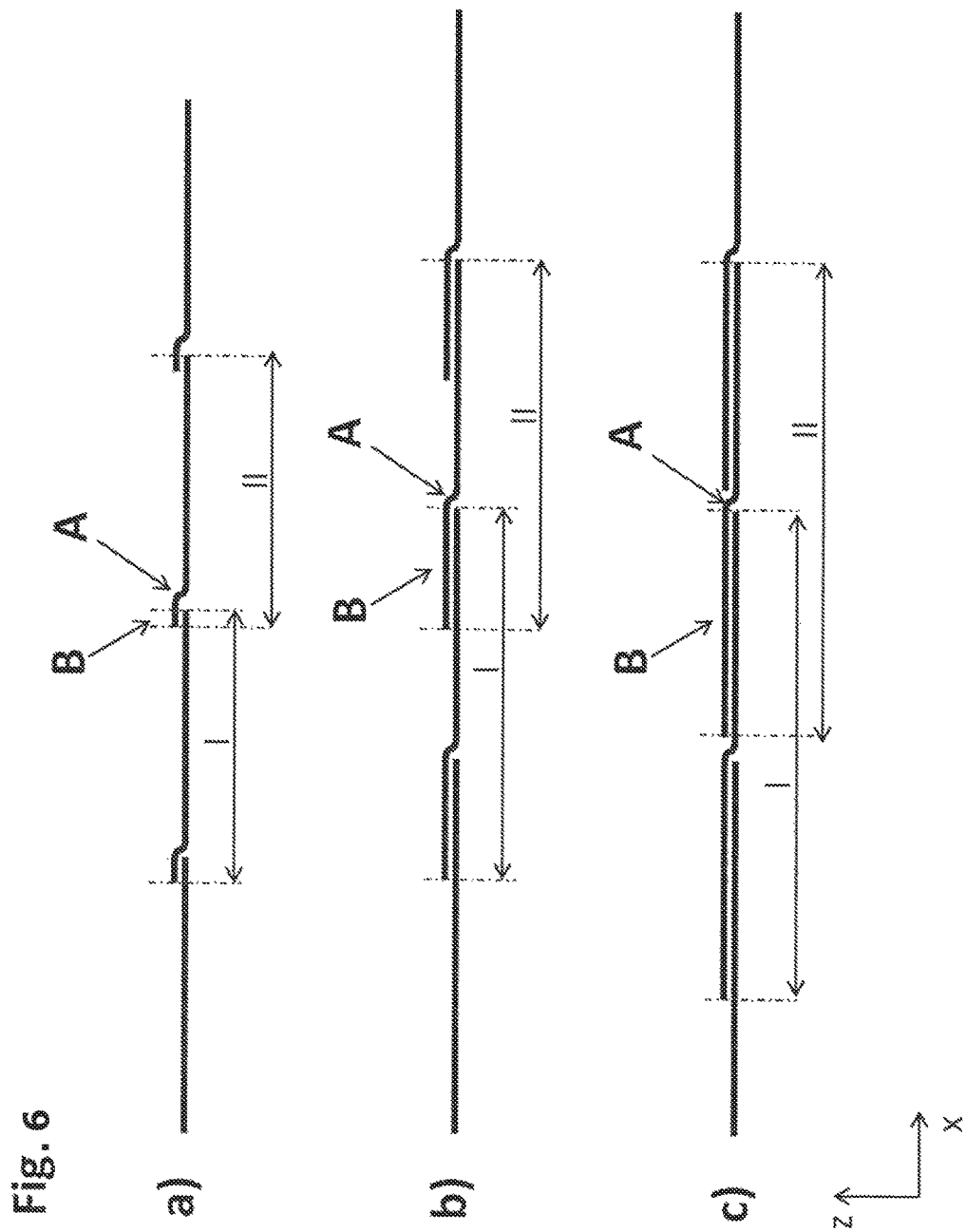
FIGS. 6A-6C: various width ratios of the transition regions (B) relative to the individual thin-film solar cells of a thin-film solar cell array which can be produced with the method according to the invention.

FIG. 6 shows further embodiments of the thin-film solar cell array produced according to the invention, in which the width of the overlapping region (B) is varied. According to the embodiment illustrated in FIG. 6a), the overlapping region (B), relative to the total width (in x-direction) of the respective thin-film solar cell (I) or (II), is relatively small. In such a thin-film solar cell array, first and foremost only a single layer of a thin-film solar cell is hence configured. The overlapping region can be increased however, as illustrated in FIG. 6b) or FIG. 6c), so that a thin-film solar cell array results, in which almost the complete width (in x-direction) of the entire thin-film solar cell array is characterised by the presence of two thin-film solar cells.

Figure 7:
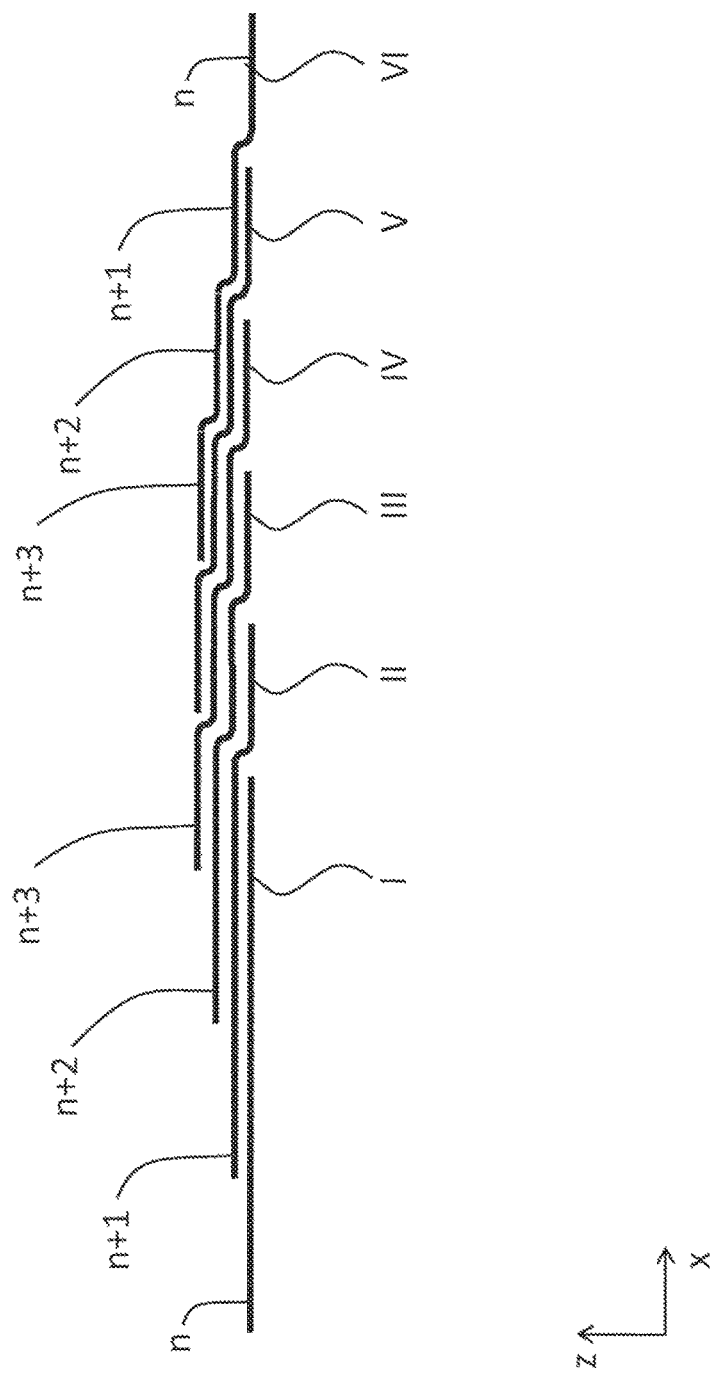
FIG. 7: a thin-film solar cell array with in total four layers of thin-film solar cells which can be produced with the method according to the invention, FIG. sequence 8: a preferred embodiment of a method according to the invention for the production of a thin-film solar cell array, the openings can be produced by direct structured deposition or large-area deposition with subsequent selective or partially selective removal and also combinations hereof.

FIG. 7 shows an embodiment of a thin-film solar cell array which is produced with the method according to the invention and in which a plurality of individual thin-film solar cells (I, II, III, IV, V, VI) is disposed in total four layers (n, n+1, n+2, n+3). Each solar cell thereby has three transition regions which, corresponding to the embodiments in FIGS. 5 and 6, are characterised with an S-shaped region of the respective active layers of the thin-film solar cells. For the sake of clarity, the overlapping regions (8) and the transition region (A) are not characterised in more detail in FIG. 7 but correspond to the embodiments as were chosen also in FIGS. 5 and 6. By means of the respective transition region (A), a conversion of the respective active layers of one thin-film solar cell is effected from a specific layer into a layer disposed below this layer. This embodiment is not however restricted to the illustrated four layers, rather any number of thin-film solar cells can be deposited one above the other according to the constructive concept which is presented, n+x layers (with x>3) then resulting.

FIG. 8 shows a further method variant for the production of the thin-film solar cell array according to the invention. Partial solar cells ($I_n$, $II_n$) are thereby deposited and connected in series in a first layer (n). The thereby produced solar cell array with a monolithic series connection illustrated in FIG. 8 corresponds to that of FIG. 1. On this layer of partial solar cells ($I_n$, $II_n$), a further layer of partial solar cells ($II_{n+1}$, $III_{n+1}$) is deposited in a second layer (n+1) situated above the first layer (n). During deposition, a parallel connection of the partial solar cells ($II_{n+1}$) is effected in the second layer (n+1) with the partial solar cell ($II_n$) already deposited in the first layer (n) so that an overall thin-film solar cell array is thereby produced, as illustrated in FIG. 8 at the bottom. The thin-film solar cell array illustrated there corresponds to that of FIG. 3. As illustrated in FIG. 8, the deposition of the partial solar cell $II_{n+1}$ can be effected with a certain overlap relative to the partial solar cell $II_n$. A particular advantage of this method is that the process can take place with very large tolerances.

As illustrated in FIG. 8, the second layer n+1 (or each further additional layer) of partial thin-film solar cells can be deposited already as a premanufactured composite of the first electrode, photoactive layer and also second electrode. This possibility is illustrated in FIG. 8.

However, it is preferred that the individual components of the partial thin-film solar cells are deposited separately on the substrate or one above the other. A corresponding sequence is illustrated in FIGS. 8a to 8f. The colour characterisation of the materials used is orientated thereby towards the definitions already used in FIG. 1 or 3.

As illustrated in FIG. 8a, the first electrode of two partial thin-film solar cells $1^I_n$ or $1^{II}_n$, which are disposed in the first layer n are deposited on a substrate. In FIG. 8a at the top, the process step is illustrated, at the bottom in FIG. 8a the obtained result is illustrated. The two first electrodes are thereby deposited offset relative to each other in x-direction and are spatially separated from each other.

As next step, as illustrated in FIG. 8b, the photoactive layer is applied offset relative to the electrodes deposited in the first step. The photoactive layer of the first partial solar cell $2^I_n$ is hereby not contacted with the first electrode of the second partial solar cell $1^{II}_n$.

In the third step, as illustrated in FIG. 8c, the second electrode 3 is deposited so that, after this step, both partial thin-film solar cells $I_n$ or $II_n$ are completed. The second electrode of the left-hand partial thin-film solar cell $I_n$ thereby contacts the first electrode of the right-hand partial-thin-film solar cell $II_n$.

Figure 8D:
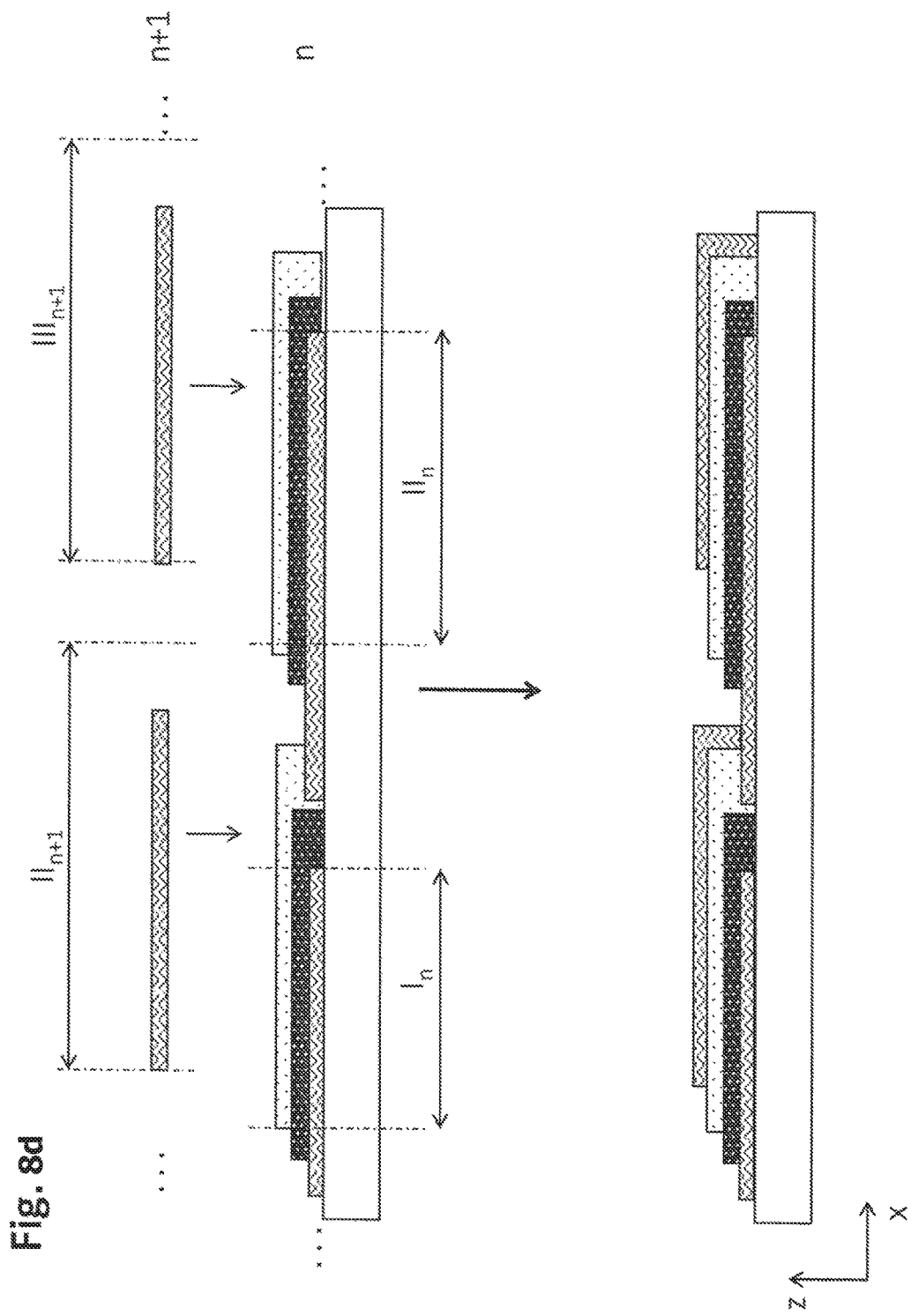
Figure 8E:
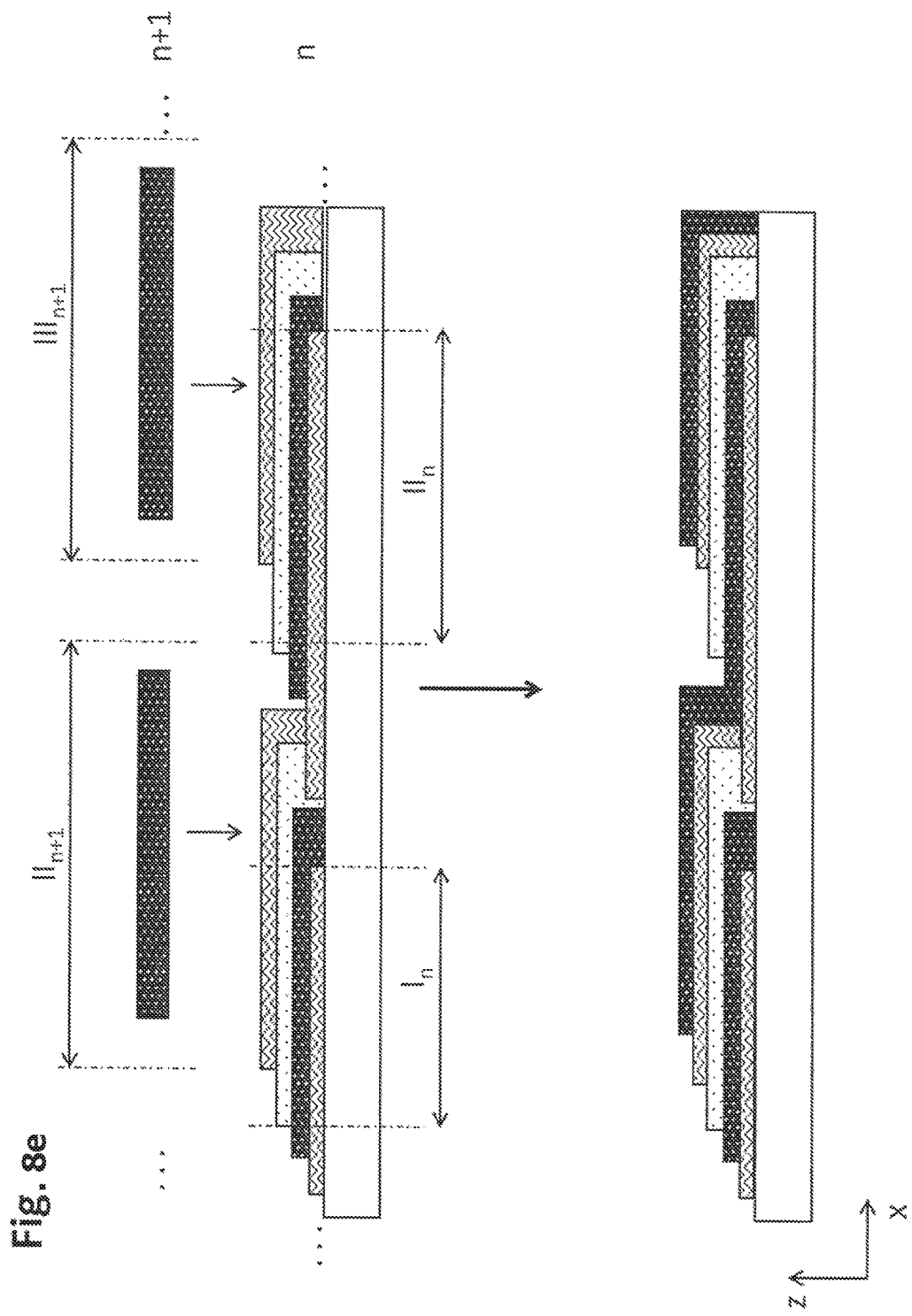

In the next step sequences, the further thin-film solar cells which are disposed in a layer n+1 situated above are deposited. This takes place in turn by a first electrode, photoactive material or second electrode being deposited offset relative to each other in an iterative manner. The sequence is illustrated in FIGS. 8d to 8f. By means of respective overlapping of the individual layers of electrodes or photoactive layers and conversion into the layer situated below, a parallel connection and hence the formation of the transition region A is thereby effected (not illustrated in FIG. 8). The result which is obtained in FIG. 8f corresponds to the thin-film solar cell array already illustrated in detail in FIG. 3.

Figure 9:
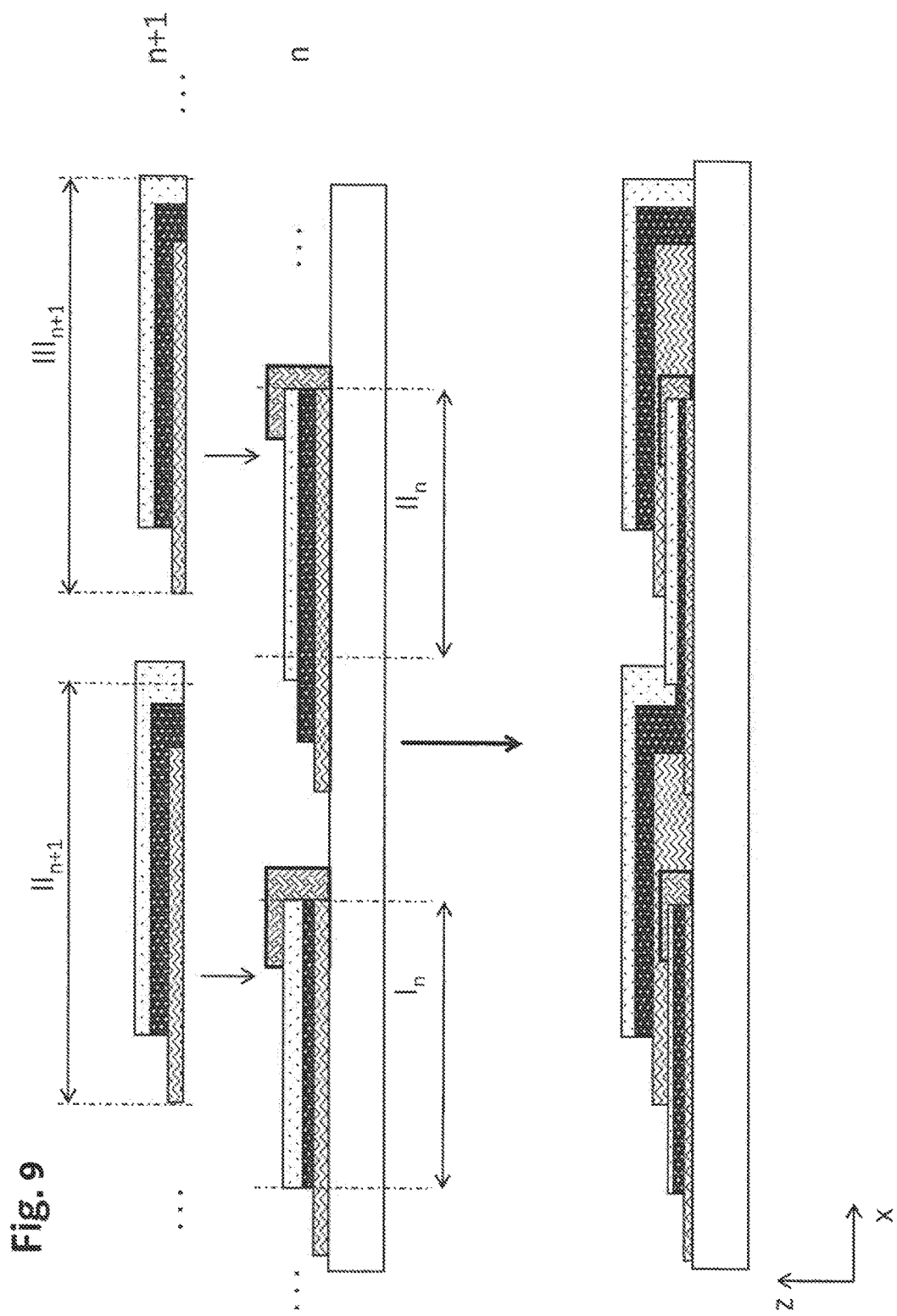

FIG. 9 shows a method variant of the method illustrated in FIG. 8. Before applying the second layer (n+1) of partial thin-film solar cells, an insulating termination of the partial thin-film solar cells applied in the first layer (n) is thereby effected. By corresponding parallel connection of the partial thin-film solar cells ($II_{n+1}$, $II_n$), an overall thin-film solar cell array thereby results (see FIG. 9 at the bottom) which corresponds to the thin-film solar cell array illustrated in FIG. 4.

As already discussed in the case of FIG. 8, it is possible to deposit a composite of further layers, i.e. first electrode, photoactive layer and second electrode, on premanufactured partial thin-film solar cells which are situated in a layer n, as is illustrated in FIG. 9.

However, a successive deposition of the individual layers is preferred, as is illustrated in the FIG. sequence 9a to 9g. Deposition of the individual layers, i.e. first electrode etc., is thereby effected analogously, as illustrated in FIGS. 8a to 8f.

Figure 9C:
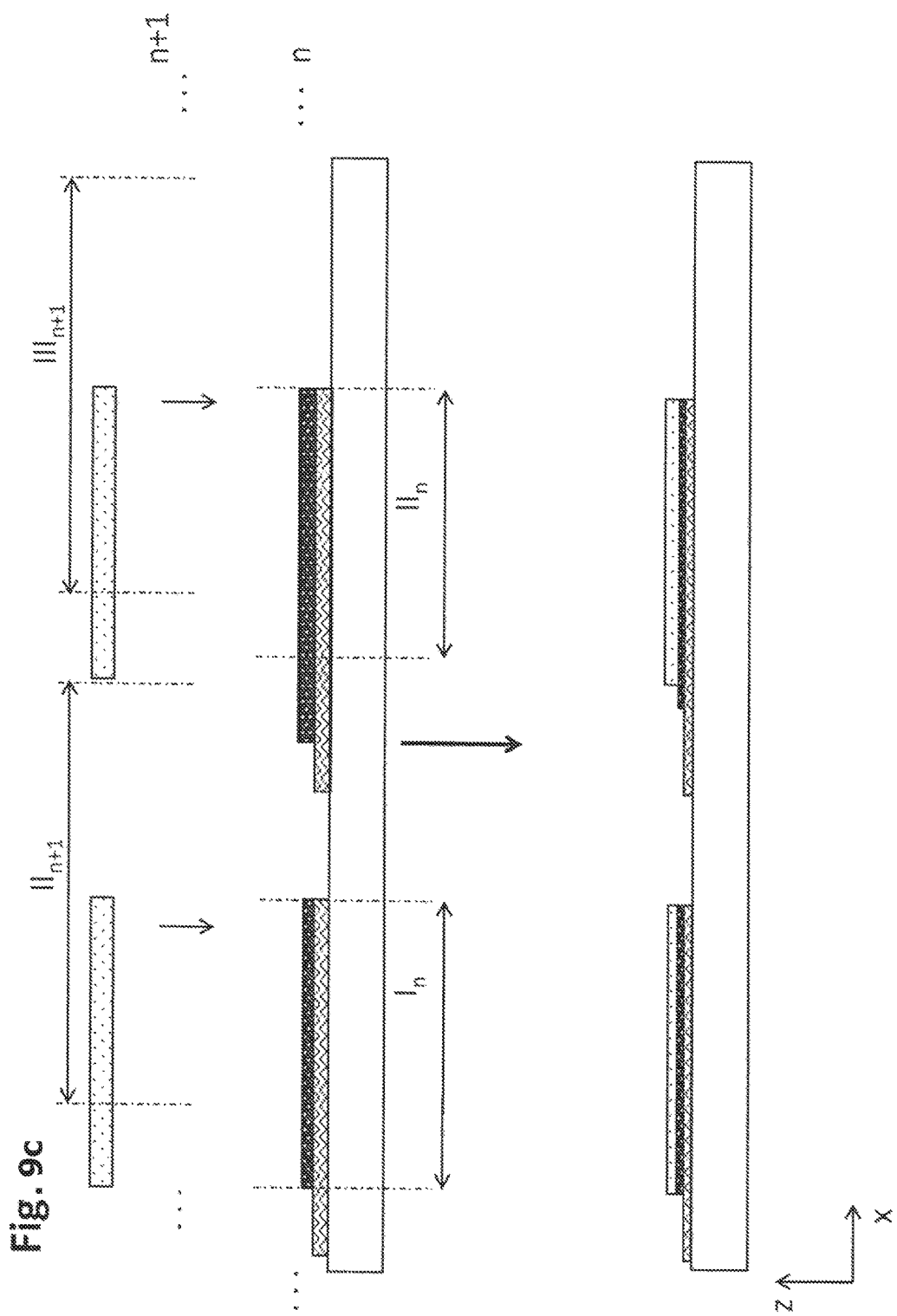

As the most substantial difference from the method process according to FIG. sequence 8, the individual components of the respective partial thin-film solar cell, i.e. first electrode, photoactive layer and second electrode, are however hereby configured to be of equal length on one side (in FIG. 9 the respective right-hand side of a partial thin-film solar cell) and not overlapping. This is evident in particular in FIGS. 9b and 9c, the photoactive layer or the second electrode is hereby always configured to be of equal length on the right-hand side, like the first electrode situated below, so that a terminating edge of the respective partial thin-film solar cell is produced. In order to avoid short circuits, this side is terminated by for example an electrically insulating material being deposited for termination of the individual layers (see FIG. 9d).

Figure 9E:
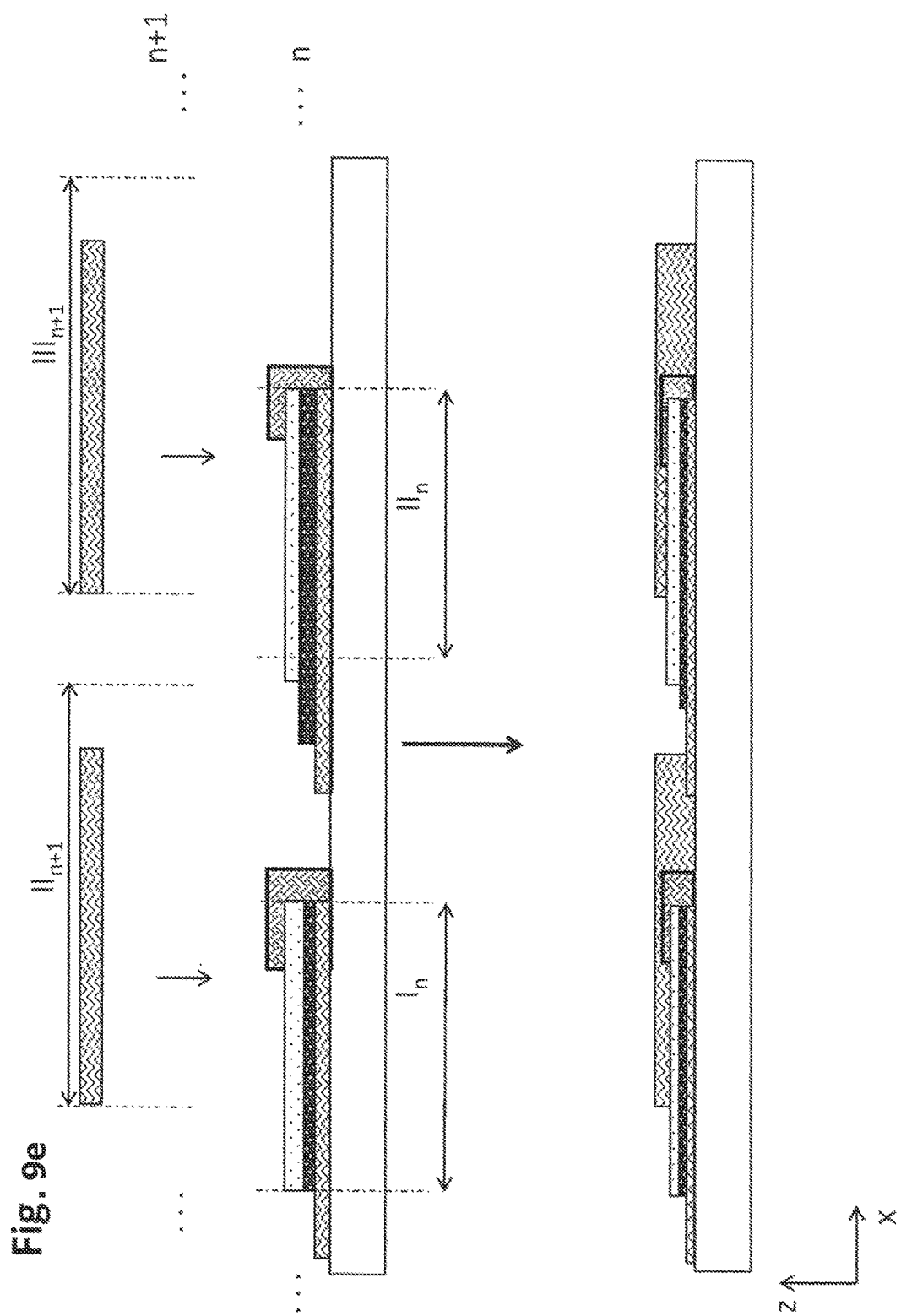
Figure 9F:
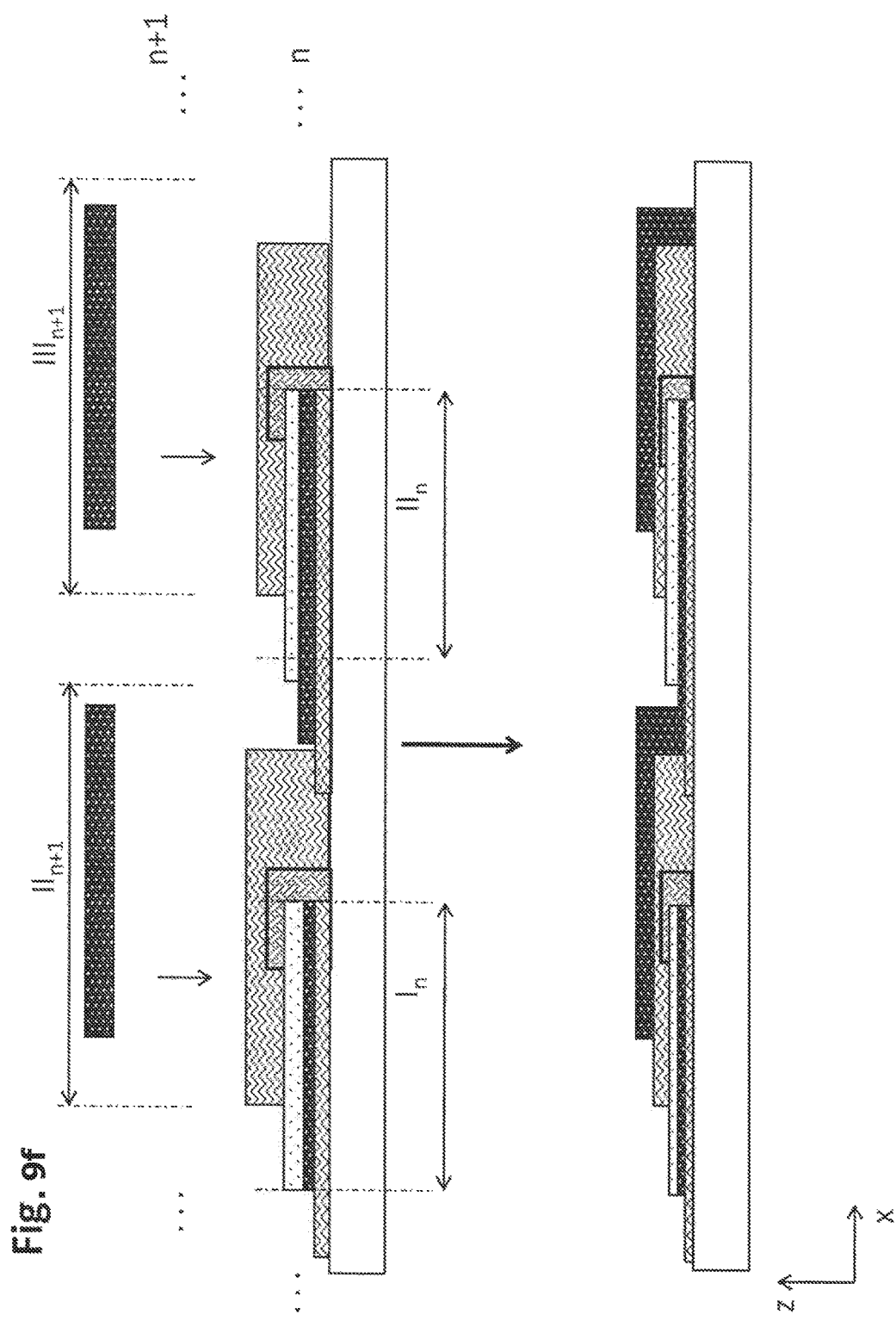
Figure 9G:
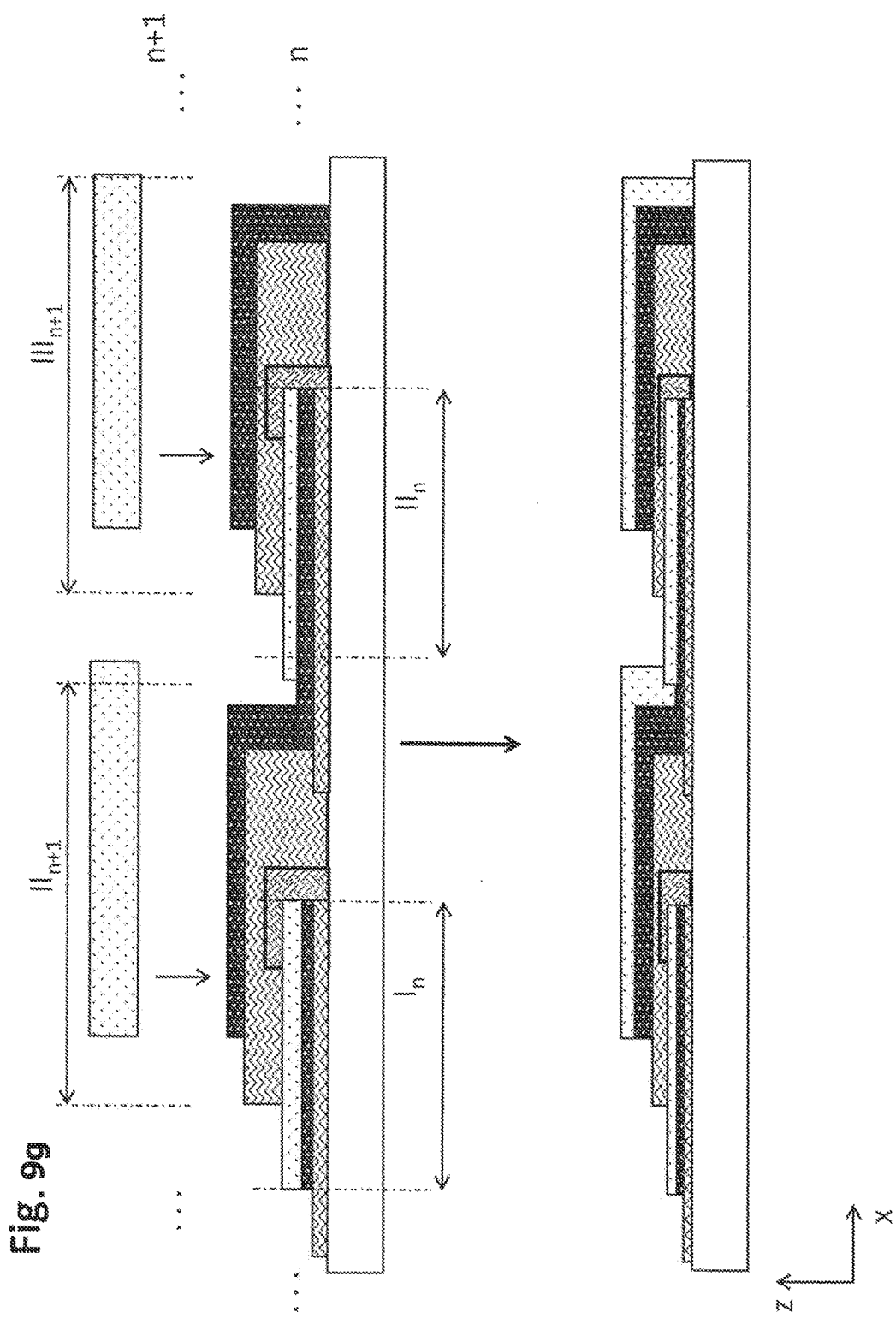

The series connection of the individual partial thin-film solar cells $I_n$ and $II_n$ is effected by deposition of a further layer which here represents, at the same time, the first electrode of the partial thin-film solar cells of the second layer n+1 (see FIG. 9e). This deposited electrode is contacted, on the one hand, with the second electrode or conversion layer of the first partial thin-film solar cell $I_n$, on the other hand is guided so far to the right in x-direction that contacting is made possible there and hence series connection with the first electrode of the second partial thin-film solar cell IL. In FIGS. 9f and 9g, deposition of the further components of the partial thin-film solar cells ($II_{n+1}$ and $III_{n+1}$) which are disposed in the layer n+1 is illustrated. By respective overlapping, contacting with the partial thin-film solar cell in the layer situated below is hereby made possible and hence a parallel connection of the thin-film solar cell from the first layer n+1 and a partial thin-film solar cell in a layer n situated below. A thin-film solar cell array, as described already in FIG. 4 in detail, results.

Both in the method process according to FIG. 8 and FIGS. 8a to 8f or FIGS. 9a to 9g, it is possible and preferred that the respective partial thin-film solar cells are deposited simultaneously in one layer, i.e. the respective layers forming them (first electrode, photoactive layer, second electrode or conversion layer) are deposited respectively simultaneously for all partial thin-film solar cells. However, it is likewise possible to deposit each individual partial thin-film solar cell or groups hereof separately.

In FIG. 10, a casting head (G) is illustrated with which for example the above-described preferred embodiment of the method according to the invention can be effected by film casting of the respective thin-film solar cells. The casting head thereby has a large number of casting slots (a, b . . . ), only two casting slots (a, b) of which are illustrated in FIG. 10. The respective casting slots (a, b) are thereby subdivided into a plurality of separate compartments (a1, a2, a3, a4) or (b1, b2, . . . b7). The respective compartments are thereby supplied with different precursor materials, from which the corresponding active layers (1, 2, 3) of one respective solar cell are formed.

FIG. 11 shows a result of a film-casting method effected with a casting head (G'): a thin-film solar cell array in which the thin-film solar cells are disposed in two layers (n) and in (n+1) is illustrated. The respective thin-film solar cells in one layer (n) are thereby formed from the individual laminated layers (a, b, c) or (d, e, f for layer n+1). The respective laminated layers thereby correspond to the casting slots present in the casting head (G'). By choice of geometry of the arrangement of the casting slots and also of the individual compartments, the geometry of the respective active layers of one respective solar cell can be predefined. This is made clear for example with reference to the laminated layer (b): with the compartment (b1) of the casting head (G'), for example a material for a rear-side electrode (1) is deposited, via the compartment (b2) an insulating stop layer can be deposited. In compartment (b3), a material for a photoactive layer is deposited. With a correspondingly equipped casting head (G'), the entire thin-film solar cell array can hence be produced in one step.

FIG. 12 presents a second variant of a method according to the invention for the production of a thin-film solar cell array according to the invention. According to the method illustrated in FIG. 12, the production of the respective active (1, 2, 3) films or layers of the respective thin-film solar cells (I, II, III) is effected by means of film casting, a casting head (G) being used. The casting head (G) has a large number of casting slots (X), each casting slot being assigned to one active layer (1, 2, 3) of one respective thin-film solar cell (I, II, III). In the case of the example of FIG. 12, the thin-film solar cells thereby have respectively three active layers, correspondingly the casting head (G) has respectively three casting slots for the production respectively of one individual thin-film solar cell. The casting slots are thereby disposed offset relative to each other respectively for the individual active layers (1, 2, 3) of each thin-film solar cell so that the individual layers can be deposited with a small offset relative to each other in x-direction. In addition, the casting slots for the corresponding active layers (1, 2, 3) of each further solar cell are disposed offset relative to the casting slots for the active layers (1, 2, 3) of the preceding thin-film solar cell so that a partial overlap is ensured. As illustrated with (*) in FIG. 12, also further casting slots can be present. The method according to the invention now provides that each casting slot is supplied with a corresponding material for the corresponding active layer of each thin-film solar cell, in which the corresponding material is cast or pressed through the corresponding casting slot. As a result, a liquid curtain which can be deposited on a substrate (not illustrated) is produced, in which for example the casting head is guided through in y-direction above the substrate or the substrate in y-direction below the casting head. With such a method according to the invention, in particular thin-film solar cell arrays as are illustrated in FIGS. 5 and 6 can be produced.

FIG. 13 shows a modification of the method illustrated in FIG. 12, an additional casting slot ($X^E$) is hereby present, via which for example in addition an electrode can be deposited. In the case of the example of FIG. 13, the electrode is formed from the same material as the respective second electrode and/or conversion layer (3) of the respective solar cell. In addition, the width of the casting slot ($X^{III}_3$) is somewhat widened so that consequently contacting can likewise be produced at the protruding region.

FIG. 14 shows a further method variant according to the invention in which the individual active layers (1, 2, 3) of the respective thin-film solar cells (I, II, III) are deposited by means of an inkjet printing method. A method variant in which a plurality of printing heads (1, 2, . . . 9) print, at the same time, three thin-film solar cells (I, II, III) with respective active layers (1, 2, 3) on a substrate (S) is illustrated. The substrate can thereby be drawn through in y-direction relatively below the printing tools, it is likewise possible to guide the printing tools in y-direction over the stationary substrate (S). As indicated with (*), also further printing tools can be present in order to print further solar cells at the same time.

FIG. 15 shows a further basic embodiment of a thin-film solar cell array according to the invention, as can be produced in particular with the methods presented in FIGS. 12 to 14. These can be produced by the photoactive layer (2) or the second electrode and/or conversion layer (3) of the respective solar cells (I, II, III) being introduced continuously into the electrode material of the rear-side electrode (1), for example cast in the corresponding layers. The respective photoactive layers (2) or the second electrodes and/or conversion layers (3) thereby extend linearly and offset relative to each other. A series connection of the individual thin-film solar cells (I, II, III) is thereby effected by material removal at points (6), possibly insulating materials (4) being able to be separated from each other as insulating stop layer or locally isolated electrodes (5). The structuring at points (6) can be effected by removal of the respective layer or by destroying the conductivity, for example removed in the material by laser ablation. According to the basic embodiments relating to FIG. 2 and FIG. 3, the respective active layers (1, 2, 3) of one respective solar cell (I, II, III) are disposed in two layers (n+1, n) in the case of the embodiment according to FIG. 8; this may be clarified with the example of the thin-film solar cell (II). Due to the diagonally extending arrangement in the zx-plane of the individual active layers (1, 2, 3) of the thin-film solar cell (II), the layers (1, 2, 3) of the thin-film solar cell (II), which are disposed in the left-hand region (in x-direction), are disposed in z-direction situated further up than the corresponding layers at the right-hand end of the thin-film solar cell (II). The corresponding active layers (1, 2, 3) are thereby disposed in addition above the corresponding active layers of the thin-film solar cell (I), i.e. in a layer (n+1) disposed above the solar cell (I). By iterative arrangement of all the active layers of the respective thin-film solar cells, in the previously described manner, a repetition of the overlap of the individual active layers (1, 2, 3) of the respective solar cells hence results so that a respective transition region (B) is configured. In the transition region (A), merely active layers of one solar cell are present in the case of the example of the thin-film solar cell (II) illustrated in FIG. 15, a conversion here of the respective active layers into a layer (n) situated below being effected. It should be referred to here that the linear course of the individual active layers, in particular of layers 2 and 3, is represented in an idealised form. The layers can extend linearly in the zx-plane, however also bent or curved courses which are produced for example from the production method by sedimentation processes are conceivable, or combinations of bent/curved and linear courses of these layers.

A further method variant is illustrated in FIG. 16. In a first step a), lamination of a first thin-film solar cell on a substrate (S) is effected. In the embodiment according to FIG. 16, the solar cell is thereby applied on the substrate (S) via an insulating adhesive (K).

In step b), a second thin-film solar cell is applied over this first thin-film solar cell which is already laminated on the substrate (S), in which a composite (V) made of a temporary carrier (T) with second thin-film solar cell laminated thereon with the respective active layers (1, 2, 3) and also an insulating adhesive layer (K) disposed thereunder is laminated-on over the thin-film solar cell already situated on the first substrate. In a step c), the removal of the temporary carrier (T) which can be for example a basic material film is effected. Since the individual layers have a thin and flexible configuration, likewise adhesion of the second thin-film solar cell, laminated in step b), is likewise effected on the substrate by means of the insulating adhesive layer (K) (indicated by the arrow). In a further step d), the temporary carrier (T) is removed in a further step c). In a step d), a series connection of the individual thin-film solar cells is effected via a conductive connection. The temporary carrier can also be a liquid.

FIG. 17 shows a variant of the method illustrated in FIG. 16, lamination of a solar cell over a corresponding insulating adhesive layer (K) is likewise effected on a substrate (S). In FIG. 17, a method stage is illustrated, in which two thin-film solar cells are already deposited one above the other. The lamination of the third thin-film solar cell is thereby effected, in which firstly a separate adhesive layer (K) is deposited on the already present thin-film solar cells partially overlapping and is glued on the substrate. On this insulating adhesive layer (K), a composite of a carrier and also a further thin-film solar cell with corresponding active layers is applied c), in a further step d), the temporary carrier substrate (T) can be removed again. Finally, a series connection of the applied thin-film solar cells is effected via an electrical connection 7.

FIG. 18 shows a further method variant according to the invention in which the thin-film solar cells are laminated onto a carrier substrate (S) by means of a conducting adhesive (K'). In a first step a), a first thin-film solar cell is applied on a carrier substrate (S) via an electrically conductive adhesive connection (K'). Finally, termination of the respective active layers of the applied thin-film solar cell can be effected by means of an electrical insulator (4). In a step b), lamination of a composite of a temporary carrier, on which a thin-film solar cell and also an electrically conducting adhesive connection (K') is applied, is effected, in which the composite is glued, partially overlapping, to the thin-film solar cell deposited already on the substrate. In step c) the carrier (T) is removed. Finally, the exposed ends of the respective active layers of the newly laminated thin-film solar cell can be terminated again by means of an electrical insulator (4). The electrically series connection is thereby effected by the electrically conductive adhesive (K'). By iterative repetition of steps b) and c) and also possibly corresponding electrical termination (4) of the newly produced thin-film solar cells, an array of a plurality of thin-film solar cells, which are laminated adjacently in x-direction, can be produced.

FIG. 19 shows a further variant of a method illustrated in FIG. 18. In contrast to FIG. 18, here the electrically conductive adhesive layer (K') is laminated on before lamination of a further thin-film solar cell (cf. the embodiments relating to FIG. 17).

The invention claimed is:

1. A method for the production of a thin-film solar cell array, comprising a plurality of thin-film solar cells (I, II, III, . . . ) applied on a substrate (S), which comprise respectively at least one first rear-side electrode ($1^I$, $1^{II}$, $1^{III}$, . . . ) disposed on top of the substrate (S), and at least one second electrode and/or a conversion layer ($3^I$, $3^{II}$, $3^{III}$, . . . ) and also at least one photoactive layer ($2^I$, $2^{II}$, $2^{III}$, . . . ) disposed between the rear-side electrode ($1^I$, $1^{II}$, $1^{III}$, . . . ) and the second electrode and/or the conversion layer ($3^I$, $3^{II}$, $3^{III}$, . . . ), the thin-film solar cell array a) having at least one overlapping region (B) in which respectively one first (I, II, . . . ) and one second thin-film solar cell (II, III, . . . ) are disposed in two layers (n, n+1, . . . ) and in pairs (I-II, II-III, . . . ) situated one above the other, one region of the respectively first thin-film solar cell (I, II, . . . ) in a first layer (n, . . . ) and one region of the respectively second thin-film solar cell (II, III, . . . ), which is disposed to a side of the respectively first thin-film solar cell (I, II, . . . ) orientated away from the substrate (S) in a layer (n+1, . . . ) situated above the respectively first thin-film solar cell (I, II, . . . ), being connected to each other and connected electrically in series, and b) having at least one transition region (A) in which only the respectively second thin-film solar cell (II, III, . . . ) of the pair of respectively first and respectively second thin-film solar cell (I-II, II-III, . . . ) is configured, and the rear-side electrode ($1^{II}_{n+1}$, $1^{III}_{n+1}$, . . . ), the photoactive layer ($2^{II}_{n+1}$, $2^{III}_{n+1}$, . . . ), and the second electrode and/or the conversion layer ($3^{II}_{n+1}$, $3^{III}_{n+1}$, . . . ) of the respectively second thin-film solar cell (II, III, . . . ) configured in the layer (n+1, . . . ) also forming the rear-side electrode ($1^{II}_n$, $1^{III}_n$, . . . ), the photoactive layer ($2^{II}_n$, $2^{III}_n$, . . . ) and the second electrode and/or conversion layer ($3^{II}_n$, $3^{III}_n$, . . . ) in the layer (n), simultaneously or successively depositing at least one first rear-side electrode ($1^I$, $1^{II}$, $1^{III}$, . . . ) disposed on top of the substrate (S), and one photoactive layer ($2^I$, $2^{II}$, $2^{III}$, . . . ) disposed above and also one second electrode and/or one conversion layer ($3^I$, $3^{II}$, $3^{III}$, . . . ) also disposed on top of the substrate (S), producing the at least two thin film solar cells (I, II, III, . . . ) in at least one overlapping region (B) in pairs (I-II, II-III, . . . ) in at least two layers (n, n+1, . . . ) situated one above the other, by the respectively second thin-film solar cell (II, III, . . . ) of each pair (I-II, II-III, . . . ) of first (I, II, . . . ) and second thin-film solar cell (II, III, . . . ) being deposited in regions in a layer (n+1, n+2, . . . ) situated above the respectively first thin-film solar cell, and the respectively first (I, II, . . . ) and second thin-film solar cell (II, III, . . . ) in this region (B) being connected electrically in series, and wherein the respectively second thin-film solar cell (II, III, . . . ) of each pair (I-II, II-III) of first (I, II, . . . ) and second thin-film solar cell (II, III, . . . ) is deposited offset relative to the respectively first thin-film solar cell (I, II, . . . ) of each pair (I-II, II-III, . . . ) of first (I, II, . . . ) and second thin-film solar cell (II, III, . . . ) so that a transition region (A) is configured, in which the rear-side electrode ($1^{II}$, $1^{III}$, . . . ), the photoactive layer ($2^{II}$, $2^{III}$, . . . ), and also the second electrode and/or the conversion layer ($3^{II}$, $3^{III}$, . . . ) of the respectively second thin-film solar cell (II, III, . . . ) of each pair (I-II, II-III, . . . ) of first (I, II, . . . ) and second thin-film solar cell (II, III, . . . ) associated with layer (n+1, n+2, . . . ) situated above the respectively first thin-film solar cell also forming the rear-side electrode ($1^{II}$, $1^{III}$, . . . ), the photoactive layer ($2^{II}$, $2^{III}$, . . . ), and the second electrode and/or the conversion layer ($3^{II}$, $3^{III}$, . . . ) in a layer (n, n+1) situated below;

wherein the deposition of: (1) the thin-film solar cells and/or of the rear-side electrode orientated towards the substrate (S), (2) the second electrodes and/or conversion layers, and (3) the photoactive layer of the thin-film solar cells is done either in a liquid phase or a vapour phase; or wherein in the first layer (n, . . . ), at least two partial thin-film solar cells ($I_n$, $II_n$, . . . ), which comprise respectively the rear-side electrode disposed on top of the substrate (S), and the second electrode and/or a conversion layer and also the photoactive layer disposed between the rear-side electrode and the second electrode and/or the conversion layer, are disposed or premanufactured and at least one further partial thin-film solar cell ($II_{n+1}$, $III_{n+1}$, . . . ), which comprises respectively the rear-side electrode disposed on top of the substrate (S), and the second electrode and/or the conversion layer and also the photoactive layer disposed between the rear-side electrode and the second electrode and/or the conversion layer, are deposited in the second layer (n+1) offset on the at least two partial thin-film solar cells ($I_n$, $II_n$, . . . ) disposed in the first layer (n, . . . ), at least one overlapping region (B) being configured between at least one partial thin-film solar cell ($I_n$) disposed in the first layer (n, . . . ) and one partial thin-film solar cell ($II_{n+1}$) deposited in the second layer (n+1, . . . ) and also at least one transition region (A) by contacting the rear-side electrode, the photoactive layer and also the second electrode and/or the conversion layer of the partial thin-film solar cell ($II_{n+1}$) deposited in the second layer (n+1, . . . ) with the rear-side electrode, the photoactive layer and also the second electrode and/or the conversion layer of the partial thin-film solar cell ($II_n$) disposed in the first layer (n, . . . ) wherein the deposition of the partial thin-film solar cells is done either in a liquid phase or in a vapour phase.

2. The method according to claim 1, wherein in that, during premanufacture or deposition of the at least two partial thin-film solar cells ($I_n$, $II_n$, . . . ) and/or the deposition of the at least one further partial thin-film solar cell ($II_{n+1}$, $III_{n+1}$, . . . ), the rear-side electrode, which is orientated towards the substrate (S), and the second electrode and/or the conversion layer and also the photoactive layer, disposed between the rear-side electrode and the second electrode and/or the conversion layer, for each partial thin-film solar cell ($I_n$, $II_n$, . . . or $II_{n+1}$, $III_{n+1}$, . . . ) are deposited successively and, for the respective partial thin-film solar cells ($I_n$, $II_n$, . . . or $II_{n+1}$, $III_{n+1}$, . . . ), simultaneously.

3. The method according claim 1, wherein in that, after deposition of the first rear-side electrode disposed on top of the substrate (S), of the photoactive layer and also of the second electrode of a respective partial thin-film solar cell ($I_n$, $II_n$, . . . ) in the first layer (n, . . . ), the first rear-side electrode disposed on top of the substrate (S), and the photoactive layer and/or the second electrode of the respective partial thin-film solar cell ($I_n$, $II_n$, . . . ) is terminated, in particular by deposition of an electrical insulator (4), and subsequently the conversion layer is deposited for electrical contacting of the second electrode of a first partial thin-film solar cell ($I_n$, . . . ) with the first electrode of an adjacent second partial thin-film solar cell ($II_n$, . . . ) and for formation of the overlapping region (A).

4. The method according claim 1, wherein in that the deposition, produced simultaneously or successively, of the at least one first rear-side electrode ($1^I$, $1^{II}$, $1^{III}$, . . . ), of the photoactive layer ($2^I$, $2^{II}$, $2^{III}$, . . . ) disposed above and also of the second electrode and/or conversion layer ($3^I$, $3^{II}$, $3^{III}$, . . . ) disposed above is produced by film casting in which the precursor materials are cast and/or pressed by means of a casting head (G') which has a plurality of casting slots (a, b, . . . ) onto the substrate (S), the casting slots (a, b, . . . ) respectively being subdivided into a plurality of compartments (a2, a2, a3, a4, . . . ; b1, b2, b3, b4, b5, b6, b7, . . . ), through which respectively the precursor materials of the respective rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) of the individual thin-film solar cells (I, II, III, . . . ) are cast and/or pressed, the compartments (a2, a2, a3, a4, . . . ; b1, b2, b3, b4, b5, b6, b7, . . . ) being disposed relative to each other such that the rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) of a respective individual thin-film solar cell (I, II, III . . . ) being cast situated one above the other at least in regions and, for respectively one pair (I-II, II-III, . . . ) of first (I, II, . . . ) and second thin-film solar cell (II, III, . . . ), the respective rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) being cast offset relative to each other so that an overlapping region (B) and a transition region (A) are produced.

5. The method according to claim 1, wherein in that the deposition, produced simultaneously or successively, of the at least one first rear-side electrode ($1^I$, $1^{II}$, $1^{III}$, . . . ), of the photoactive layer ($2^I$, $2^{II}$, $2^{III}$, . . . ) disposed above and also of the second electrode and/or conversion layer ($3^I$, $3^{II}$, $3^{III}$, . . . ) disposed above is produced by film casting, in which the precursor materials are cast and/or pressed onto the substrate (S) by means of a casting head (G) which has a plurality of casting slots ($X^I_1$, $X^I_2$, $X^I_3$, $X^{II}_1$, $X^{II}_2$, $X^{II}_3$, $X^{III}_1$, $X^{III}_2$, $X^{III}_3$, . . . ), the casting slots ($X^I_1$, $X^I_2$, $X^I_3$, $X^{II}_1$, $X^{II}_2$, $X^{II}_3$, $X^{III}_1$, $X^{III}_2$, $X^{III}_3$, . . . ), respectively of one rear-side electrode ($1^I$, $1^{II}$, $1^{III}$, . . . ), of a photoactive layer ($2^I$, $2^{II}$, $2^{III}$, . . . ) and also of a second electrode and/or conversion layer ($3^I$, $3^{II}$, $3^{III}$, . . . ) being assigned to a respective thin-film solar cell (I, II, III, . . . ), being configured continuously over the entire width of the respective rear-side electrode ($1^I$, $1^{II}$, $1^{III}$, . . . ), of the photoactive layer ($2^I$, $2^{II}$, $2^{III}$, . . . ) and also of the second electrode and/or conversion layer ($3^I$, $3^{II}$, $3^{III}$, . . . ) of the respective thin-film solar cell (I, II, III, . . . ) and being disposed such in the casting head (G) that the rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) of a respective individual thin-film solar cell (I, II, III, . . . ) are cast one above the other at least in regions and, for respectively one pair (I-II, II-III, . . . ) of first (I, II, . . . ) and second thin-film solar cell (II, III, . . . ), the respective rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) being cast offset relative to each other so that the overlapping region (B) and the transition region (A) are produced.

6. The method according to claim 1, wherein in that the deposition, produced simultaneously or successively, of the at least one first rear-side electrode ($1^I$, $1^{II}$, $1^{III}$, . . . ), of the photoactive layer ($2^I$, $2^{II}$, $2^{III}$, . . . ) disposed above and also of the second electrode and/or conversion layer ($3^I$, $3^{II}$, $3^{III}$, . . . ) disposed above is produced by inkjet- and/or aerosol printing on the substrate (S), the rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) of one respective individual thin-film solar cell (I, II, III, . . . ) being printed situated one above the other at least in regions and, for respectively one pair (I-II, II-III, . . . ) of first (I, II, . . . ) and second thin-film solar cell (II, III, . . . ), the respective rear-side electrode ($1^I$, $1^{II}$, $1^{III}$, . . . ), the photoactive layer ($2^I$, $2^{II}$, $2^{III}$, . . . ) and also the second electrode and/or conversion layer ($3^I$, $3^{II}$, $3^{III}$, . . . ) being printed offset relative to each so that the overlapping region (B) and the transition region (A) are produced.

7. The method according to claim 1, wherein in that, on the substrate (S), a plurality of thin-film solar cells, which comprise respectively at least one first rear-side electrode disposed on top of the substrate (S), and the second electrode and/or the conversion layer and also the photoactive layer disposed between the rear-side electrode and the second electrode and/or the conversion layer, are deposited in succession partially overlapping.

8. The method according to claim 1, wherein in that a plurality of pairs (I-II, II-III . . . ) of first (I, II, . . . ) and second thin-film solar cell (II, III, . . . ) is disposed iteratively, a plurality of first transition regions ($B^{I-II}$, $B^{II-III}$, . . . ) being configured with thin-film solar cells (I-II, II-III, . . . ), connected in pairs, and also a plurality of second transition regions ($A^I$, $A^{II}$, . . . ) of the respectively second thin-film solar cell (II, III, . . . ) of the plurality of pairs (I-II, II-III, . . . ) of first (I, II, . . . ) and second thin-film solar cell (II, III, . . . ).

9. The method according to claim 1, wherein in that the plurality of thin-film solar cells (I, II, III, . . . )
a) is disposed in two layers (n, n+1), respectively the second thin-film solar cell (II, III, . . . ) of a pair of respectively first and respectively second thin-film solar cell (I-II, II-III, . . . ) having a first plurality of transition region ($A^I$, $A^{II}$, . . . ) in which, configured in the second layer (n+1), the rear-side electrode ($1^{II}_{n+1}$, $1^{III}_{n+1}$, . . . ), the photoactive layer ($2^{II}_{n+1}$, $2^{III}_{n+1}$, . . . ) and the second electrode and/or the conversion layer ($3^{II}_{n+1}$, $3^{III}_{n+1}$, . . . ) of the respectively second thin-film solar cell (II, III, . . . ) is converted, configured in the first layer (n, . . . ), into respectively a rear-side electrode ($1^{II}_n$, $1^{III}_n$, . . . ), a photoactive layer ($2^{II}_n$, $2^{III}_n$, . . . ) and a second electrode and/or a conversion layer ($3^{II}_n$, $3^{III}_n$, . . . ), or b) is disposed in three layers (n, n+1, n+2), respectively the second thin-film solar cell (II, III, . . . ) of a pair of respectively first and respectively second thin-film solar cell (I-II, II-III, . . . ) having two transition regions disposed in steps, configured in a third layer (n+2), the rear-side electrode, the photoactive layer and the second electrode and/or the conversion layer of the respectively second thin-film solar cell (II, III, . . . ), in the first transition region, converted, configured in the second layer (n+1), into respectively the rear-side electrode, the photoactive layer and the second electrode and/or the conversion layer and, in the second transition region, into one thereof configured in the first layer (n), or c) is disposed in four layers (n, n+1, n+2, n+3), respectively the second thin-film solar cell (II, III, . . . ) of a pair of respectively first and respectively second thin-film solar cell (I-II, II-III, . . . ) having three transition regions disposed in steps, configured in a fourth layer (n+3), the rear-side electrode, the photoactive layer and the second electrode and/or the conversion layer of the respectively second thin-film solar cell (II, III, . . . ), in the first transition region, converted, configured in the third layer (n+2), into respectively the rear-side electrode, the photoactive layer and the second electrode and/or the conversion layer, in the second transition region, into one thereof configured in the second layer (n+1) and, in the third transition region, into one thereof configured in the first layer (n).

10. The method according to claim 1, wherein in that width of each overlapping region (B) of each pair of respectively first and respectively second thin-film solar cell (I-II, II-III, . . . ) is between 0.01 and 0.99 times the length of the respective second thin-film solar cell (II, III, . . . ).

11. The method according to claim 1, wherein in that connection of region of the respectively first thin-film solar cell (I, II, . . . ) and of region of the respectively second thin-film solar cell (II, III, . . . ) is produced in the at least one overlapping region (B)
a) by direct connection of the second electrode and/or of the conversion layer ($3^I_n$, $3^{II}_n$, . . . ) of the respectively first thin-film solar cell (I, II . . . ) to the rear-side electrode ($1^{II}_{n+1}$, $1^{III}_{n+1}$, . . . ) of the respectively second thin-film solar cell (II, III, . . . ) of the pair of respectively first and respectively second thin-film solar cell (I-II, II-III),
b) by an electrically conducting bond of the second electrode and/or of the conversion layer ($3^I_n$, $3^{II}_n$, . . . ) of the respectively first thin-film solar cell (I, II, . . . ) to the rear-side electrode ($1^{II}_{n+1}$, $1^{III}_{n+1}$, . . . ) of the respectively second thin-film solar cell (II, III, . . . ) of the pair of respectively first and respectively second thin-film solar cell (I-II, II-III, . . . ) by means of an electrically conductive adhesive layer (K'), or
c) by an electrically insulating bond of the second electrode and/or of the conversion layer ($3^I_n$, $3^{II}_n$, . . . ) of the respectively first thin-film solar cell (I, II, . . . ) to the rear-side electrode ($1^{II}_{n+1}$, $1^{III}_{n+1}$, . . . ) of the respectively second thin-film solar cell (II, III, . . . ) of the pair of respectively first and respectively second thin-film solar cell (I-II, II-III, . . . ) by means of an electrically insulating adhesive layer (K), the electrical contacting of the second electrode and/or of the conversion layer ($3^I_n$, $3^{II}_n$, . . . ) of the respectively first thin-film solar cell (I, II, . . . ) to the rear-side electrode ($1^{II}_{n+1}$, $1^{III}_{n+1}$, . . . ) of the respectively second thin-film solar cell (II, III, . . . ) being produced by an electrically conducting connection (7).

12. The method according to claim 1, wherein in that, in the transition region (A),
  a) the respectively first thin-film solar cell (I, II, . . . ) of the pair of respectively first and respectively second thin-film solar cell (I-II, II-III, . . . ) is connected monolithically to the respectively second thin-film solar cell (II, III, . . . ), or
  b) the rear-side electrode ($1^I$, $1^{II}$, . . . ), the photoactive layer ($2^I$, $2^{II}$, . . . ) and the second electrode and/or the conversion layer ($3^I$, $3^{II}$, . . . ) of the respectively first thin-film solar cell (I, II, . . . ) of the pair of respectively first and respectively second thin-film solar cell (I-II, II-III, . . . ) are terminated and insulated electrically from the second thin-film solar cell (II, III, . . . ), termination being achieved preferably by an electrical insulator (4).

13. The method according to claim 1, wherein in that, in the transition region (A), the rear-side electrode ($1^{II}$, $1^{III}$, . . . ), the photoactive layer ($2^{II}$, $2^{III}$, . . . ) and the second electrode and/or the conversion layer ($3^{II}$, $3^{III}$, . . . ) of the respectively second thin-film solar cell (II, III, . . . ) of the pair of respectively first and respectively second thin-film solar cell (I-II, II-III, . . . ) are converted in an S-shape or linearly into the first layer (n, . . . ) at least in regions perpendicularly to the substrate (S).

14. The method according to claim 1, wherein in that, in the at least one overlapping region (B), respectively the rear-side electrode ($1^I$, $1^I_n$, $1^{II}_n$, $1^{III}_n$, . . . ), configured in a lowermost layer (n), of the thin-film solar cells (I, II, III, . . . ) is connected to the substrate (S) over the entire surface.

15. The method according to claim 1, wherein in that a composite is produced by direct deposition of the rear-side electrode ($1^I$, $1^I_n$, $1^{II}_n$, $1^{III}_n$, . . . ) on the substrate (S) by an electrically conductive adhesive layer (K') or an electrically insulating adhesive layer (K).

16. The method according to claim 1, wherein in that the thin-film solar cells (I, II, III, . . . ) are inorganic or organic thin-film solar cells.

17. The method according to claim 1, wherein in that the layer thicknesses, respectively independently of each other, of the rear-side electrode ($1^I$, $1^{II}$, $1^{III}$, . . . ) are between 1 nm and 5 µm of the second electrode and/or of the conversion layer ($3^I$, $3^{II}$, $3^{III}$, . . . ) are between 1 nm and 5 µm, and/or of the photoactive layer ($2^I$, $2^{II}$, $2^{III}$, . . . ) are between 1 nm and 5 µm.

18. The method according to claim 1, wherein in that precursor materials or coating materials/media are, for the production of the
  a) rear-side electrode and/or conversion layer ($1^I$, $1^{II}$, $1^{III}$, . . . ) and/or the second electrode and/or conversion layer ($3^I$, $3^{II}$, $3^{III}$, . . . ), solutions, emulsions or suspensions of poly(ethylenedioxythiophene):poly(styrene sulphonic acid) in water and solvents, such as isopropanol, ethanol and others, ZnO nanoparticles in chloroform or acetone from zinc acetate dihydrate, ZnO nanoparticles in chloroform from diethylzinc, zinc acetylacetonate hydrate in ethanol, titanium isopropoxide in alcohol (methanol, isopropanol, ethanol), $TiO_x$-NPs from titanium (IV) isopropoxide in isopropanol, $MoO_3$NPs from ammonium molybdate in aqueous solution, molybdenum-(V)-isopropoxide in butanol, molybdenum tricarbonyl trispropionitrile in acetonitrile, bis(2,4-pentanedionato)molybdenum dioxide in isopropanol, $V_2O_5$NPs in isopropanol, vanadium(V) oxiisopropoxide in isopropanol, aluminium-doped zinc oxide from zinc acetate and aluminium hydroxite acetate in ethanol and monoethanolamine, and/or
  b) the photoactive layer ($2^I$, $2^{II}$, $2^{III}$, . . . ), solutions, suspensions, emulsions of inorganic semiconductors, such as for example Si, a-Si:H, CuZnSnS, CuZnSnSe, GaAs, CuInS, CuInSe, CuInGeS, CuInGeSe, Ge, CdTe, metal oxides, such as $TiO_2$, ZnO, or organic semiconductors such as poly(3-hexylthiophene), metal phthalocyanines, dicyanovinyl (DCV)-substituted quaterthiophenes, fullerene derivatives and nanoparticles of the various materials and also combinations hereof and/or semiconducting polymers and fullerene derivatives and/or inorganic metal- or semiconductor nanoparticles (Au, Ag, Al, $Al_2O_3$, ZnO, $TiO_2$, $MoO_3$, $V_2O_5$, CdS, CdSe, PbS, PbSe, CuInS, CuInSe, CuInGeS, CuInGeSe, CuZnSnS, CuZnSnSe) and/or hybrid semiconductors, such as perovskites, for example $CH_3NH_3PbI_3$ or precursors of organic and inorganic semiconductors in solvents, such as chlorobenzene, dichlorobenzene, xylene, toluene, alcohols, water and mixtures hereof.

19. A method according to claim 1, wherein the deposition from the liquid phase or the vapour phase is produced by means of aerosol printing, vacuum deposition, inkjet printing and/or film casting.

* * * * *